US012652953B2

(12) United States Patent
Kim et al.

(10) Patent No.: US 12,652,953 B2
(45) Date of Patent: Jun. 9, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Minkyung Kim, Yongin-si (KR); Namsu Kang, Yongin-si (KR); Minho Park, Yongin-si (KR); Huiju Park, Yongin-si (KR); Dongkyu Lee, Yongin-si (KR); Jongwon Lee, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1196 days.

(21) Appl. No.: 17/331,241

(22) Filed: May 26, 2021

(65) Prior Publication Data

US 2022/0045293 A1 Feb. 10, 2022

(30) Foreign Application Priority Data

Aug. 7, 2020 (KR) ........................ 10-2020-0099242

(51) Int. Cl.

*H10K 85/60* (2023.01)
*H10K 50/11* (2023.01)
*H10K 50/13* (2023.01)
*H10K 59/12* (2023.01)
*H10K 101/20* (2023.01)

(52) U.S. Cl.

CPC ........... *H10K 85/636* (2023.02); *H10K 50/13* (2023.02); *H10K 85/633* (2023.02); *H10K 85/658* (2023.02); *H10K 50/11* (2023.02); *H10K 59/12* (2023.02); *H10K 2101/20* (2023.02)

(58) Field of Classification Search

CPC .... H10K 85/636; H10K 50/13; H10K 85/633; H10K 85/658; H10K 50/11; H10K 2101/20; H10K 59/112; H10K 50/19; H10K 59/38; H10K 50/12; H10K 50/155; H10K 50/165; H10K 85/622; H10K 85/626; H10K 85/654; H10K 85/6572; H10K 85/6574; C09K 11/06

See application file for complete search history.

(56) References Cited

U.S. PATENT DOCUMENTS

| | | | | |
|---|---|---|---|---|
| 8,860,013 | B2 | 10/2014 | Okamoto | |
| 9,281,487 | B2 | 3/2016 | Kim et al. | |
| 9,425,422 | B2 | 8/2016 | Kim et al. | |
| 9,917,270 | B1 | 3/2018 | Volz et al. | |
| 10,446,612 | B2 | 10/2019 | Zhang | |
| 10,790,337 | B2 | 9/2020 | Jeong et al. | |
| 11,145,823 | B2 | 10/2021 | Ahn et al. | |
| 2010/0090241 | A1 * | 4/2010 | D'Andrade | H10K 50/125 257/40 |
| 2015/0034923 | A1 * | 2/2015 | Kim | H10K 50/131 257/40 |
| 2015/0236290 | A1 * | 8/2015 | Li | H10K 50/852 257/40 |
| 2017/0098686 | A1 * | 4/2017 | Jeong | H10K 50/11 |
| 2018/0061901 | A1 * | 3/2018 | Zhang | H10K 50/82 |
| 2018/0301629 | A1 * | 10/2018 | Hatakeyama | H10K 85/322 |
| 2020/0119299 | A1 | 4/2020 | Hong et al. | |
| 2020/0251040 | A1 | 8/2020 | Lee et al. | |

FOREIGN PATENT DOCUMENTS

| | | | |
|---|---|---|---|
| CN | 104347807 | A | 2/2015 |
| CN | 106972111 | A | 7/2017 |
| CN | 108727429 | A | 11/2018 |
| KR | 10-2014-0034686 | | 3/2014 |
| KR | 10-2015-0015647 | | 2/2015 |
| KR | 10-2017-0040418 | | 4/2017 |
| KR | 10-2017-0130434 | | 11/2017 |
| KR | 10-2019-0000759 | | 1/2019 |
| KR | 10-2020-0003828 | | 1/2020 |
| KR | 10-2020-0040490 | | 4/2020 |

OTHER PUBLICATIONS

Wang, J. Y., & Pei, J. (2016). BN-embedded aromatics for optoelectronic applications. Chinese Chemical Letters, 27(8), 1139-1146. (Year: 2016).*

Lee, T. W., Noh, T., Choi, B. K., Kim, M. S., Shin, D. W., & Kido, J. (2008). High-efficiency stacked white organic light-emitting diodes. Applied physics letters, 92(4). (Year: 2008).*

Im, Y., Byun, S. Y., Kim, J. H., Lee, D. R., Oh, C. S., Yook, K. S., & Lee, J. Y. (2017). Recent progress in high-efficiency blue-light-emitting materials for organic light-emitting diodes. Advanced Functional Materials, 27(13), 1603007. (Year: 2017).*

* cited by examiner

*Primary Examiner* — Dawn L Garrett
(74) *Attorney, Agent, or Firm* — Lerner David LLP

(57) ABSTRACT

A light-emitting device includes a first electrode, a second electrode facing the first electrode, a first emission layer between the first electrode and the second electrode, and a second emission layer between the first emission layer and the second electrode. The first emission layer includes a first compound and a second compound, the second emission layer includes a third compound and a fourth compound, the first compound and the second compound are different from each other, and the third compound and the fourth compound are different from each other. The fourth compound includes at least one of an electron transport compound and a bipolar compound. An electronic apparatus including the light-emitting device is also provided.

17 Claims, 3 Drawing Sheets

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2020-0099242 under 35 U.S.C. § 119, filed on Aug. 7, 2020 in the Korean Intellectual Property Office, the entire contents of which are incorporated herein by reference.

BACKGROUND

1. Technical Field

The disclosure relates to a light-emitting device and an electronic apparatus including the same.

2. Description of the Related Art

Organic light-emitting devices (OLEDs) are self-emission devices that, as compared with conventional devices, have wide viewing angles, high contrast ratios, short response times, and excellent characteristics in terms of luminance, driving voltage, response speed, and the production of full-color images.

OLEDs may include a first electrode disposed on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

The disclosure relates to a light-emitting device and an electronic apparatus including the same.

Additional aspects will be set forth in part in the description which follows and, in part, will be apparent from the description, or may be learned by practice of the embodiments of the disclosure.

An aspect of the disclosure provides a light-emitting device including a first electrode, a second electrode facing the first electrode, and an interlayer disposed between the first electrode and the second electrode, wherein the interlayer may include a first emission layer, and a second emission layer disposed between the first emission layer and the second electrode, the first emission layer may include a first compound and a second compound, the second emission layer may include a third compound and a fourth compound, the first compound and the second compound are different from each other, the third compound and the fourth compound are different from each other, the fourth compound may include at least one selected from an electron transport compound and a bipolar compound, and the first compound includes a first fluorescent compound, and the third compound includes a second fluorescent compound satisfying Equation 1, or the first compound includes the second fluorescent compound satisfying Equation 1, and the third compound includes the first fluorescent compound $$\Delta E_{ST}=S1-T1\leq 0.5\text{ eV}. \quad \text{[Equation 1]}$$

In Equation 1, S1 is the lowest excitation singlet energy level (eV) of the second fluorescent compound, and T1 is the lowest excitation triplet energy level (eV) of the second fluorescent compound.

In an embodiment, the first electrode may be an anode, the second electrode may be a cathode, and the interlayer may further include a hole transport region disposed between the first electrode and the first emission layer, and an electron transport region disposed between the second emission layer and the second electrode.

In an embodiment, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the second compound may include a hole transport compound.

In an embodiment, the second compound and the third compound may be different from each other, or the first compound and the fourth compound may be different from each other.

In an embodiment, the first emission layer may directly contact the second emission layer.

In an embodiment, each of the first compound and the third compound may emit light having a maximum luminescence wavelength in a range of about 400 nm to about 600 nm.

In an embodiment, the electron transport compound may include at least one electron withdrawing group, the bipolar compound may include at least one electron withdrawing group and at least one electron donating group, an anthracene group and a furan group, or at least one electron withdrawing group, at least one donating group, an anthracene group, and a furan group. The hole transport compound may include at least one electron donating group.

In an embodiment, the electron withdrawing group may be selected from:

—F, —$CFH_2$, —$CF_2H$, —$CF_3$, —CN, and —$NO_2$;

a $C_1$-$C_{60}$ alkyl group substituted with at least one selected from —F, —$CFH_2$, —$CF_2H$, —$CF_3$, —CN, and —$NO_2$; and a π electron deficient nitrogen-containing $C_1$-$C_{60}$ cyclic group, unsubstituted or substituted with at least one $R_{10a}$, and the electron donating group may be selected from a π electron-rich $C_3$-$C_{60}$ cyclic group unsubstituted or substituted with at least one $R_{10a}$, and —$N(Q_1)(Q_2)$, $R_{10a}$ may be:

deuterium (-D), —F, —Cl, —Br, —I, a hydroxyl group, a cyano group, or a nitro group;

a $C_1$-$C_{60}$alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$, $Q_2$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the second fluorescent compound may not contain a carbazole group.

According to embodiments, a light-emitting device may include a first electrode, a second electrode facing the first electrode, m light-emitting units stacked between the first electrode and the second electrode and including emission layers, and m−1 charge generation layers disposed between two neighboring light-emitting units from among the m light-emitting units, wherein m may be an integer of 2 or more, the emission layers may include a first emission layer, and a second emission layer disposed between the first emission layer and the second electrode, the first emission layer may include a first compound and a second compound, the second emission layer may include a third compound and a fourth compound, the first compound and the second compound are different from each other, the third compound and the fourth compound are different from each other, the fourth compound may include at least one selected from an electron transport compound and a bipolar compound, and the first compound includes a first fluorescent compound, and the third compound includes a second fluorescent compound satisfying Equation 1, or the first compound includes the second fluorescent compound satisfying Equation 1, and the third compound includes the first fluorescent compound $$\Delta E_{ST}=S1-T1\leq 0.5\text{ eV} \quad \text{[Equation 1]}$$

In Equation 1, S1 is the lowest excitation singlet energy level (eV) of the second fluorescent compound, and T1 is the lowest excitation triplet energy level (eV) of the second fluorescent compound.

In an embodiment, the maximum luminescence wavelength of light emitted from at least one of the light-emitting units may be different from the maximum luminescence wavelength of light emitted from at least one light-emitting unit of the remaining light-emitting units.

In an embodiment, light emitted from each of the m light-emitting units may have the same maximum luminescence wavelength.

In an embodiment, each of the first compound and the third compound may emit light having a maximum luminescence wavelength in a range of about 400 nm to about 600 nm According to embodiments, an electronic apparatus includes the light-emitting device, and a thin-film transistor, wherein the thin-film transistor includes a source electrode and a drain electrode, and the first electrode of the light-emitting device is electrically connected to the source electrode or the drain electrode.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
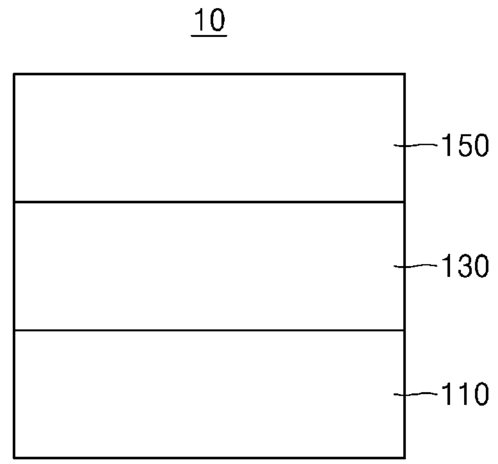
FIG. 1 is a schematic cross-sectional view of an embodiment of a light-emitting device.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Sizes of elements in the drawings may be exaggerated for convenience of explanation. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being "on", "connected to" or "coupled to" another element, it can be directly on, connected or coupled to the other element, or one or more intervening elements may be disposed therebetween.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A light-emitting device according to an embodiment of the disclosure may include a first electrode;

a second electrode facing the first electrode; and an interlayer disposed between the first electrode and the second electrode, wherein the interlayer may include a first emission layer, and a second emission layer disposed between the first emission layer and the second electrode, the first emission layer may include a first compound and a second compound, the second emission layer may include a third compound and a fourth compound, the first compound and the second compound are different from each other, the third compound and the fourth compound are different from each other, the fourth compound may include at least one selected from an electron transport compound and a bipolar compound, and (i) the first compound may include a first fluorescent compound, and the third compound may include a second fluorescent compound satisfying Equation 1, or (ii) the first compound may include the second fluorescent compound satisfying Equation 1, and the third compound may include the first fluorescent compound:

$$\Delta E_{ST}=S1-T1\leq 0.5\text{ eV} \quad \text{[Equation 1]}$$

In Equation 1, S1 is the lowest excitation singlet energy level (eV) of the second fluorescent compound, and T1 is the lowest excitation triplet energy level (eV) of the second fluorescent compound.

In an embodiment, the first electrode may be an anode, the second electrode may be a cathode, and the interlayer may further include a hole transport region disposed between the first electrode and the first emission layer, and an electron transport region disposed between the second emission layer and the second electrode.

In an embodiment, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the second compound may include a hole transport compound.

In an embodiment, the second compound and the third compound may be different from each other; or the first compound and the fourth compound may be different from each other.

In an embodiment, the first compound, the second compound, the third compound, and the fourth compound may be different from one another.

In an embodiment, the first emission layer may directly contact the second emission layer.

In an embodiment, each of the first compound and the third compound may emit light having a maximum luminescence wavelength in a range of about 400 nm to about 600 nm.

In an embodiment, each of the first compound and the third compound may emit blue light or blue-green light.

In an embodiment, the interlayer may emit blue light or blue-green light.

In an embodiment, the interlayer may emit light having a maximum luminescence wavelength in a range of about 400 nm to about 600 nm.

In an embodiment, the amount of the second compound may be greater than the amount of the first compound, and the amount of the fourth compound may be greater than the amount of the third compound.

In an embodiment, the first compound may be a dopant of the first emission layer, and the second compound may be a host of the first emission layer.

In an embodiment, the third compound may be a dopant of the second emission layer, and the fourth compound may be a host of the second emission layer.

In an embodiment, the electron transport compound may include at least one electron withdrawing group, the bipolar compound may include: (i) at least one electron withdrawing group and at least one electron donating group, (ii) an anthracene group and a furan group, or (iii) at least one electron withdrawing group, at least one donating group, an anthracene group, and a furan group; and the hole transport compound may include at least one electron donating group.

In an embodiment, the electron withdrawing group may be selected from:

—F, —$CFH_2$, —$CF_2H$, —$CF_3$, —CN, and —$NO_2$;

a $C_1$-$C_{60}$ alkyl group substituted with at least one selected from —F, —$CFH_2$, —$CF_2H$, —$CF_3$, —CN, and —$NO_2$; and a π electron deficient nitrogen-containing $C_1$-$C_{60}$ cyclic group, unsubstituted or substituted with at least one $R_{10a}$, and the electron donating group may be selected from a π electron-rich $C_3$-$C_{60}$ cyclic group unsubstituted or substituted with at least one $R_{10a}$ and —$N(Q_1)(Q_2)$, $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$, $Q_2$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In embodiments, the π electron-deficient nitrogen-containing $C_1$-$C_{60}$ cyclic group may be a) a first ring, b) a condensed ring in which at least two first rings are condensed, or c) a condensed ring in which at least one first ring and at least one second ring are condensed, the π electron-rich $C_3$-$C_{60}$ cyclic group may be a) second ring or b) a condensed ring in which at least two second rings are condensed, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In an embodiment, the π electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group, and the π electron-rich $C_3$-$C_{60}$ cyclic group may be a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonaphthothiophene group, an (indolo)phenanthrene group, a (benzofuran)phenanthrene group, or a (benzothieno)phenanthrene group.

In an embodiment, the second compound may include at least one compound represented by Formula 1:

[Formula 1]

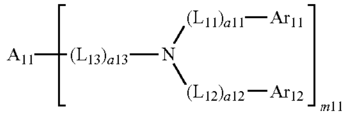

wherein in Formula 1, $A_{11}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{11}$ to $L_{13}$ may each independently be a single bond, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a13 may each independently be an integer from 1 to 3, $Ar_{11}$ and $Ar_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, m11 may be an integer from 1 to 8, $Q_1$ to $Q_3$ and $R_{10a}$ are the same as described in the specification.

In an embodiment, the fourth compound may include a compound represented by Formula 2:

[Formula 2]

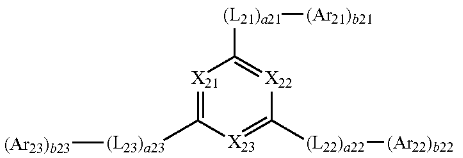

wherein in Formula 2, $X_{21}$ may be N or $C(R_{21})$, $X_{22}$ may be N or $C(R_{22})$, $X_{23}$ may be N or $C(R_{23})$, at least one of $X_{21}$ to $X_{23}$ may be N, $L_{21}$ to $L_{23}$ may each independently be selected from a single bond, a $C_3$-$C_{60}$ carbocyclic group unsubstituted or substituted with at least one $R_{10a}$ and a $C_1$-$C_{60}$ heterocyclic group unsubstituted or substituted with at least one $R_{10a}$, a21 to a23 may each independently be an integer from 1 to 3, $Ar_{21}$ to $Ar_{23}$ and $R_{21}$ to $R_{23}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b21 to b23 may each independently be an integer from 1 to 10, and $Q_1$ to $Q_3$ and $R_{10a}$ are the same as described in the specification.

In an embodiment, the fourth compound may include a compound represented by Formula 3:

[Formula 3]

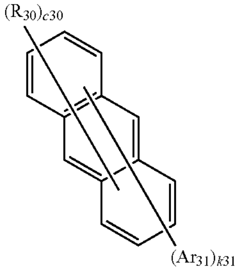

A

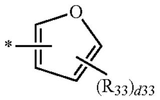

B

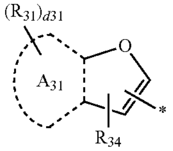

C

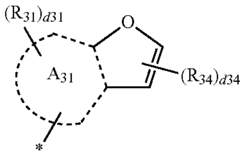

D

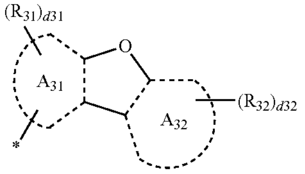

In Formula 3, $Ar_{31}$ may be represented by one of Formulae A to D, and k31 may be an integer from 0 to 10, wherein in Formulae 3 and A to D, $A_{31}$ and $A_{32}$ may each independently be selected from a $C_3$-$C_{30}$ carbocyclic group and a $C_1$-$C_{30}$ heterocyclic group, $R_{30}$ to $R_{34}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c30 may be an integer from 1 to 10, d31 may be an integer from 1 to 10, d32 may be an integer from 1 to 10, d33 may be an integer from 1 to 3, d34 may be 1 or 2, and

* indicates a binding site to a neighboring atom.

The sum of k31 and c30 may be 10.

$Q_1$ to $Q_3$ and $R_{10a}$ are the same as described in the specification.

In an embodiment, the second fluorescent compound may include a carbazole-free compound.

The carbazole-free compound refers to a compound that does not contain a carbazole group. For example, the second fluorescent compound may include a compound that does not contain a carbazole group.

In an embodiment, the second fluorescent compound may contain at least one compound represented by one of Formulae 4-1 to 4-9:

[Formula 4-1]

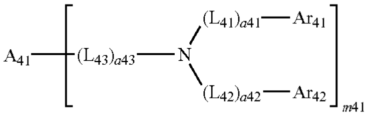

[Formula 4-2]

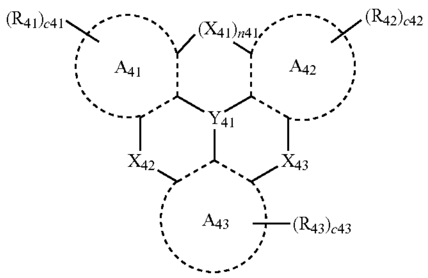

[Formula 4-3]

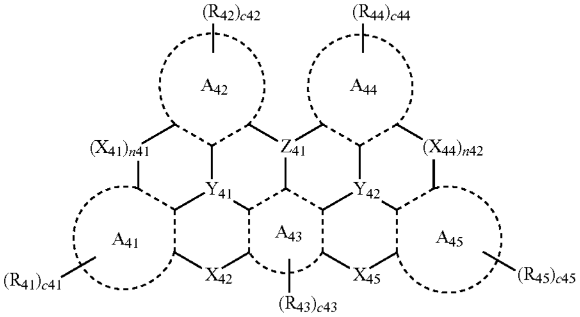

[Formula 4-4]

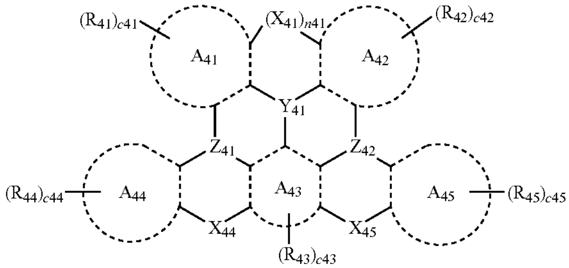

[Formula 4-5]

$(EDG)_{b41}-[(L_{44})_{a44}-(EWG)_{t42}]_{s41}$

[Formula 4-6]

$(EWG)_{t42}-[(L_{44})_{a44}-(EDG)_{b41}]_{s42}$

[Formula 4-7]

$(EDG)_{b411}-(L_{44})_{a44}-(EWG)_{t42}-(L_{45})_{a45}-(EDG)_{b412}$

-continued

[Formula 4-8]

$(EWG)_{t421}-(L_{44})_{a44}-(EDG)_{b41}-(L_{45})_{a45}-(EWG)_{t422}$

[Formula 4-9]

$A_{41}-[(L_{44})_{a44}-(EDG)_{b41}]_{s43}$

In Formula 4-1, $A_{41}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{41}$ to $L_{43}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a41 to a43 may each independently be an integer from 1 to 3, $Ar_{41}$ and $Ar_{42}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, or a $C_6$-$C_{60}$ aryloxy group unsubstituted or substituted with at least one $R_{10a}$, m41 may be an integer from 1 to 6, in Formulae 4-2 to 4-4, $X_{41}$ to $X_{45}$ may each independently be a single bond, O, S, $N(R_{46})$, $B(R_{46})$, $C(R_{46})(R_{47})$, or $Si(R_{46})(R_{47})$, n41 and n42 may each independently be 0, 1, or 2, when n41 is 0, $A_{41}$ and $A_{42}$ may not be linked to each other, and when n42 is 0, $A_{44}$ and $A_{45}$ may not be linked to each other, $Y_{41}$ and $Y_{42}$ may each independently be N, B, P, P(=O), or P(=S), $Z_{41}$ and $Z_{42}$ may each independently be N, $C(R_{48})$, or $Si(R_{48})$, $A_{41}$ to $A_{45}$ may each independently be selected from a $C_3$-$C_{30}$ carbocyclic group and a $C_1$-$C_{30}$ heterocyclic group, $R_{41}$ to $R_{48}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c41 to c45 may each independently be an integer from 1 to 10, in Formulae 4-5 to 4-9, $A_{41}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, EDG represents an electron donating group, and EWG represents an electron withdrawing group, b41, b411, b412, t42, t421, and t422 may each independently be selected from 1, 2, and 3, $L_{44}$ and $L_{45}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a44 and a45 may each independently an integer from 1 to 3, s41 and s42 may each independently an integer from 1 to 3, and s34 may be an integer from 1 to 6.

$Q_1$ to $Q_3$ and $R_{10a}$ are the same as described in the specification.

In an embodiment, the second fluorescent compound may be selected from Compounds 4-1 to 4-12, but is not limited thereto:

4-1

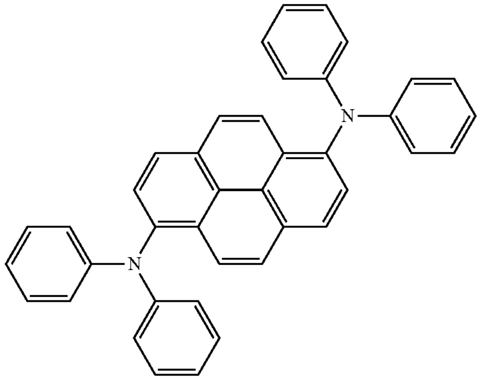

4-2

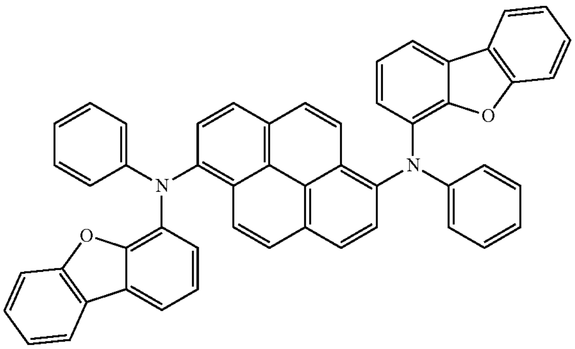

4-3

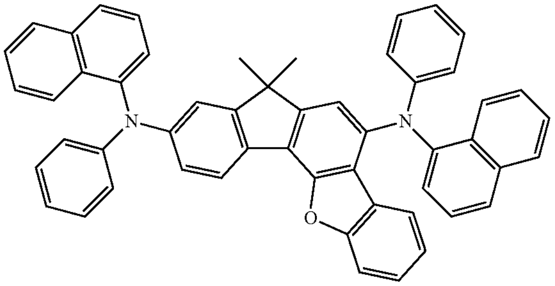

-continued 4-4

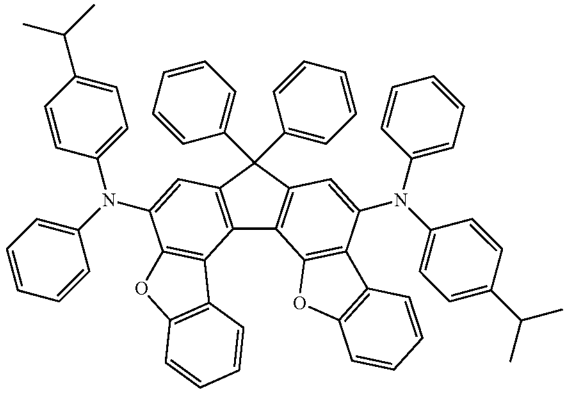

4-5

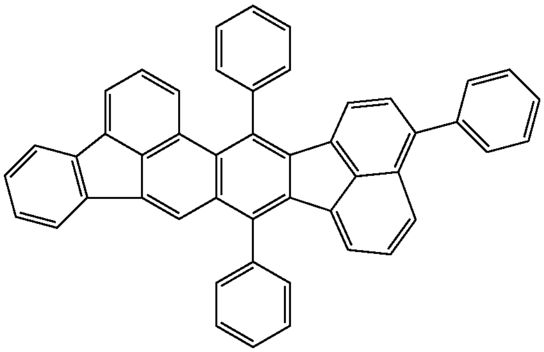

4-6

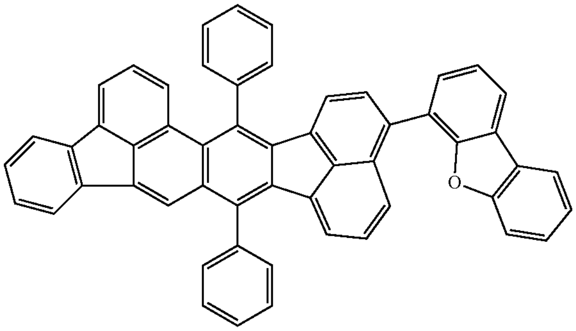

4-7

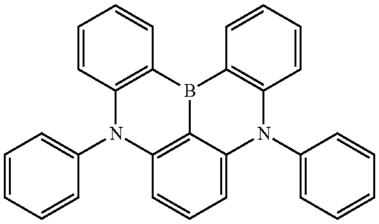

-continued 4-8

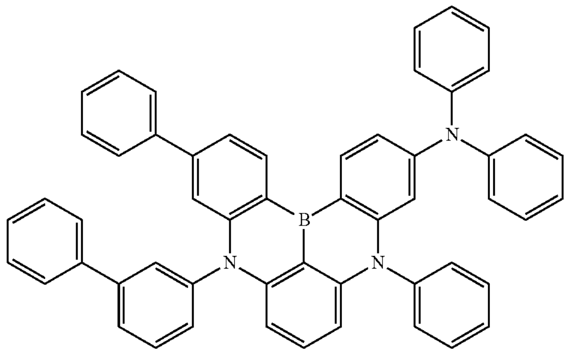

4-9

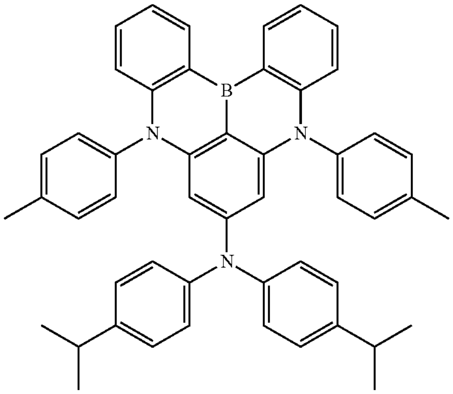

4-10

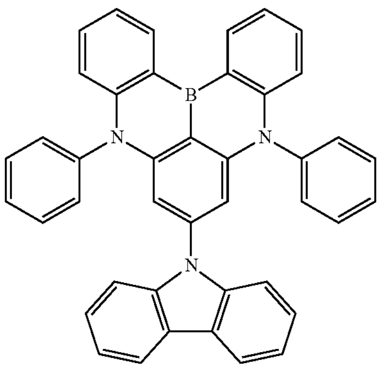

4-11

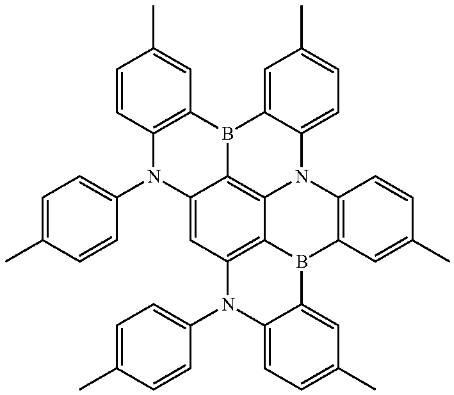

-continued 4-12

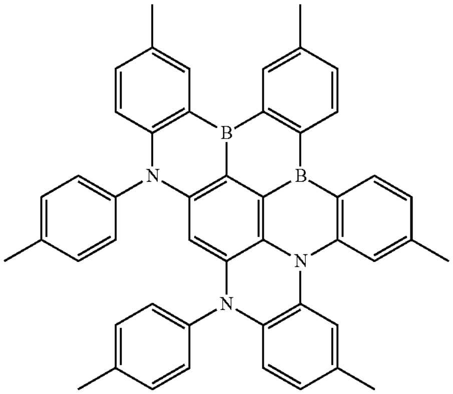

According to another aspect of the disclosure, a light-emitting device may include a first electrode, a second electrode facing the first electrode, m light-emitting units stacked between the first electrode and the second electrode and including emission layers, and m−1 charge generation layers disposed between two neighboring light-emitting units from among the m light-emitting units, wherein m is an integer of 2 or more, the emission layers may include a first emission layer, and a second emission layer disposed between the first emission layer and the second electrode, the first emission layer may include a first compound and a second compound, the second emission layer may include a third compound and a fourth compound, the first compound and the second compound are different from each other, the third compound and the fourth compound are different from each other, the fourth compound may include at least one selected from an electron transport compound and a bipolar compound, and (i) the first compound may include a first fluorescent compound, and the third compound may include a second fluorescent compound satisfying Equation 1, or (ii) the first compound may include the second fluorescent compound satisfying Equation 1, and the third compound may include the first fluorescent compound:

$$\Delta E_{ST}=S1-T1\leq 0.5\text{ eV} \quad \text{[Equation 1]}$$

In Equation 1, S1 is the lowest excitation singlet energy level (eV) of the second fluorescent compound, and T1 is the lowest excitation triplet energy level (eV) of the second fluorescent compound.

In an embodiment, the maximum luminescence wavelength of light emitted from at least one of the light-emitting units may be different from the maximum luminescence wavelength of light emitted from at least one light-emitting unit of the remaining light-emitting units.

In an embodiment, the maximum luminescence wavelength of light emitted from each of the m light-emitting units may all be the same.

In an embodiment, m may be 3 or 4.

In an embodiment, each of the first compound and the third compound may emit light having a maximum luminescence wavelength in a range of about 400 nm to about 600 nm.

In an embodiment, each of the first compound and the third compound may emit blue light or blue-green light.

According to embodiments, an electronic apparatus may include the light-emitting device, and a thin-film transistor, wherein the thin-film transistor may include a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof.

The light-emitting device may include a first emission layer including a first compound and a second compound and a second emission layer including a third compound and a fourth compound, the fourth compound may include at least one selected from an electron transport compound and a bipolar compound, and (i) the first compound may include a first fluorescent compound, and the third compound may include a second fluorescent compound satisfying Equation 1, or (ii) the first compound may include the second fluorescent compound satisfying Equation 1, and the third compound may include the first fluorescent compound.

Since the light-emitting device includes a first emission layer and a second emission layer, the recombination zone of holes and electrons may be moved between the first emission layer and the second emission layer so that the deterioration caused by interfacial emission of the emission auxiliary layer may be prevented and thus a long lifespan may be obtained.

In the light-emitting device, (i) the first compound may include a first fluorescent compound, and the third compound may include a second fluorescent compound satisfying Equation 1; or (ii) the first compound may include the second fluorescent compound satisfying Equation 1, and the third compound may include the first fluorescent compound. Accordingly, a narrow Triplet Triplet Fusion (TTF) region may be formed, and the quantum efficiency of the second fluorescent compound may be 100%. Thus, a light-emitting device having high efficiency may be obtained.

When such a structure is applied in a tandem-type device having three or more light-emitting units, an obtained light-emitting device may have high efficiency and a high lifespan. For blue emission in a multi-peak (for example, blue & green tandem) tandem having three or more light-emitting units, when such a structure is applied to at least one light-emitting unit of the light-emitting device, an obtained light-emitting device may have high efficiency and a long lifespan.

Thus, the light-emitting device, for example, an organic light-emitting device, may have high maximum quantum efficiency, high efficiency, and a long lifespan.

The expression "(an interlayer) includes at least one first compound" as used herein may include a case in which "(an interlayer) includes identical first compounds" and a case in which "(an interlayer) includes two or more different first compounds."

For example, the interlayer may include only Compound 1 as the first compound. In this embodiment, Compound 1 may be included in an emission layer of the organic light-emitting device. In embodiments, the interlayer may include, as the first compound, Compound 1 and Compound 2. In this embodiment, Compound 1 and Compound 2 may be included in the same layer (for example, both Compound 1 and Compound 2 may be included in an emission layer) or in different layers (for example, Compound 1 may be included in an emission layer, and Compound 2 may be included in an electron transport layer).

The term "an interlayer" as used herein refers to a single layer and/or multiple layers located between the first electrode and the second electrode of an organic light-emitting device. A material included in the "interlayer" is not limited to an organic material.

For example, the light-emitting device may have a stacked structure including a first electrode, an interlayer, a second electrode, and a second capping layer which are sequentially stacked in this stated order; a stacked structure including a first capping layer, a first electrode, an interlayer, and a second electrode which are sequentially stacked in this stated order; or a stacked structure including a first capping layer, a first electrode, an interlayer, a second electrode, and a second capping layer which are sequentially stacked in this stated order.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

[First Electrode 110]

In FIG. 1, a substrate may be additionally located under the first electrode 110 or above the second electrode 150. The substrate may be a glass substrate or a plastic substrate. The substrate may be a flexible substrate. In embodiments, the substrate may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, a high work function material that can easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming the first electrode 110.

The first electrode 110 may have a single-layered structure consisting of a single layer or a multi-layered structure including multiple layers. In an embodiment, the first electrode 110 may have a three-layered structure of ITO/Ag/ITO.

[Interlayer 130]

The interlayer 130 is disposed on the first electrode 110. The interlayer 130 includes an emission layer.

The interlayer 130 may further include a hole transport region located between the first electrode 110 and the emission layer and an electron transport region located between the emission layer and the second electrode 150.

The interlayer 130 may further include metal-containing compounds such as organometallic compounds, inorganic materials such as quantum dots, and the like, in addition to various organic materials.

In embodiments, the interlayer 130 may include, i) two or more emitting units sequentially stacked between the first electrode 110 and the second electrode 150 and ii) at least one charge generation layer between adjacent ones of the emitting units. When the interlayer 130 includes the emitting units and the at least one charge generation layer as described above, the light-emitting device 10 may be a tandem light-emitting device.

[Hole Transport Region in Interlayer 130]

The hole transport region may have: i) a single-layered structure consisting of a single layer consisting of a single material, ii) a single-layered structure consisting of a single layer consisting of different materials, or iii) a multi-layered structure including multiple layers including different materials.

The hole transport region may include a hole injection layer (HIL), a hole transport layer (HTL), an emission auxiliary layer, an electron blocking layer (EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

[Formula 201]

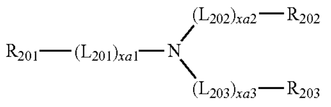

[Formula 202]

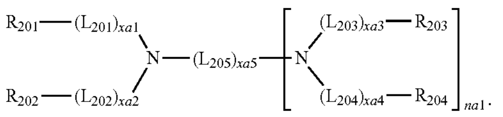

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each independently an integer from 0 to 5, xa5 is an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for example, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

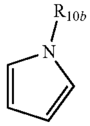

CY202

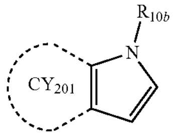

CY203

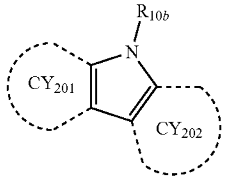

CY204

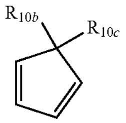

CY205

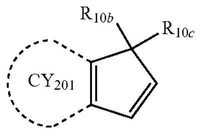

CY206

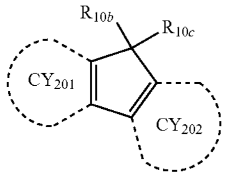

-continued

CY207

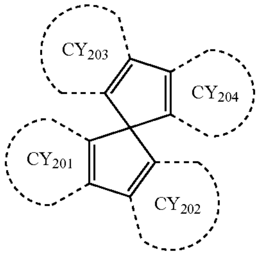

CY208

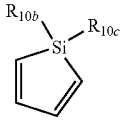

CY209

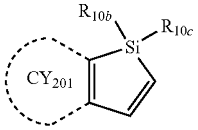

CY210

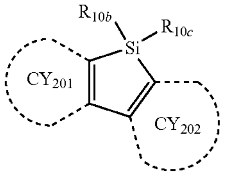

CY211

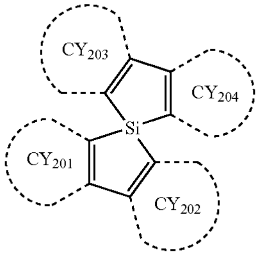

CY212

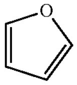

CY213

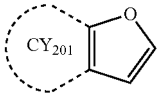

CY214

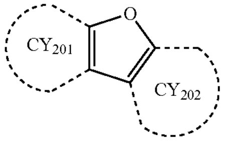

CY215

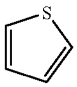

CY216

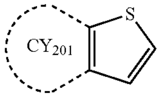

-continued

CY217

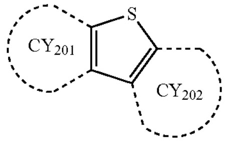

Regarding Formulae CY201 to CY217, $R_{10b}$ and $R_{10c}$ are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203:

In embodiments, Formula 201 may include at least one of the groups represented by Formulae CY201 to CY203 and at least one of the groups represented by Formulae CY204 to CY217.

In embodiments, in Formula 201, xa1 is 1, $R_{201}$ is a group represented by one of Formulae CY201 to CY203, xa2 is 0, and $R_{202}$ is a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203 and may include at least one of the groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

-continued
HT1
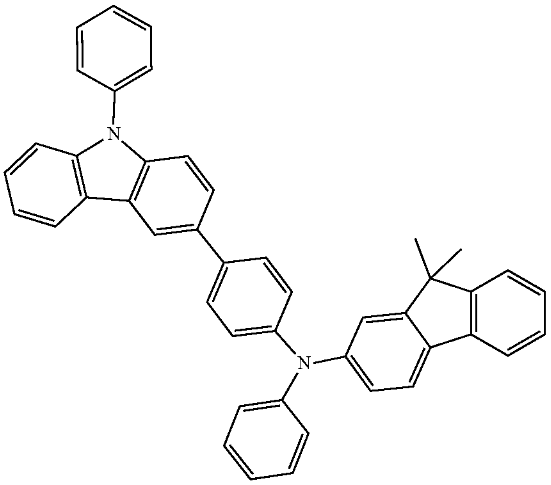
HT2
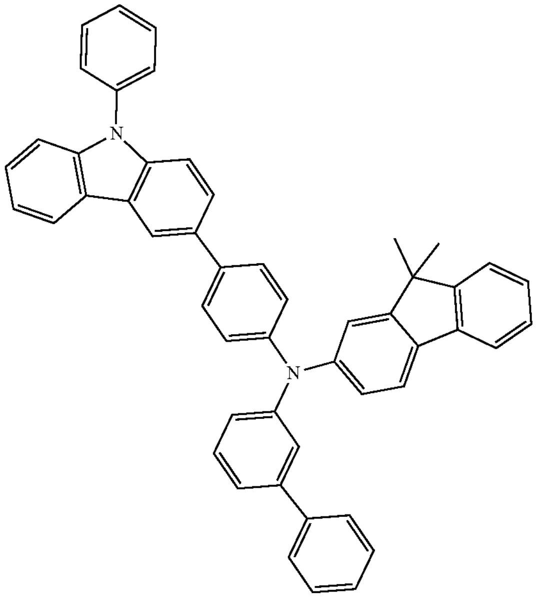
HT3
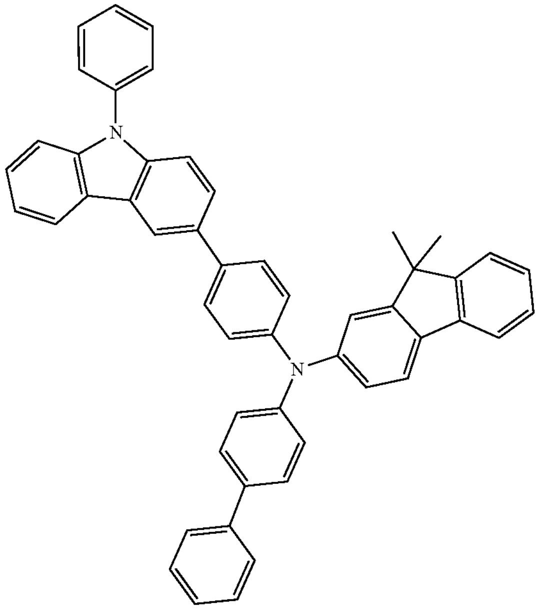
HT4
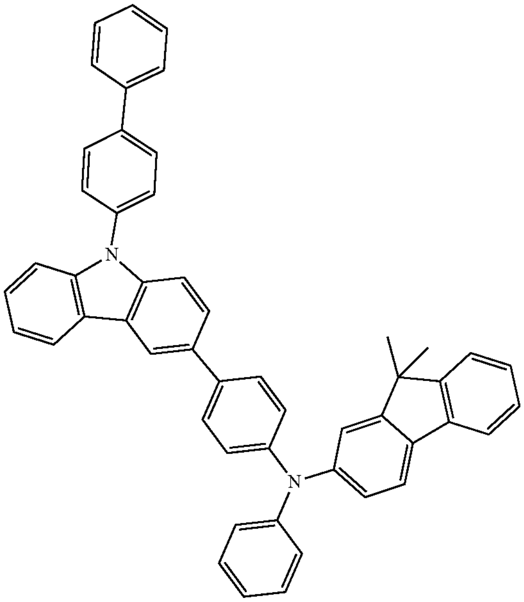

-continued
HT5
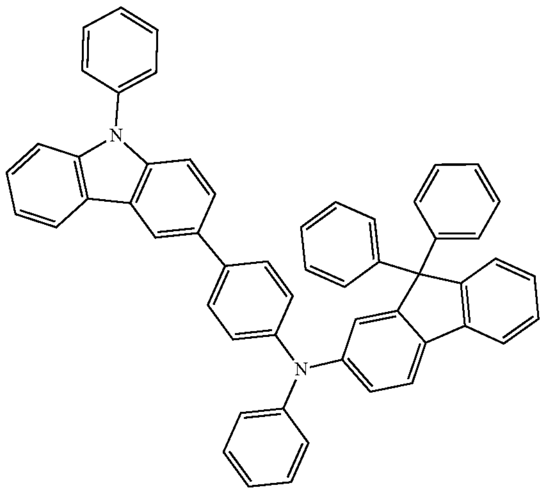
HT6
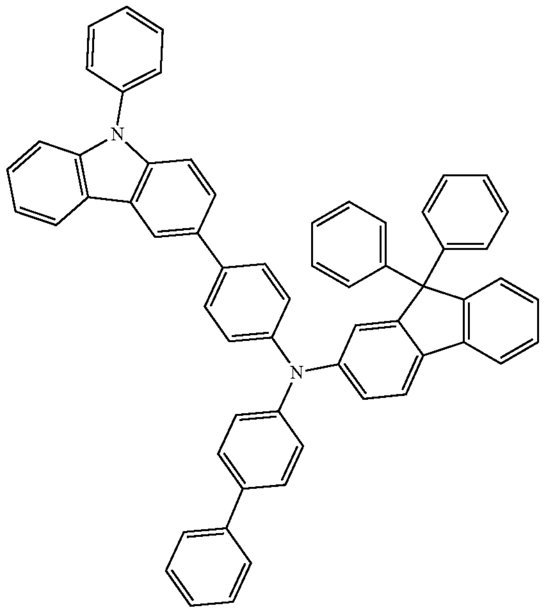
-continued
HT7
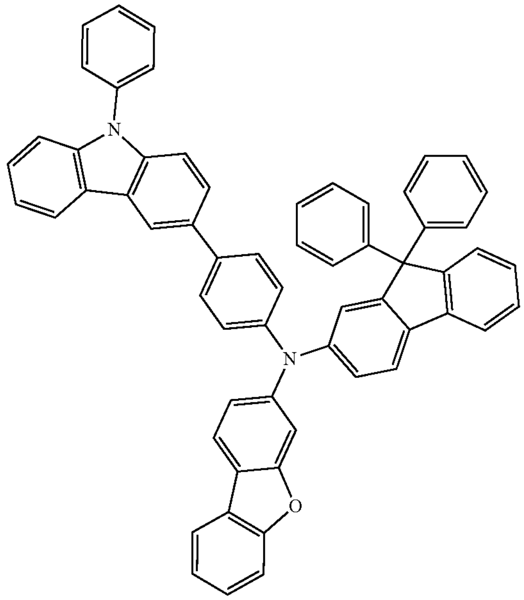
HT8
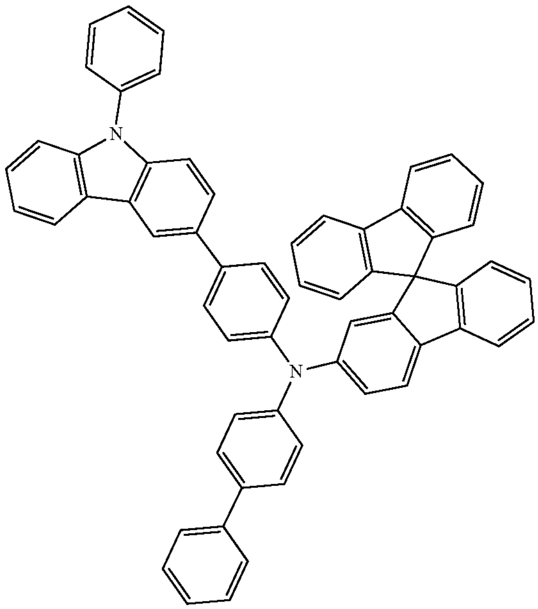

-continued
HT9
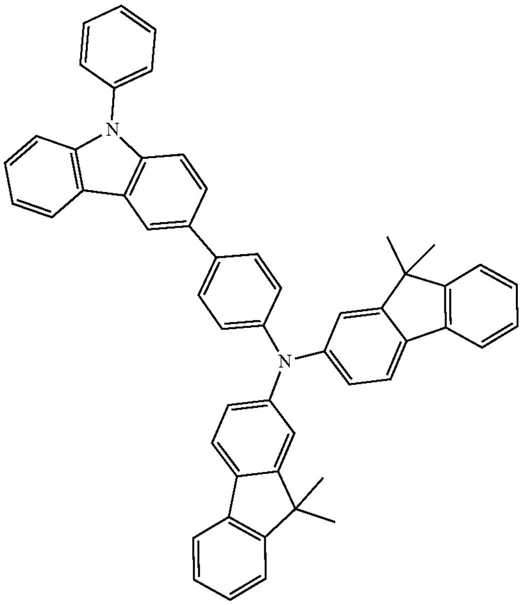
HT10
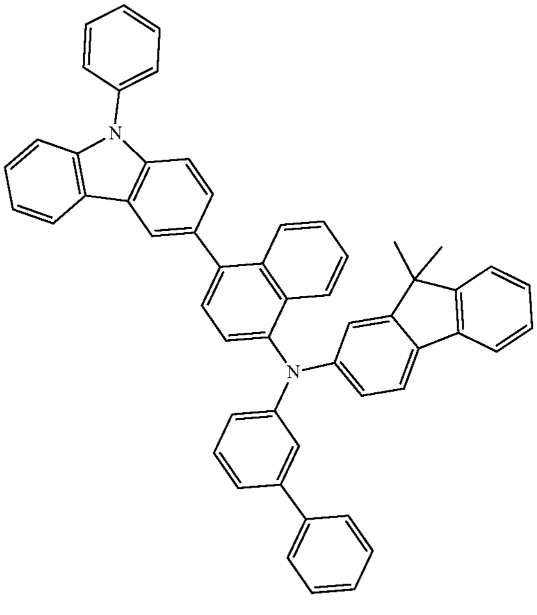
-continued
HT11
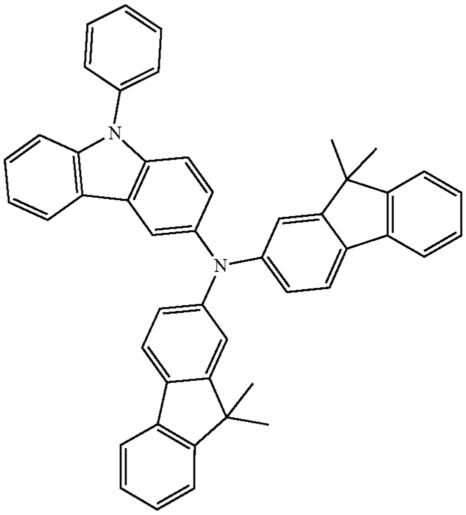
HT12
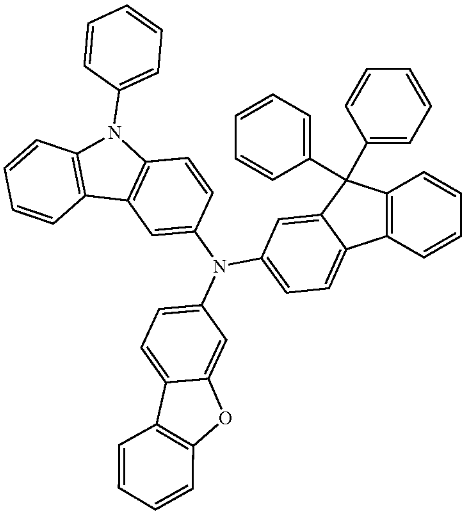
HT13
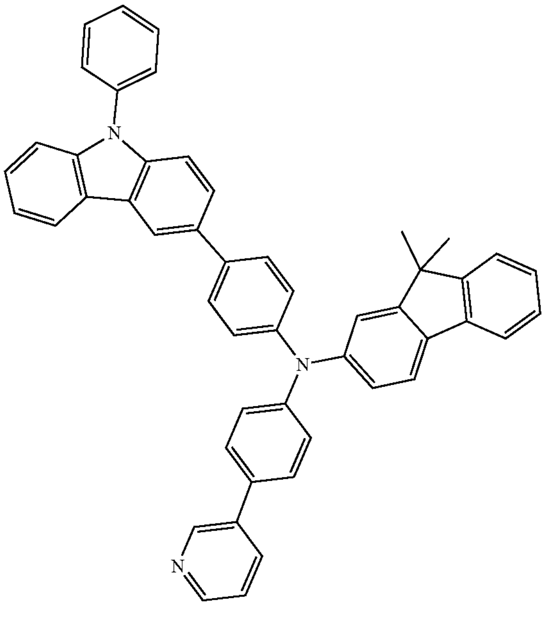

-continued
HT14
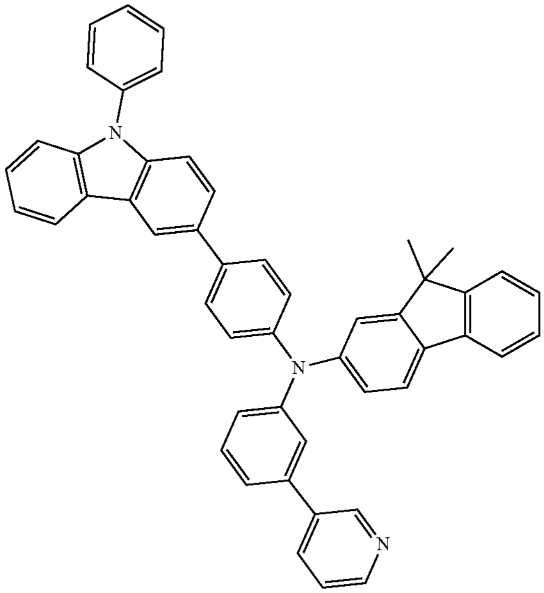
HT15
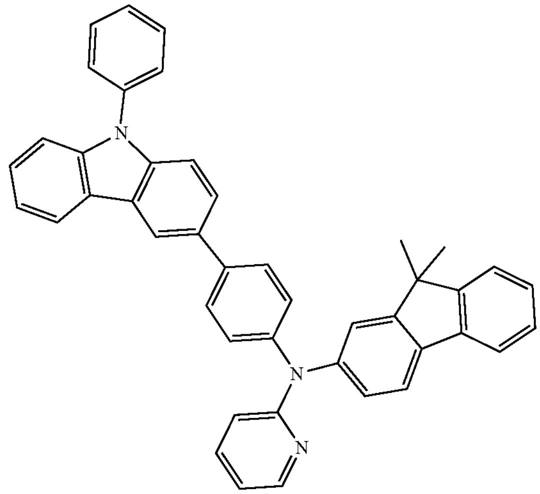
HT16
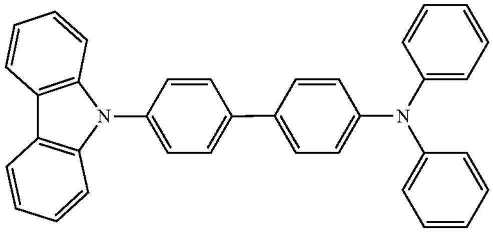
-continued
HT17
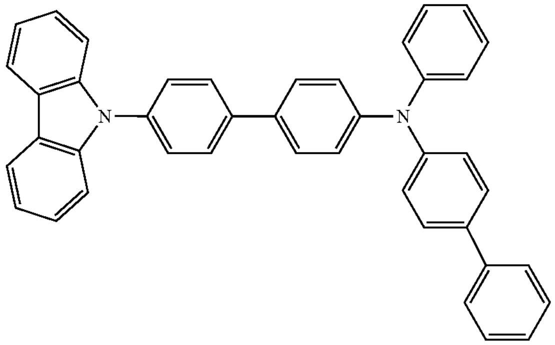
HT18
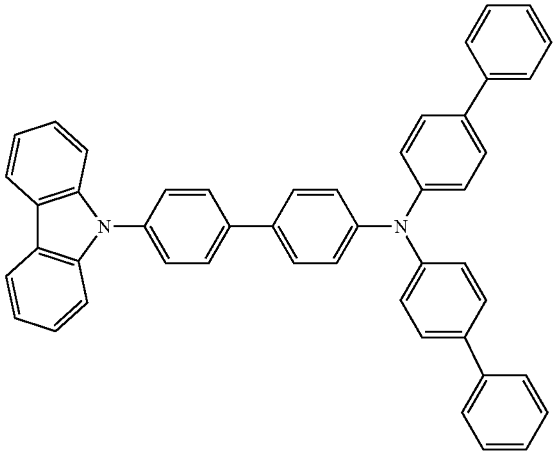
HT19
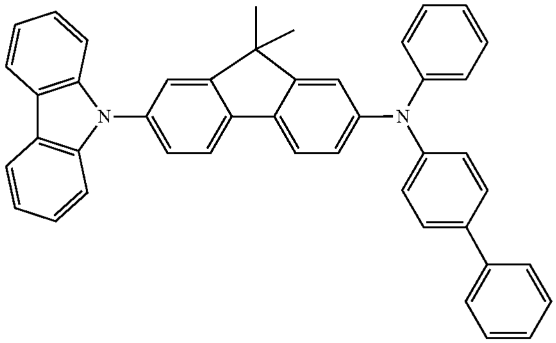

-continued
HT20
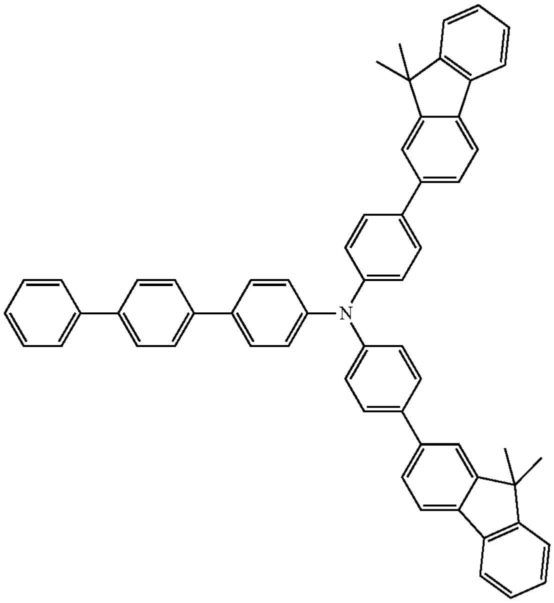
HT21
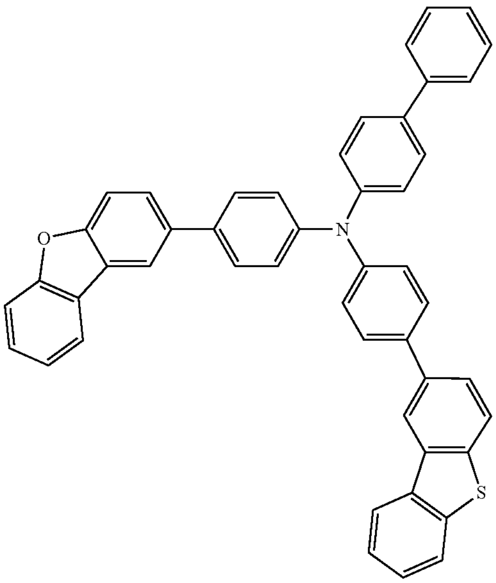
HT22
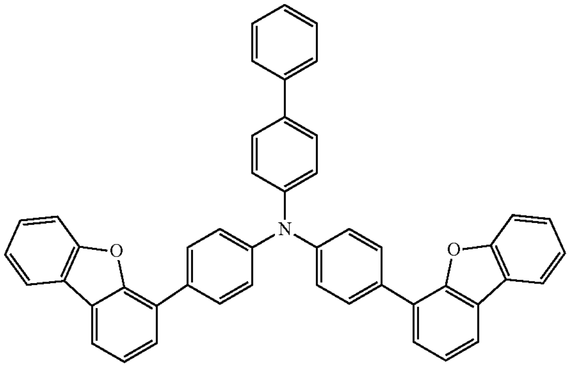
-continued
HT23
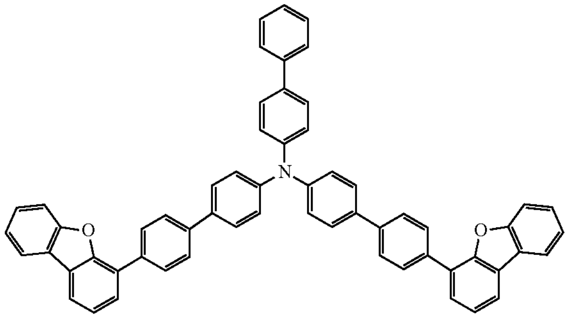
HT24
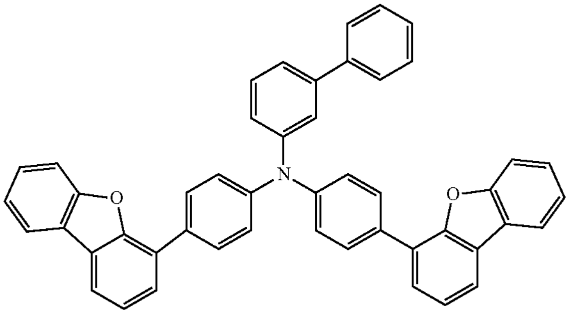
HT25
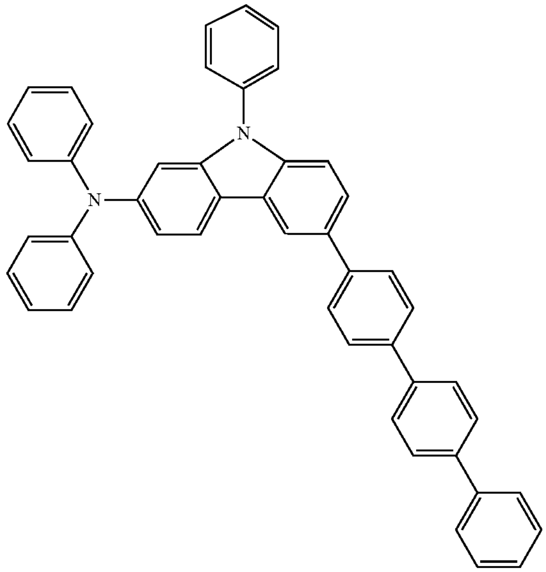

-continued
HT26
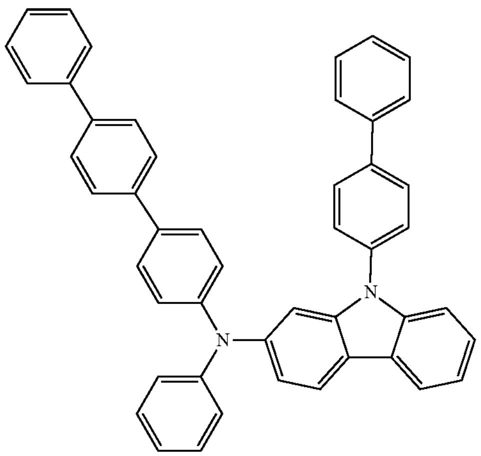
HT27
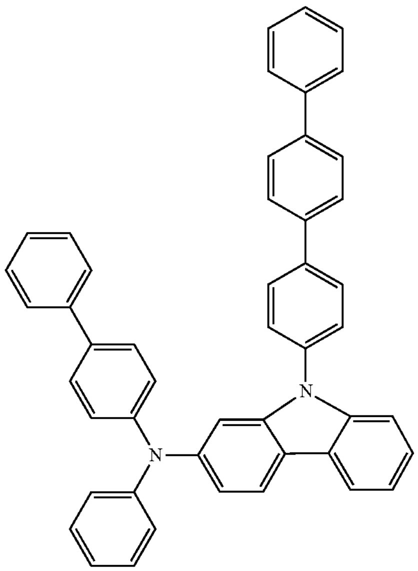
HT28
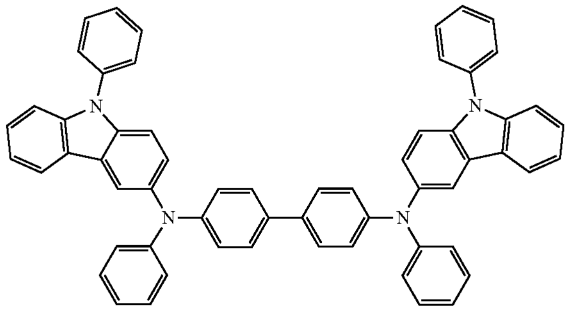
-continued
HT29
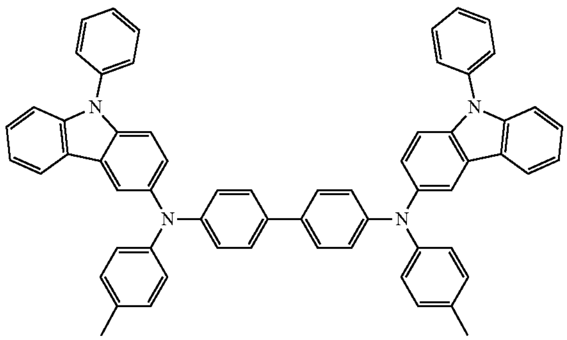
HT30
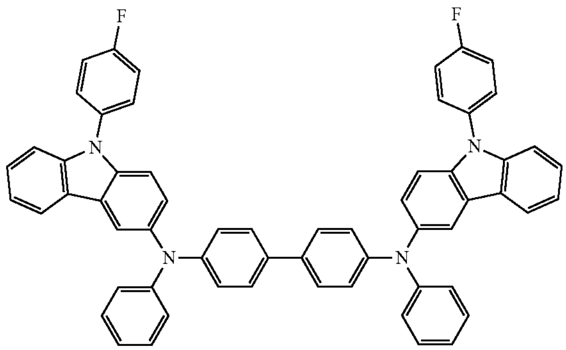
HT31
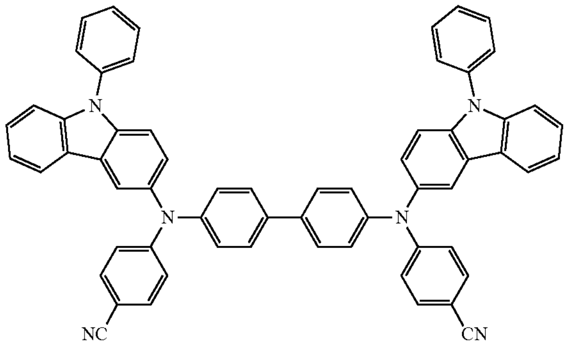
HT32
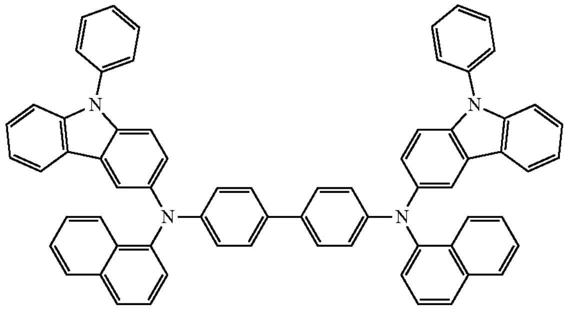

-continued
HT33
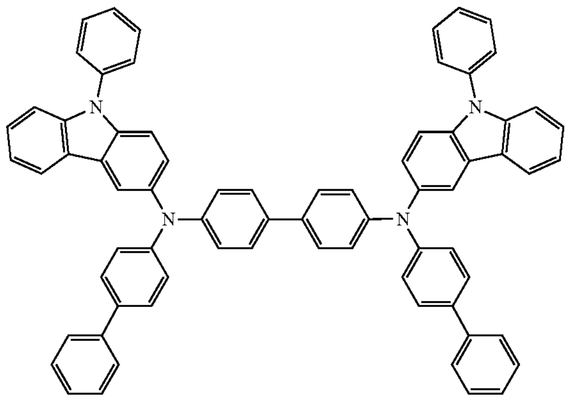
HT34
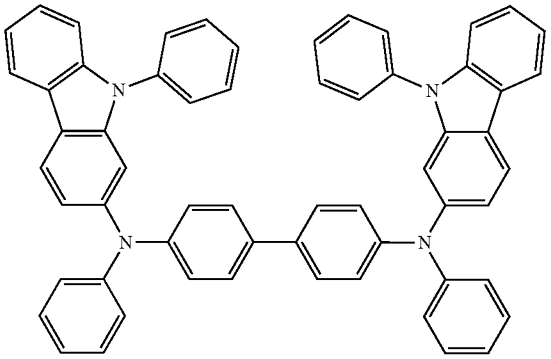
HT35
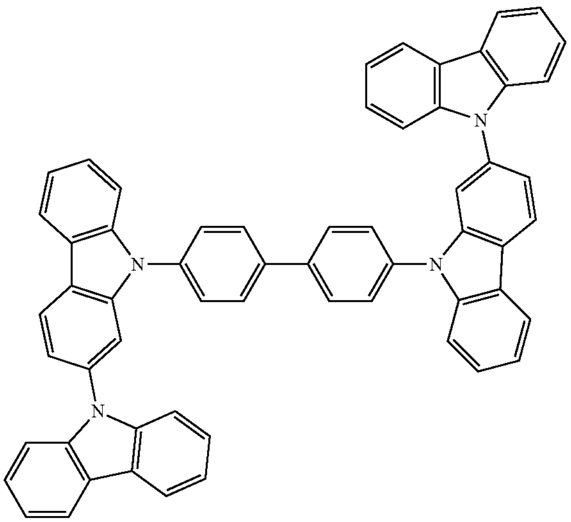
-continued
HT36
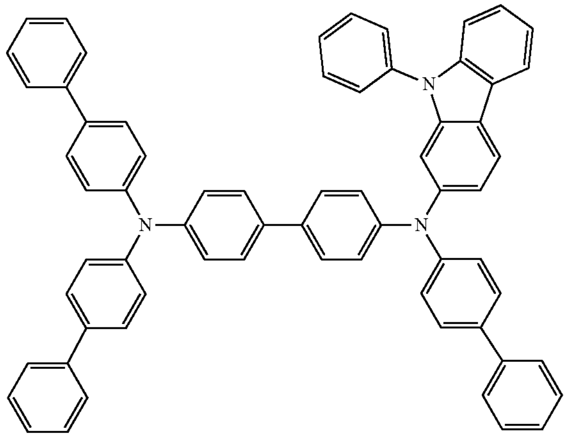
HT37
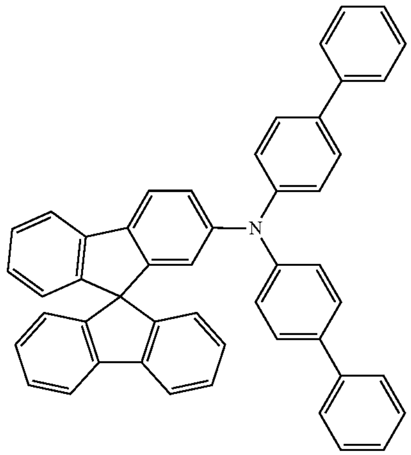
HT38
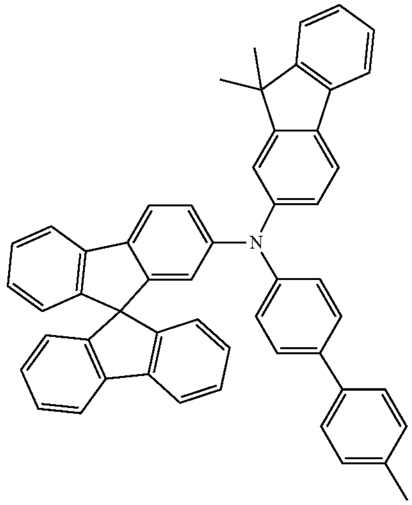

-continued
HT39
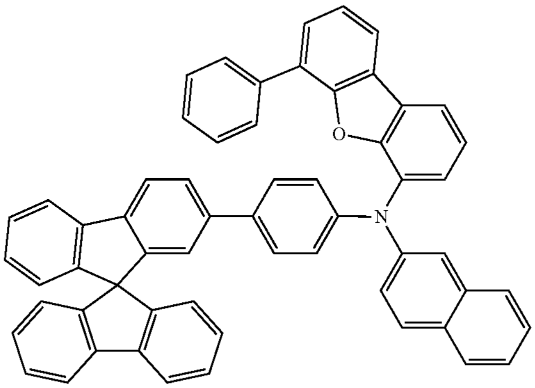
HT40
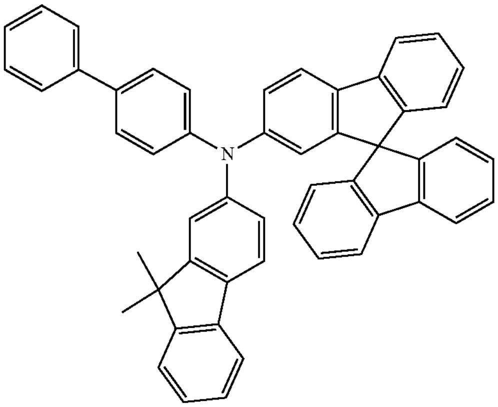
HT41
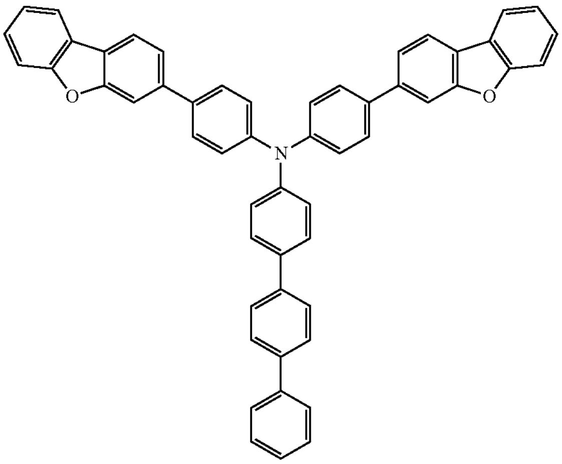
HT42
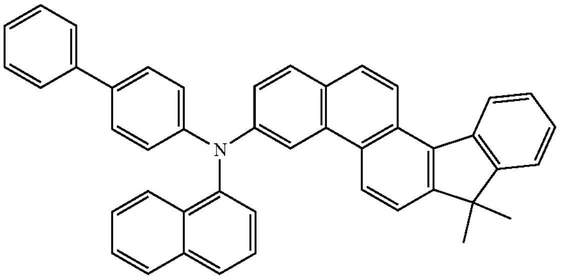
-continued
HT43
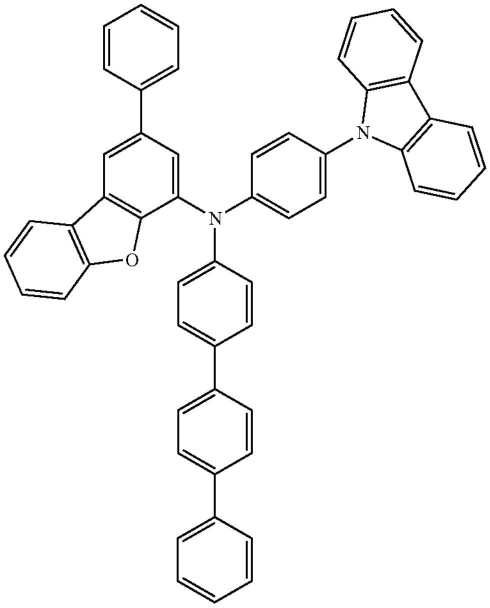
HT44
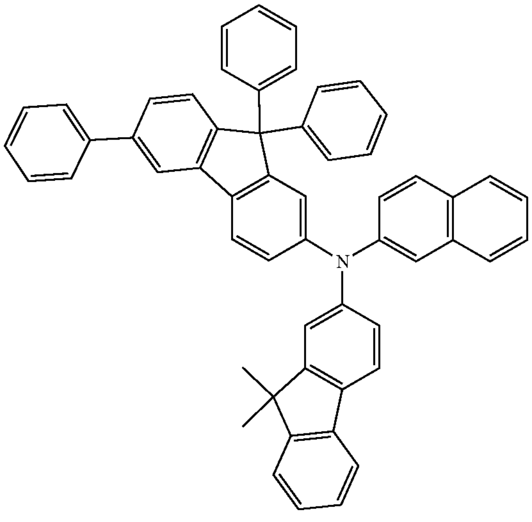

-continued
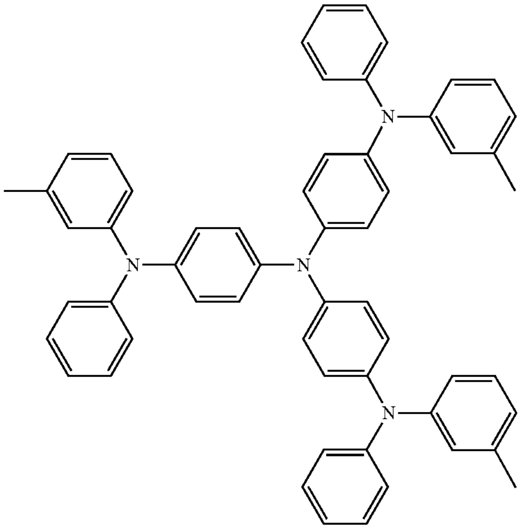
m-MTDATA
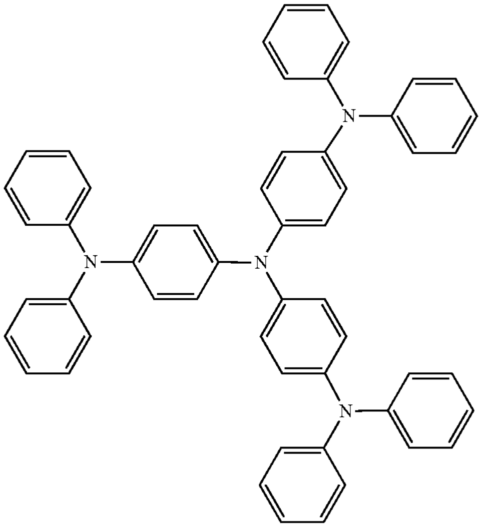
TDATA
-continued
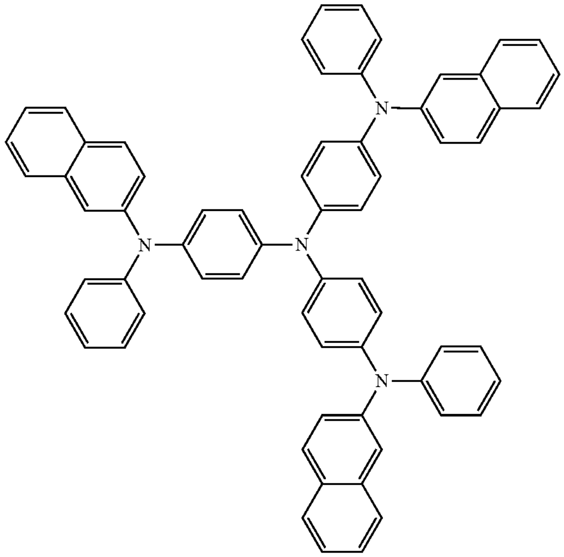
2-TNATA
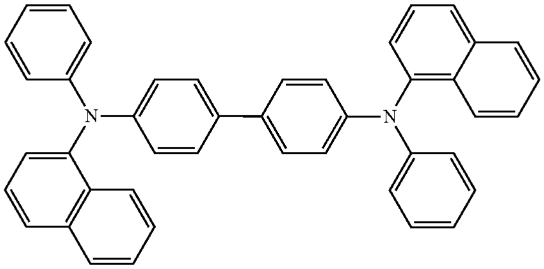
NPB
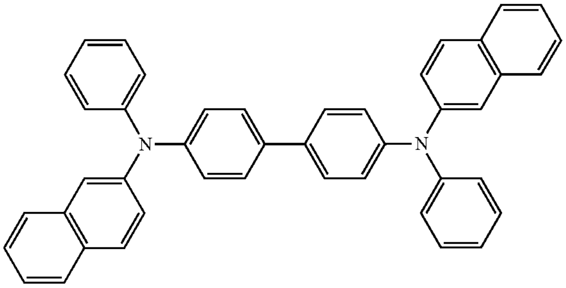
β-NPB
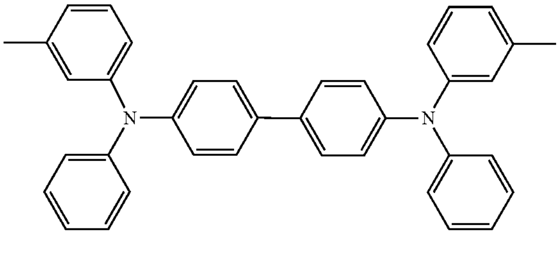
TPD -continued

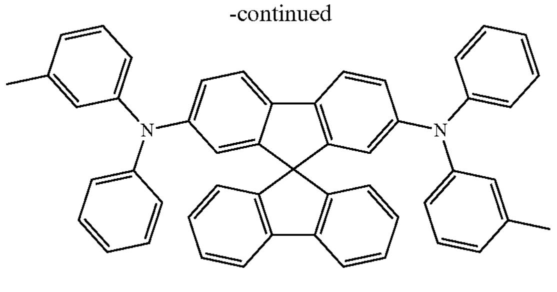

Spiro-TPD

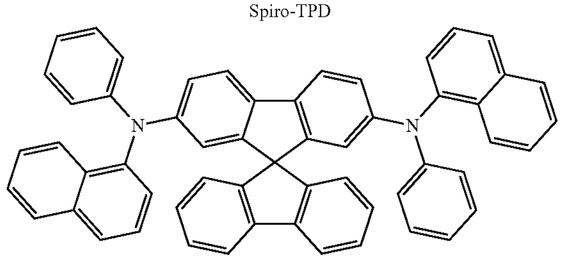

Spiro-NPB

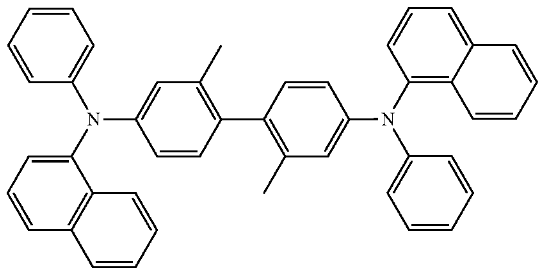

methylated-NPB

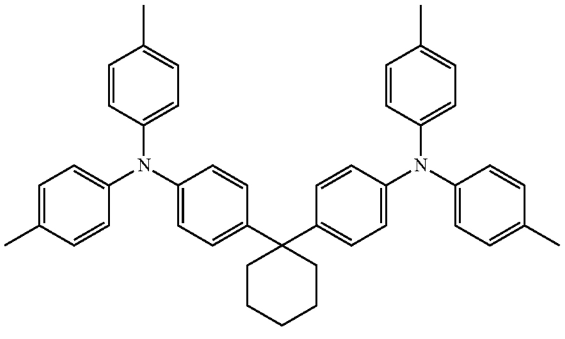

TAPC

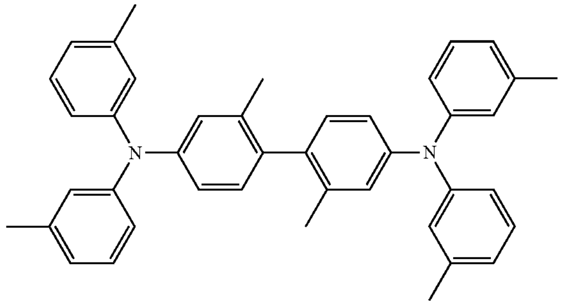

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[P-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, the lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative are TCNQ and F4-TCNQ.

Examples of the cyano group-containing compound are HAT-CN and a compound represented by Formula 221 below.

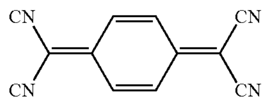

TCNQ

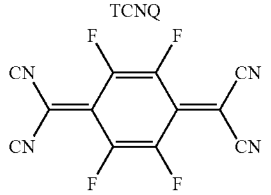

F4-TCNQ

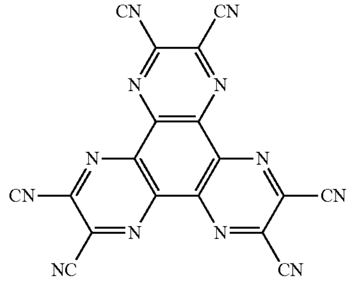

HAT-CN

-continued

[Formula 221]

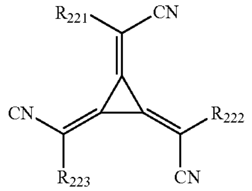

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal are: an alkali metal (for example, lithium (Li), sodium (Na), potassium (K), rubidium (Rb), cesium (Cs), or the like); alkaline earth metal (for example, beryllium (Be), magnesium (Mg), calcium (Ca), strontium (Sr), barium (Ba), or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metals (for example, zinc (Zn), indium (In), tin (Sn), or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid are silicon (Si), antimony (Sb), and tellurium (Te).

Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, and any combination thereof.

Examples of the metal oxide are tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (MoO, $Mo_2O_3$, $MoO_2$, $MoO_3$, or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or Tab), chromium halide (for example, $CrF_3$, $CrCl_3$, $CrBr_3$, or $CrI_3$), molybdenum halide (for example, $MoF_3$, $MoCl_3$, $MoBr_3$, or $MoI_3$), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide are zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide are antimony halide (for example, $SbCl_5$).

Examples of the metal telluride are an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, or ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers contact each other or are separated from each other. In embodiments, the emission layer may include two or more materials of a red light-emitting material, a green light-emitting material, and a blue light-emitting material, in which the two or more materials are mixed with each other in a single layer to emit white light.

The emission layer may include a first emission layer and a second emission layer.

The first emission layer may include a first compound and a second compound, and the second emission layer may include a third compound and a fourth compound.

The fourth compound may include at least one selected from an electron transport compound and a bipolar compound, and (i) the first compound may include a first fluorescent compound, and the third compound may include a second fluorescent compound satisfying Equation 1, or (ii) the first compound may include the second fluorescent compound satisfying Equation 1, and the third compound may include the first fluorescent compound:

$$\Delta E_{ST}=S1-T1\leq 0.5\text{ eV} \quad \text{[Equation 1]}$$

In Equation 1, S1 is the lowest excitation singlet energy level (eV) of the second fluorescent compound, and T1 is the lowest excitation triplet energy level (eV) of the second fluorescent compound.

The emission layer may include a host and a dopant.

The first compound and the third compound may each be a dopant, and the second compound and the fourth compound may each be a host.

The host may include an electron transport compound and a bipolar compound; or may include a hole transport compound.

The dopant may include the first fluorescent compound or the second fluorescent compound.

The dopant may include a phosphorescent dopant, a fluorescent dopant, or any combination thereof.

The amount of the dopant in the emission layer may be in a range of about 0.01 to about 15 parts by weight based on 100 parts by weight of the host.

In embodiments, the emission layer may include a quantum dot.

[Host]

In embodiments, the host may include a compound represented by Formula 301 below:

$$[Ar_{301}]_{xb11}\text{-}[(L_{301})_{xb1}\text{-}R_{301}]_{xb21} \quad \text{[Formula 301]}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ are the same as described in connection with $Q_1$.

In embodiments, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination embodiment:

[Formula 301-1]

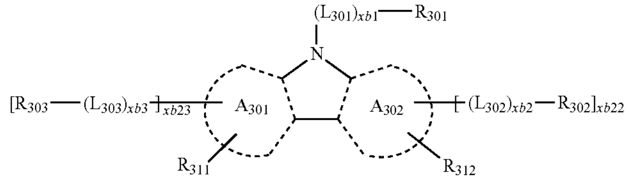

[Formula 301-2]

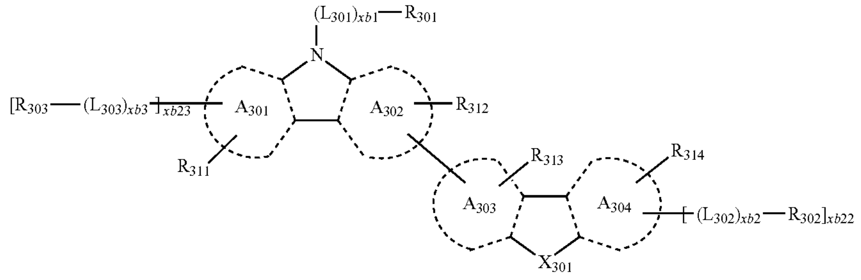

The emission layer may include a delayed fluorescence material. The delayed fluorescence material may act as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer satisfies the ranges described above, excellent luminescence characteristics may be exhibited without a substantial increase in driving voltage.

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 are each independently 0, 1, or 2, $L_{301}$, xb1, and $R_{301}$ are the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but embodiments of the disclosure are not limited thereto:

H1

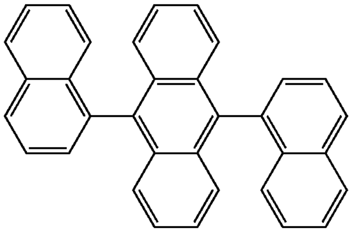

H2

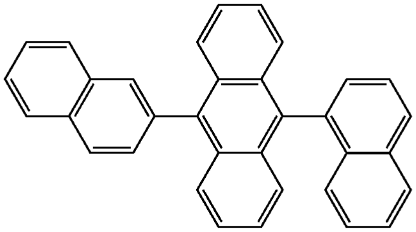

H3

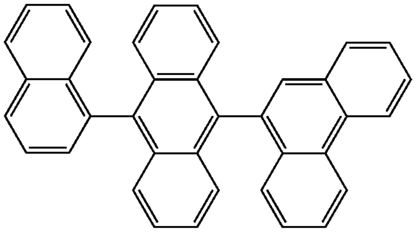

H4

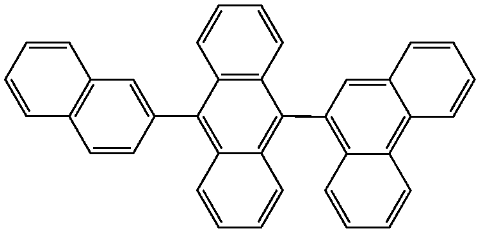

-continued

H5

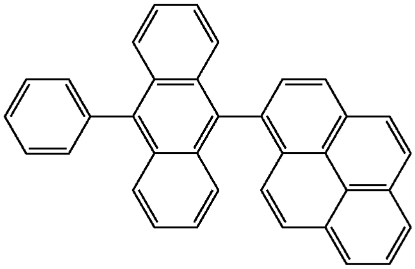

H6

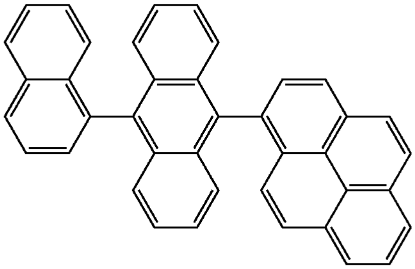

H7

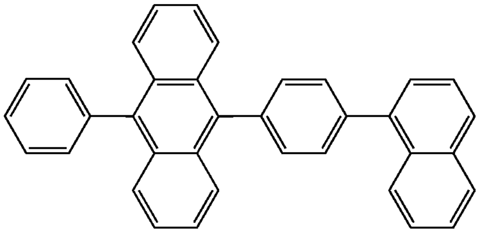

H8

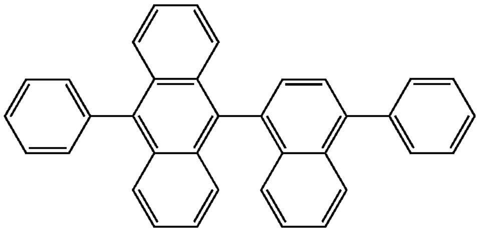

H9

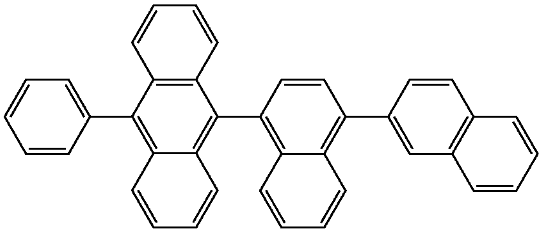

H10

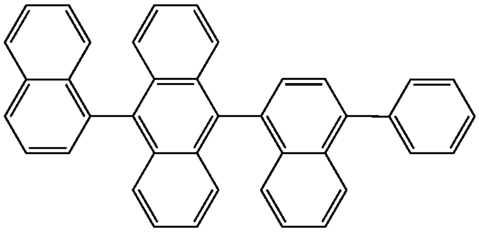

-continued
H11
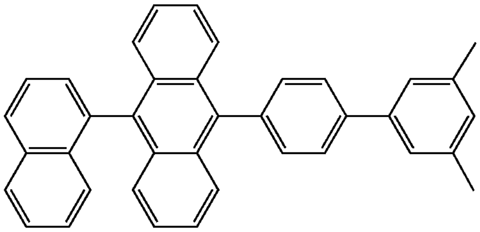
H12
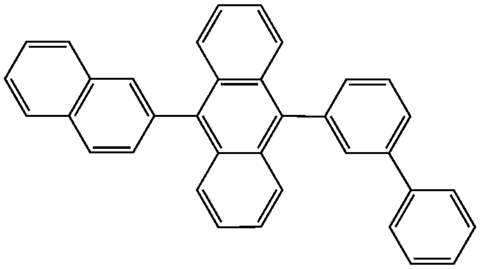
H13
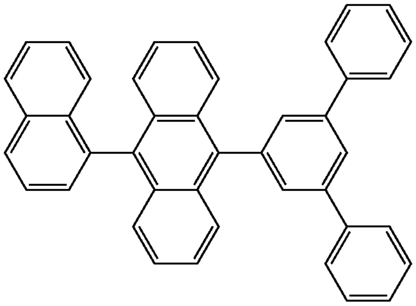
H14
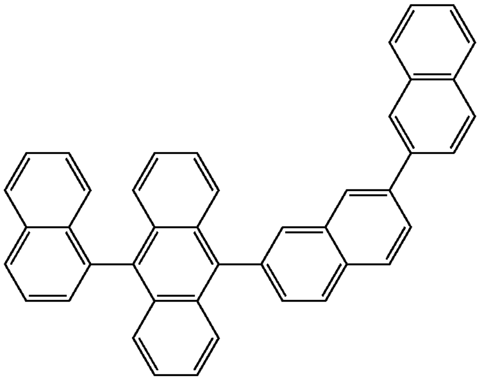
H15
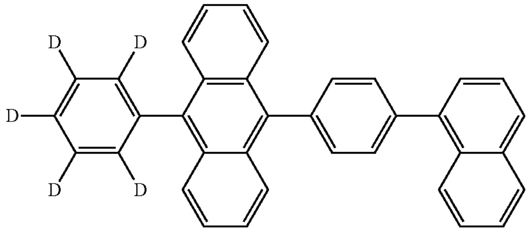
-continued
H16
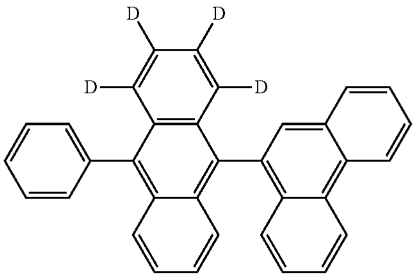
H17
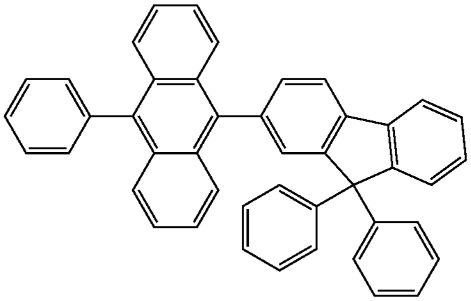
H18
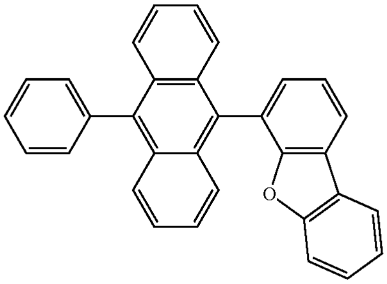
H19
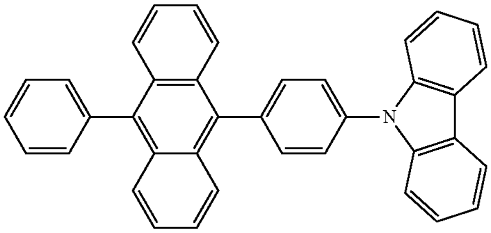
H20
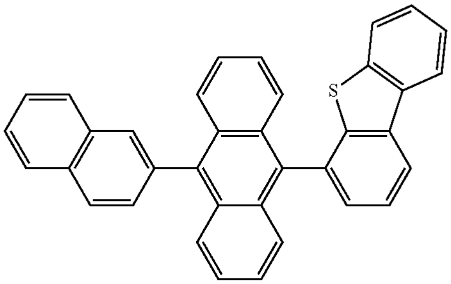

-continued
H21
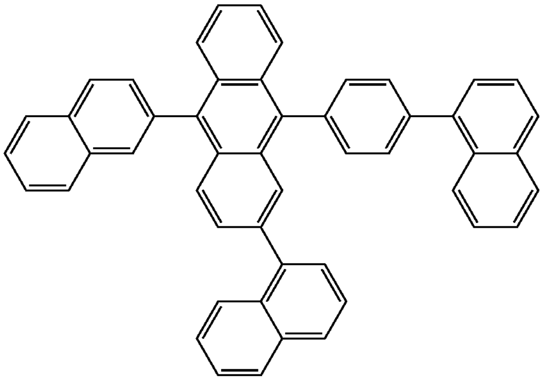
H22
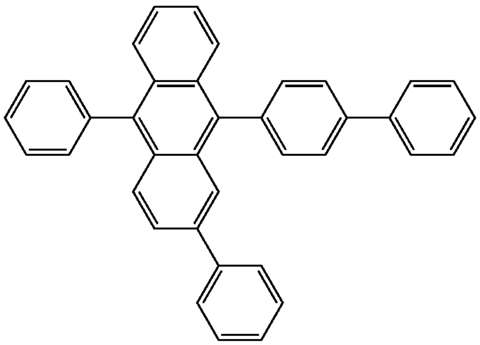
H23
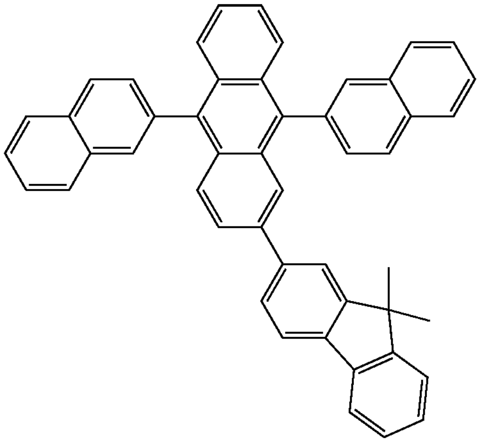
H24
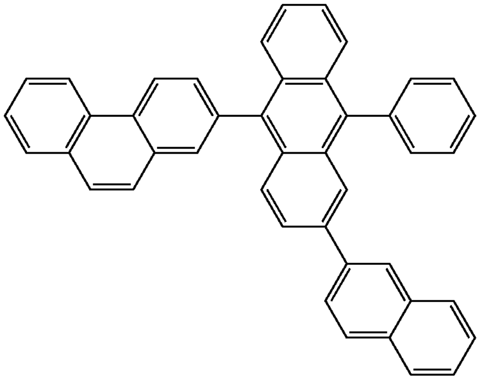
-continued
H25
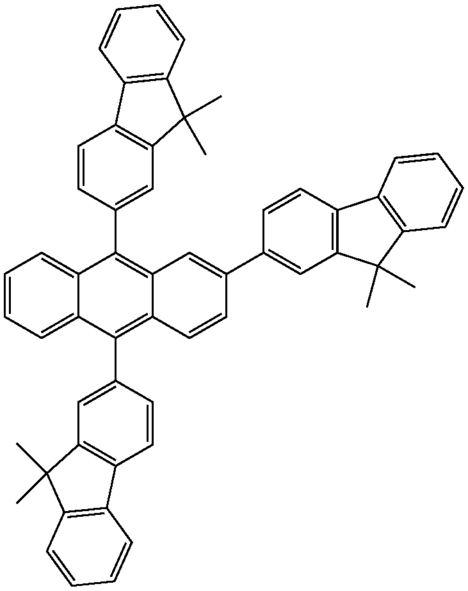
H26
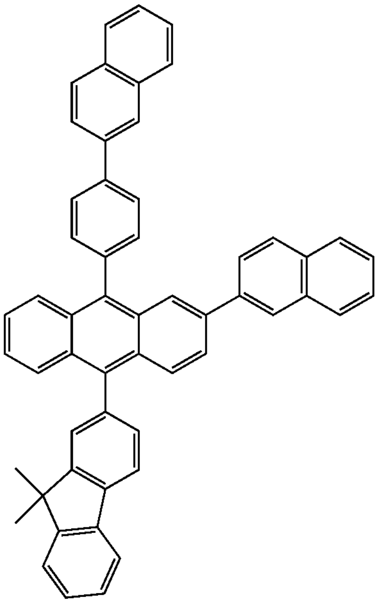

-continued
H27
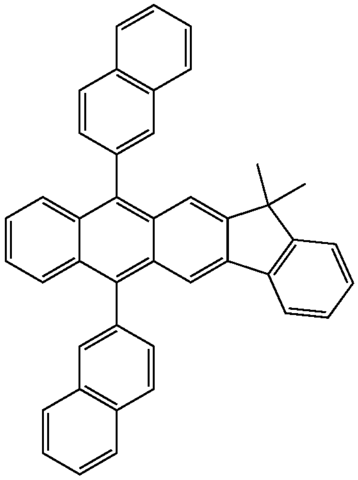
H28
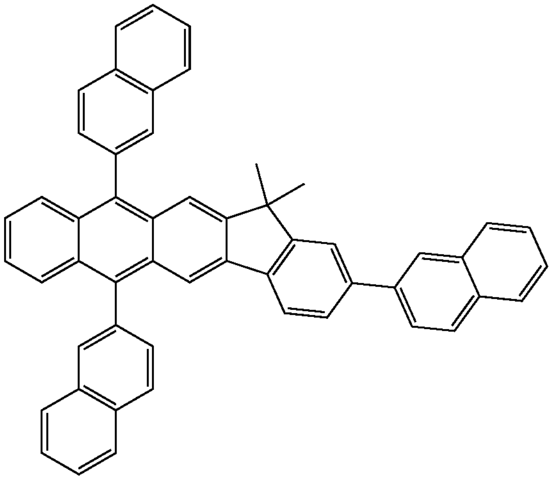
H29
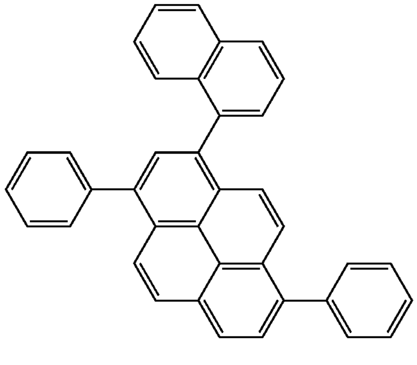
-continued
H30
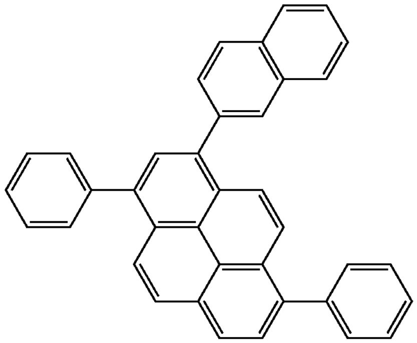
H31
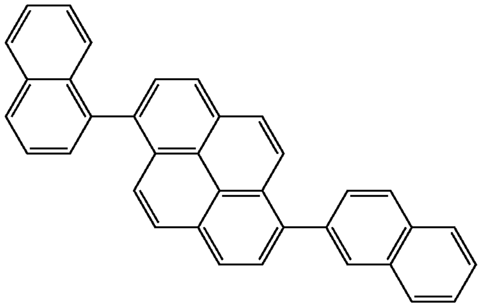
H32
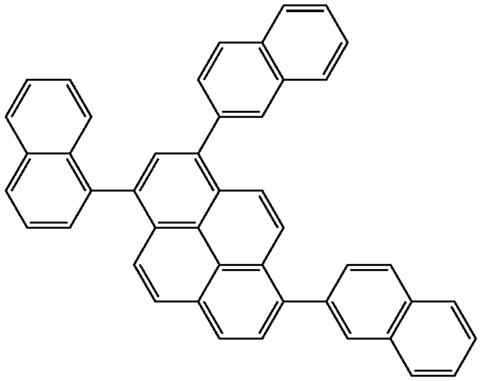
H33
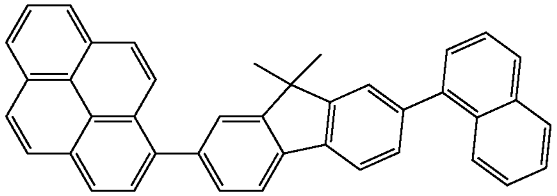
H34
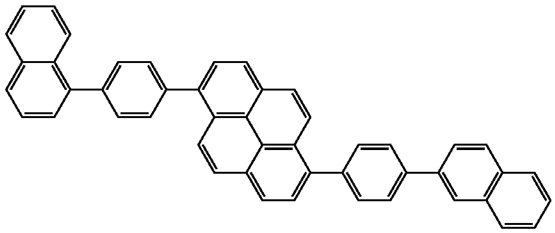

-continued
H35
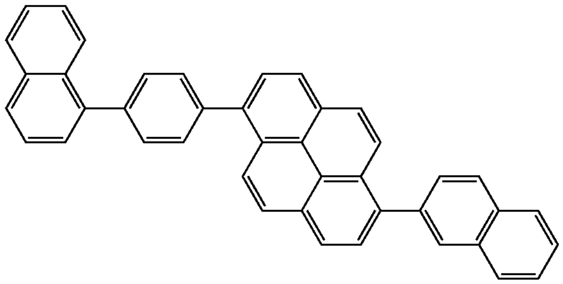
H36
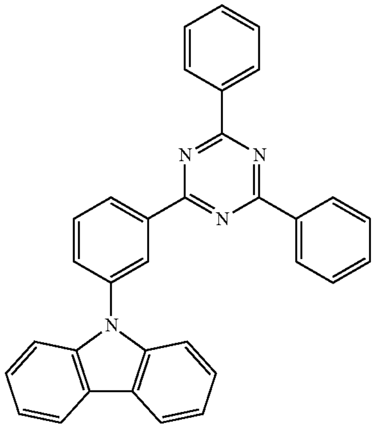
H37
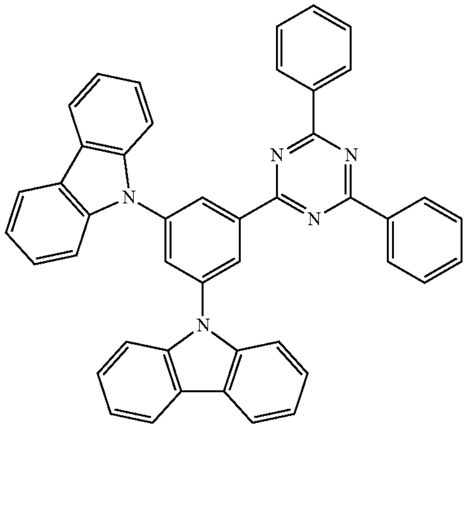
H38
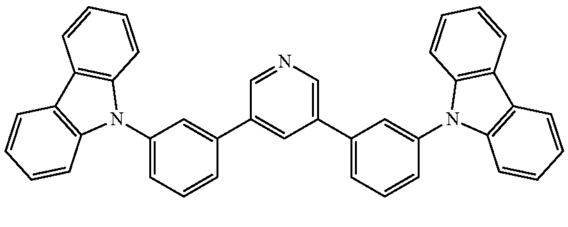
-continued
H39
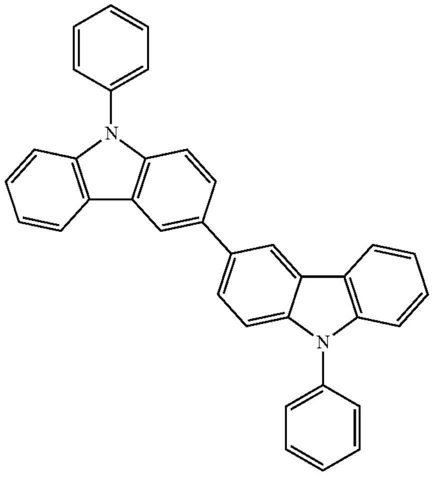
H40
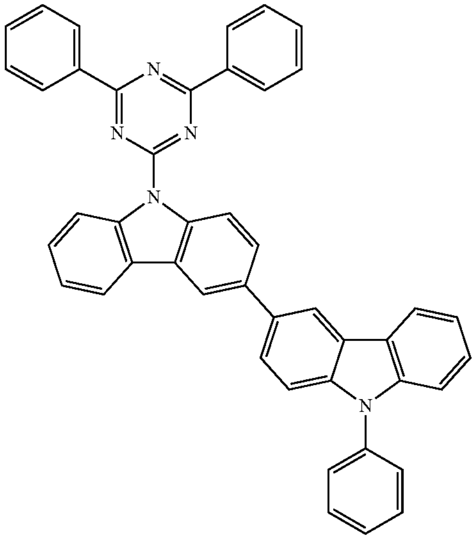
H41
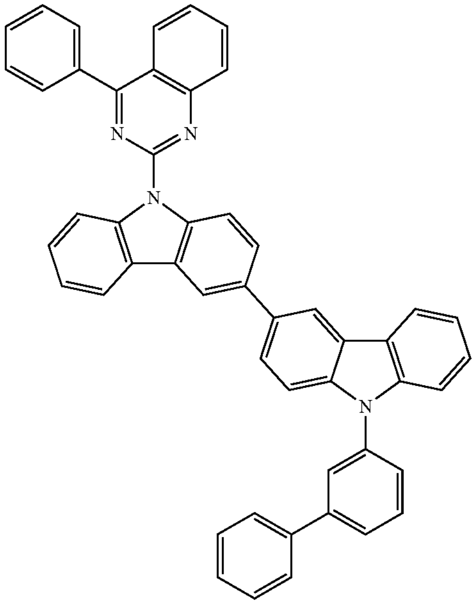

-continued
H42
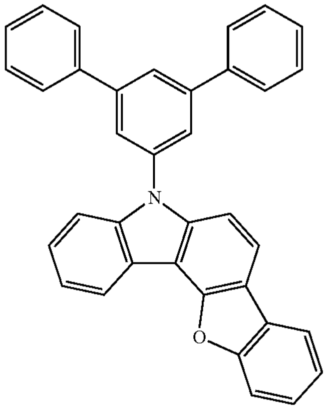
H43
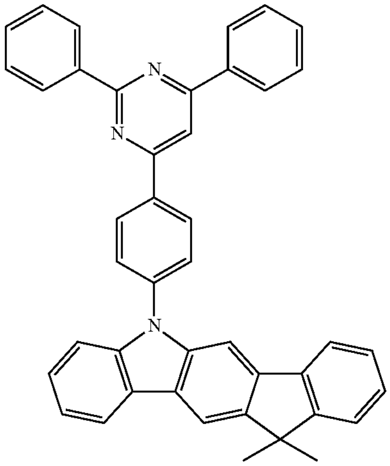
H44
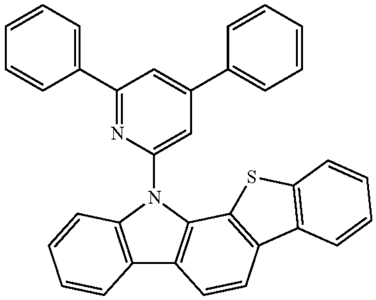
H45
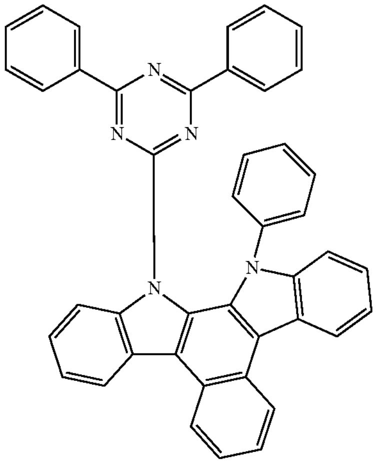
-continued
H46
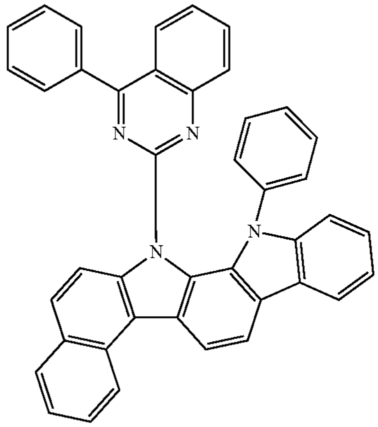
H47
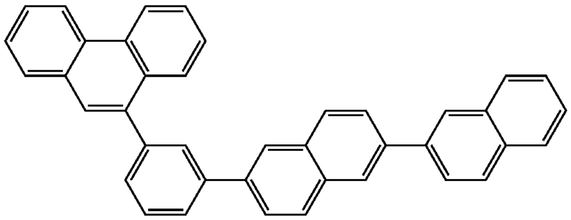
H48
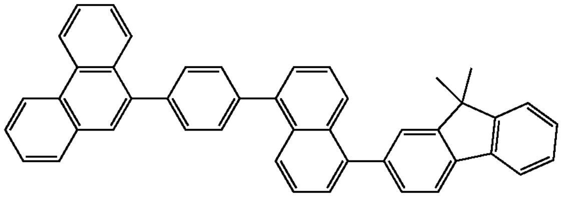
H49
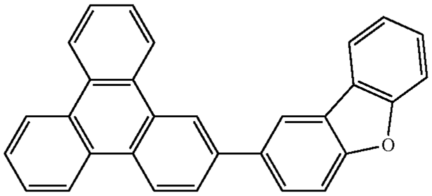
H50
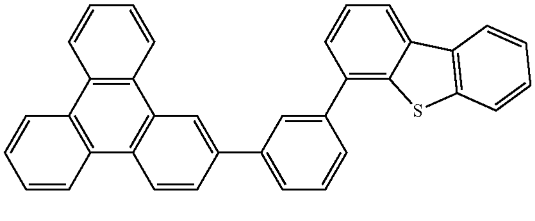
H51
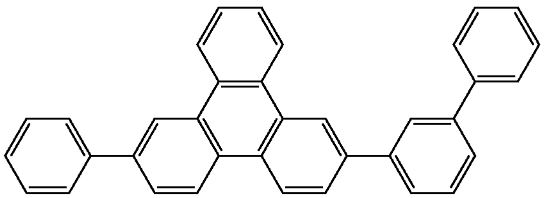

-continued
H52
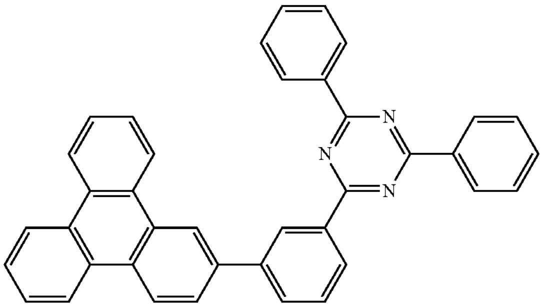
H53
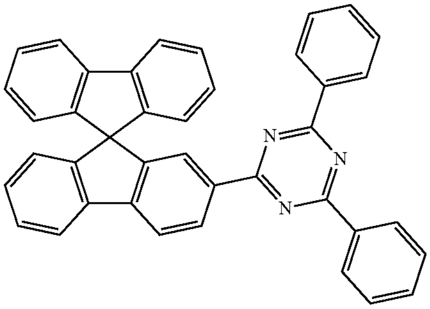
H54
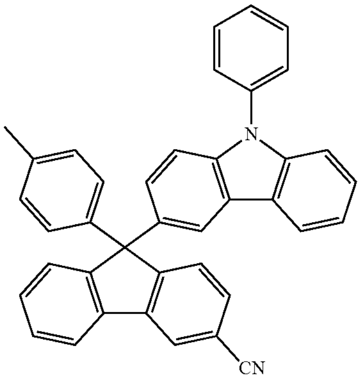
H55
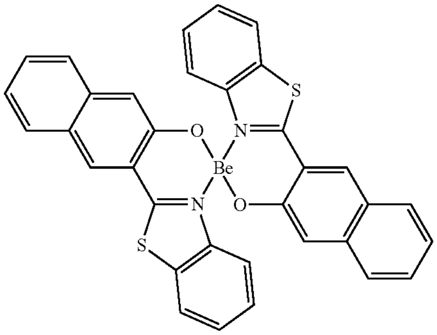
-continued
H56
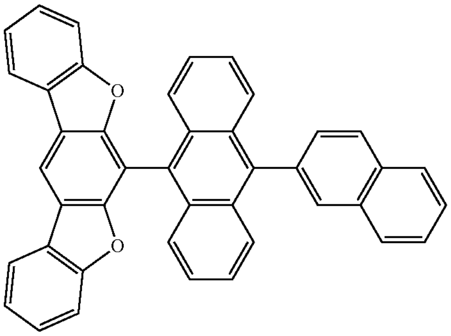
H57
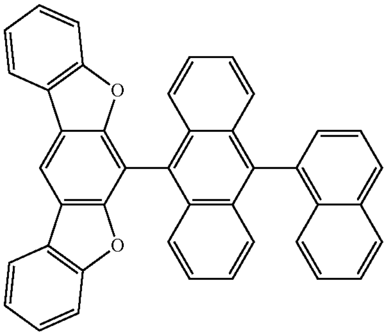
H58
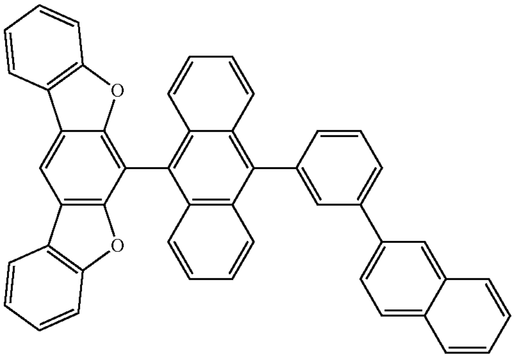
H59
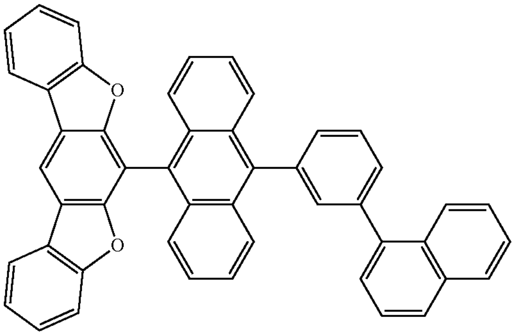

-continued
H60
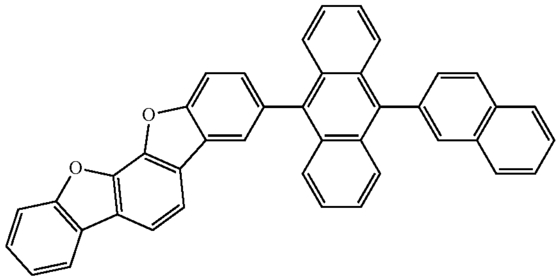
H61
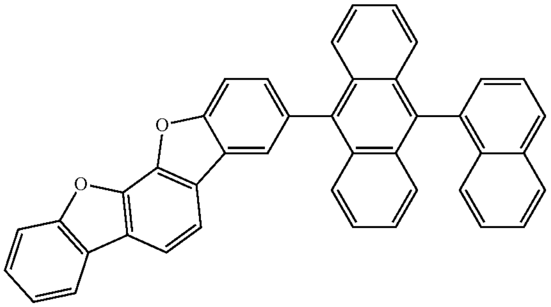
H62
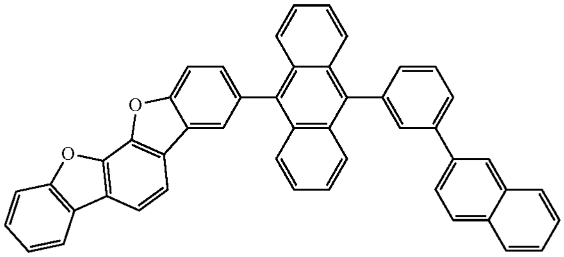
H63
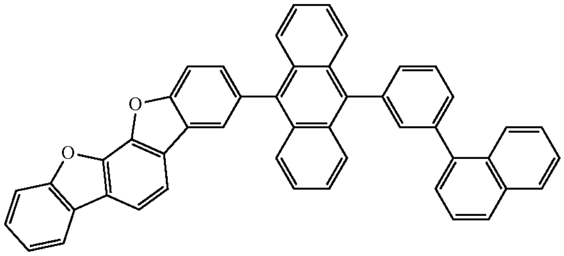
H64
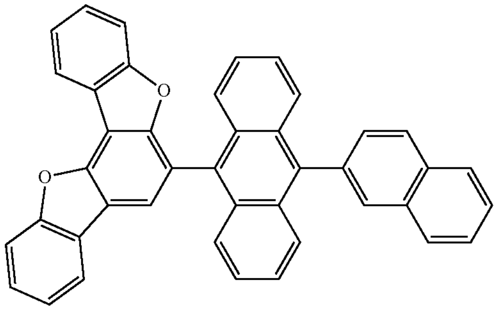
-continued
H65
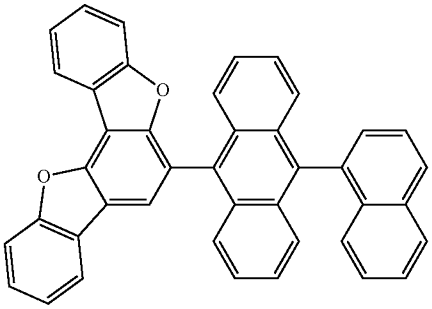
H66
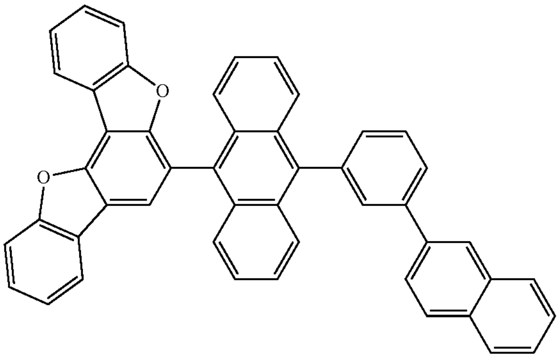
H67
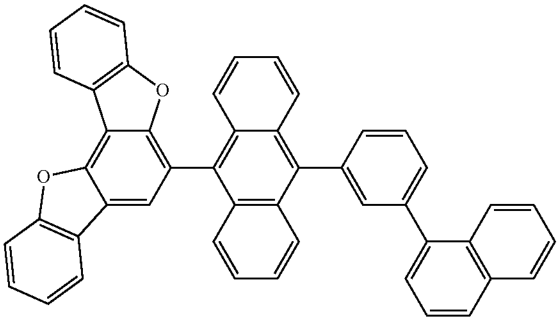
H68
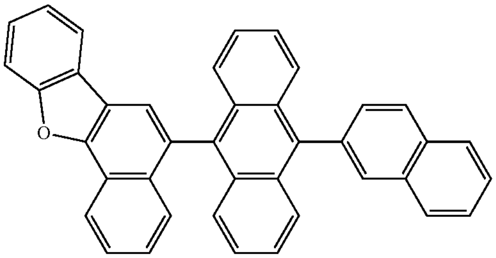
H69
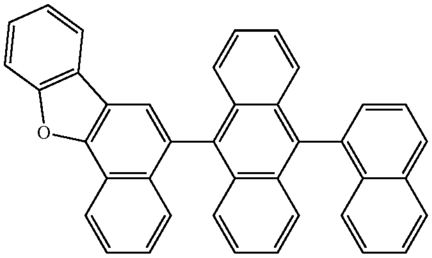

-continued
H70
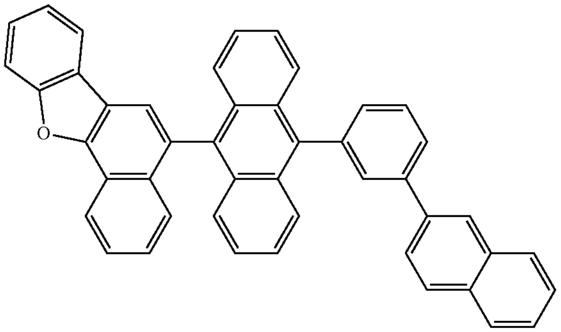
H71
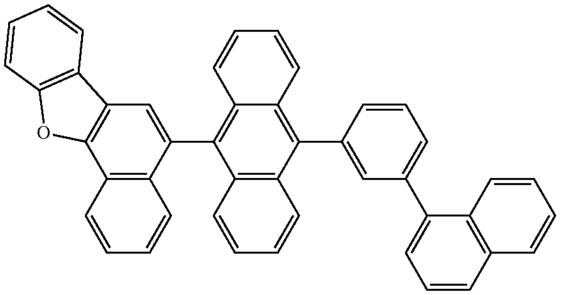
H72
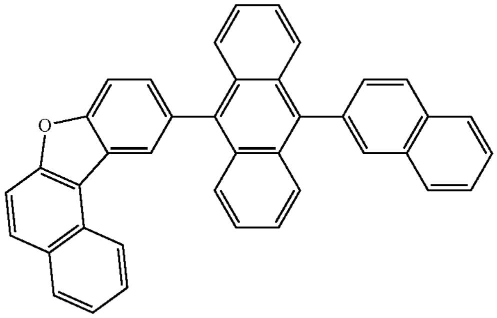
H73
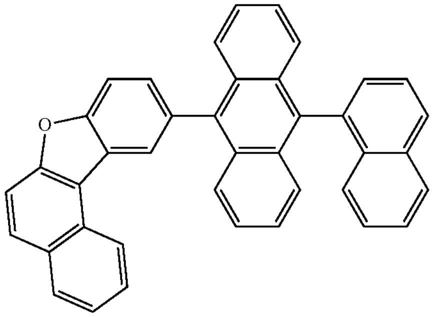
-continued
H74
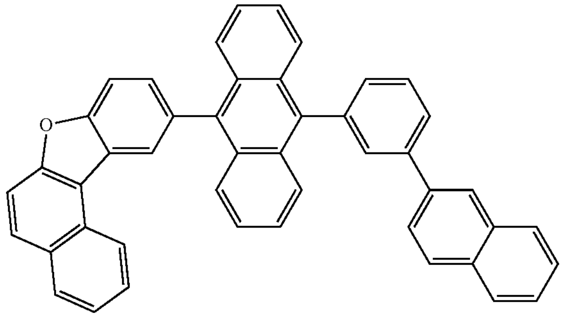
H75
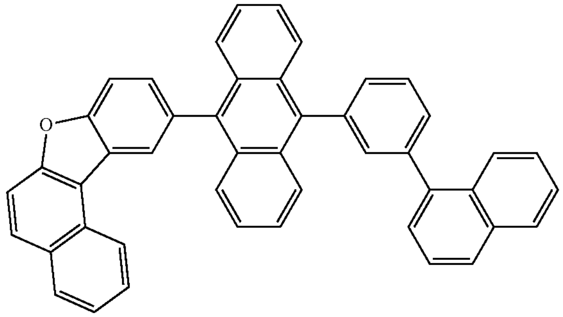
H76
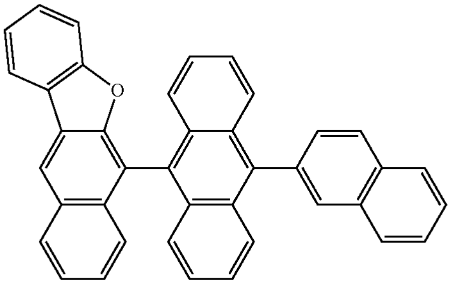
H77
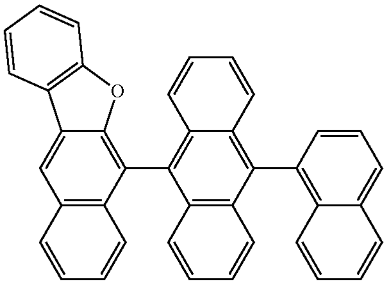
H78
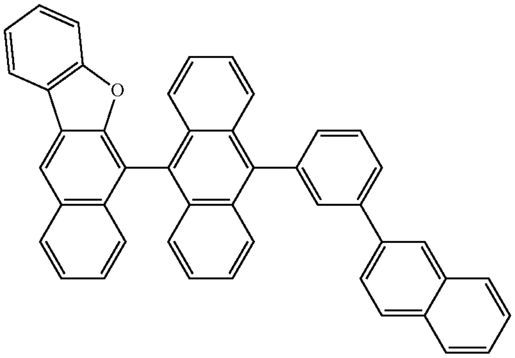

-continued
H79
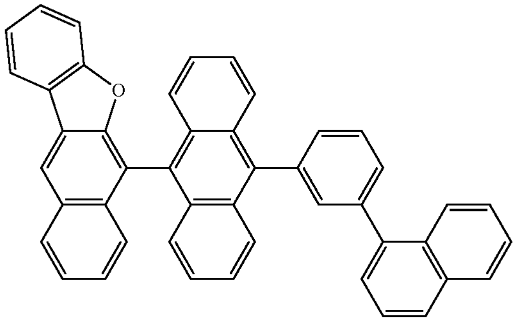
H80
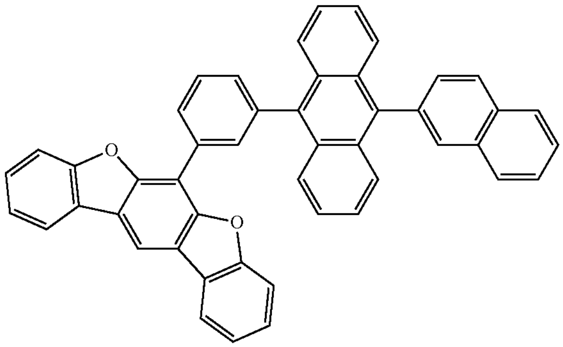
H81
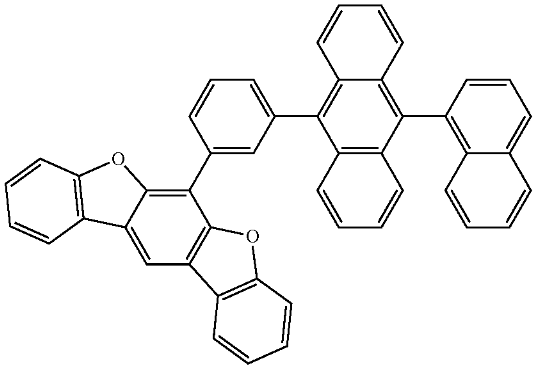
H82
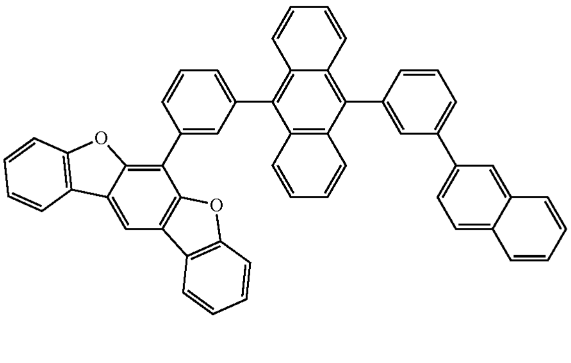
-continued
H83
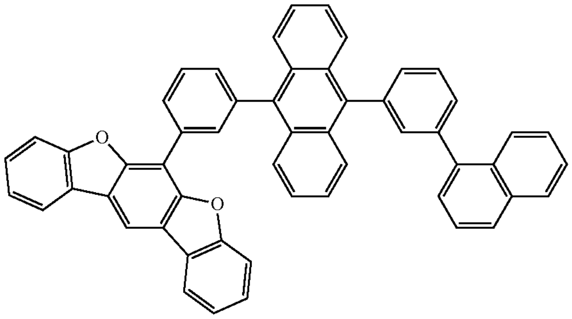
H84
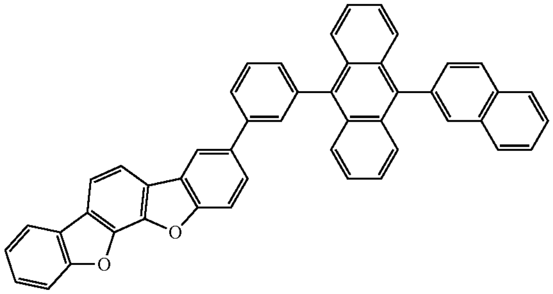
H85
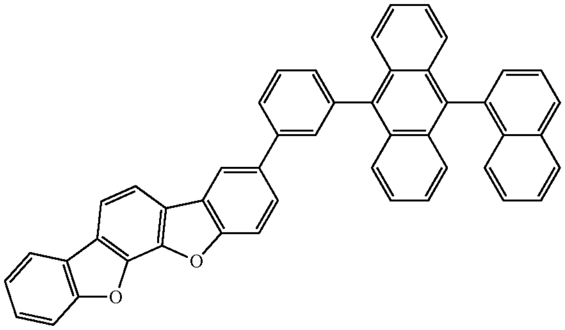
H86
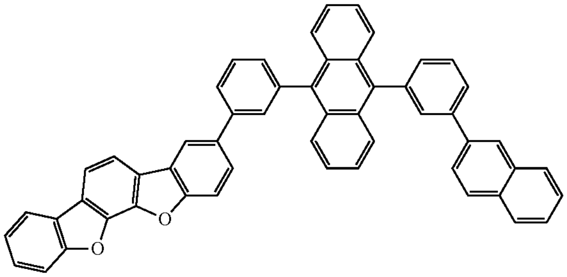
H87
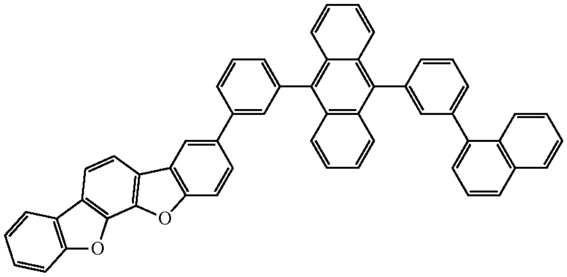

-continued
H88
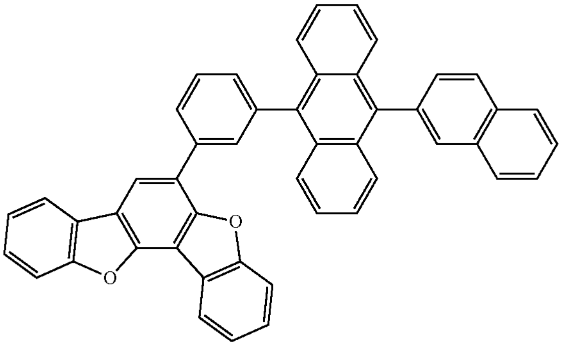
H89
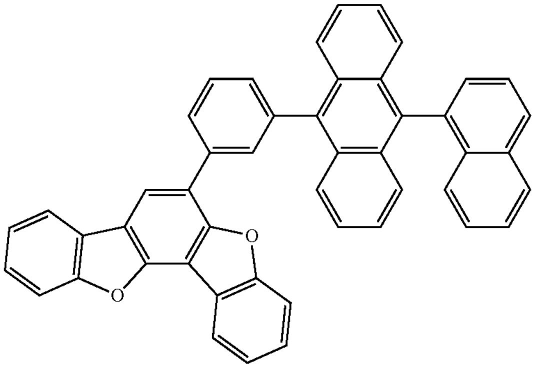
H90
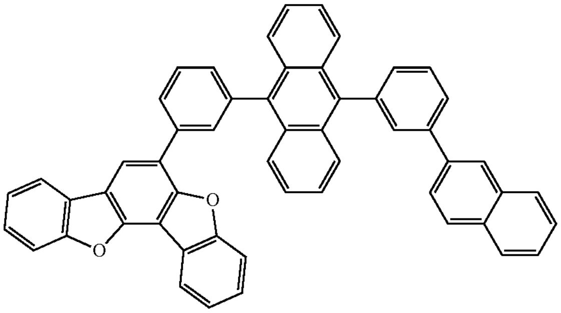
H91
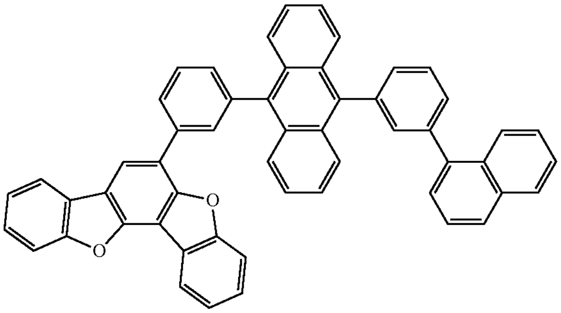
-continued
H92
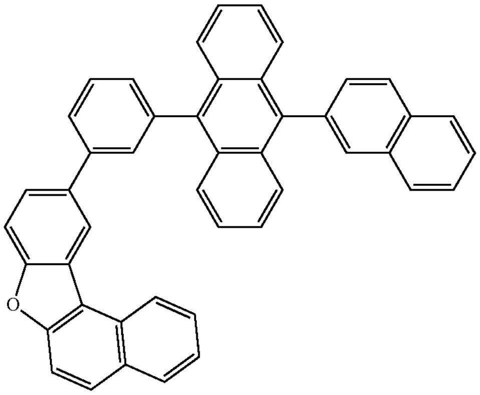
H93
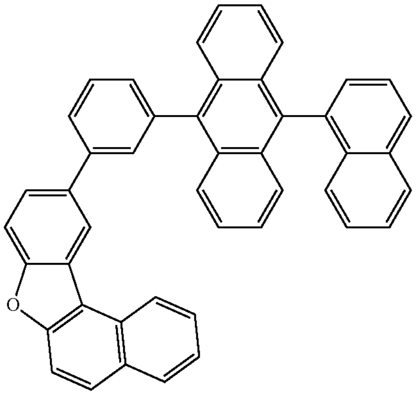
H94
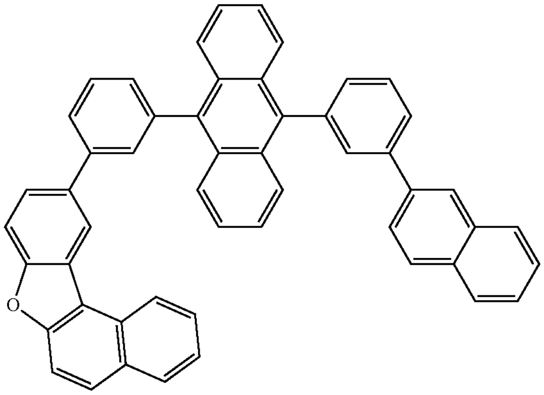
H95
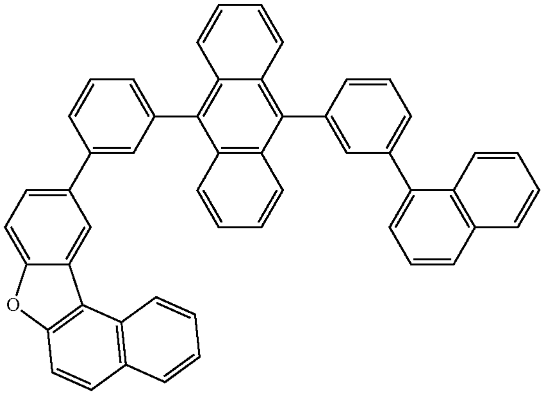

-continued
H96
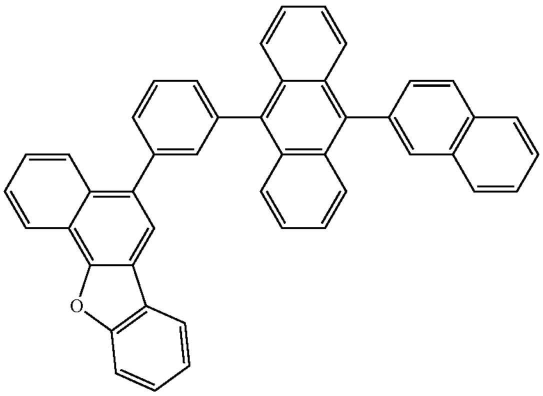
H97
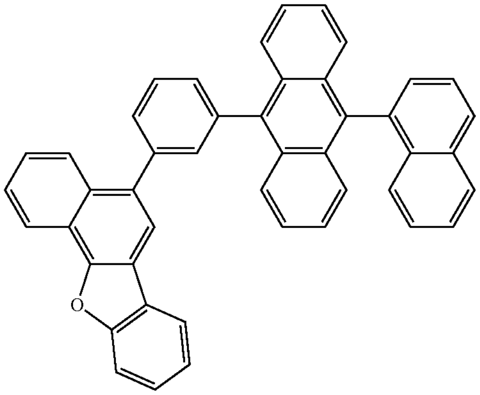
H98
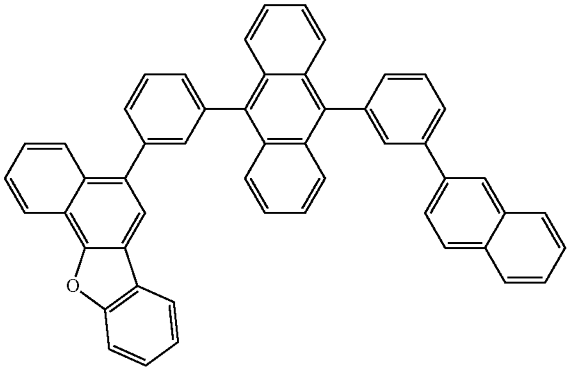
H99
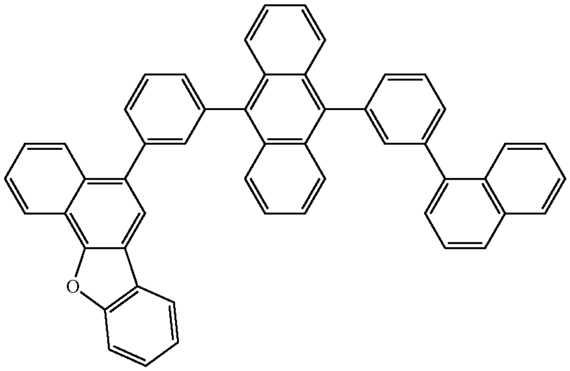
-continued
H100
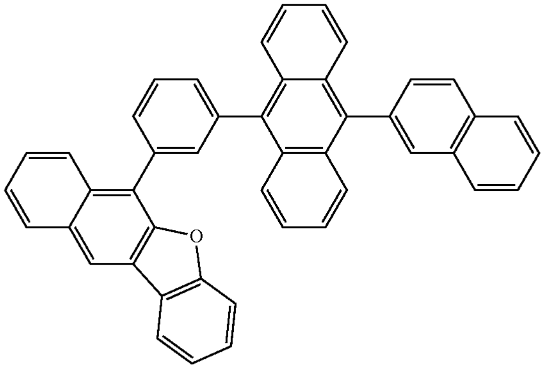
H101
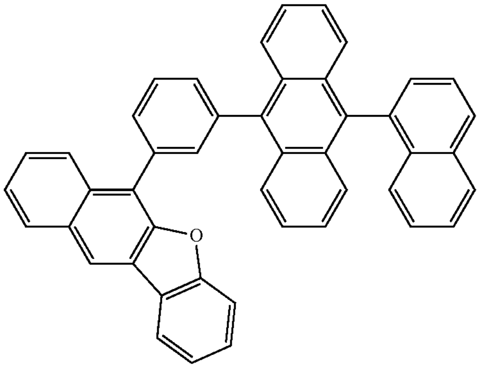
H102
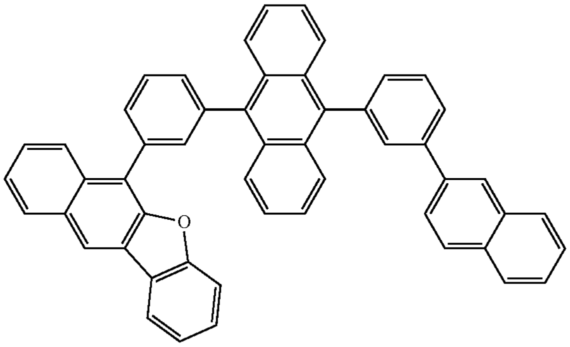
H103
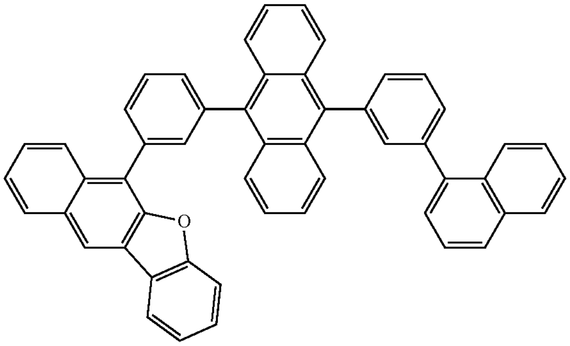

-continued
H104
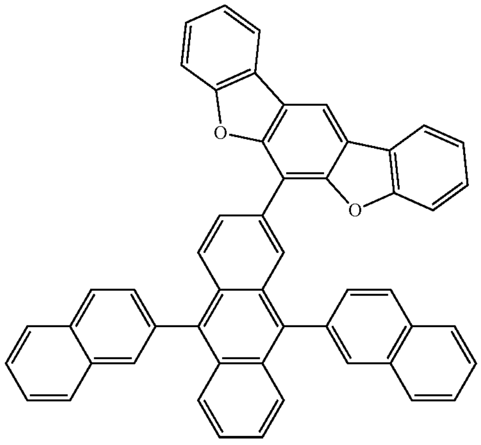
H105
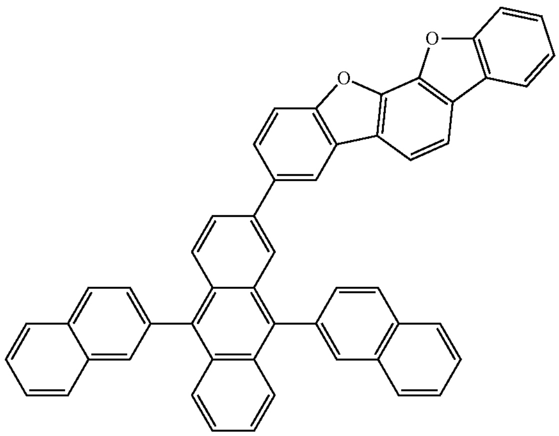
H106
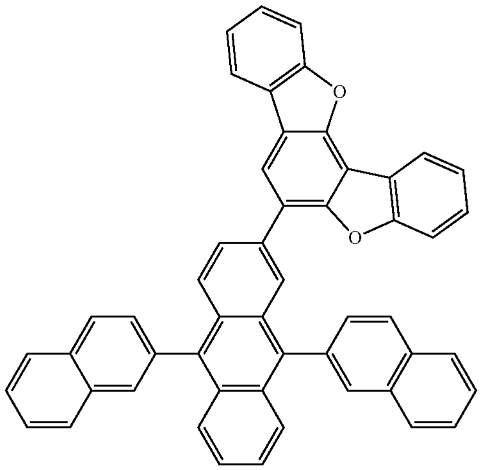
-continued
H107
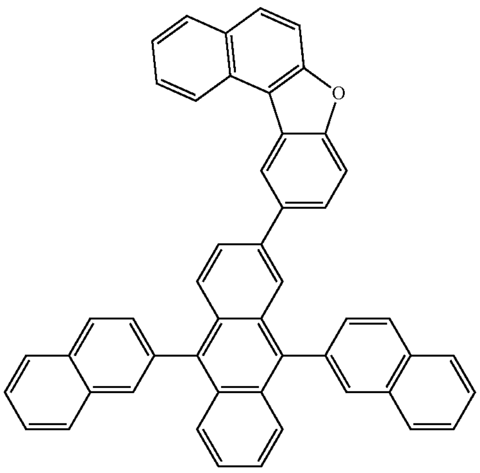
H108
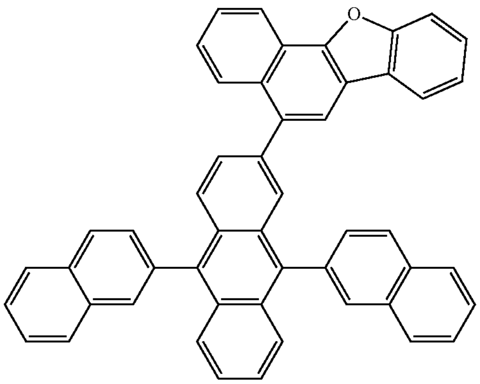
H109
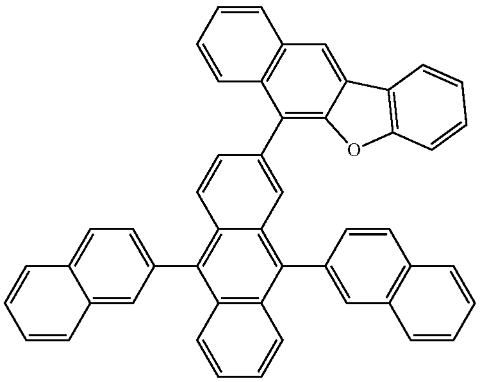
H110
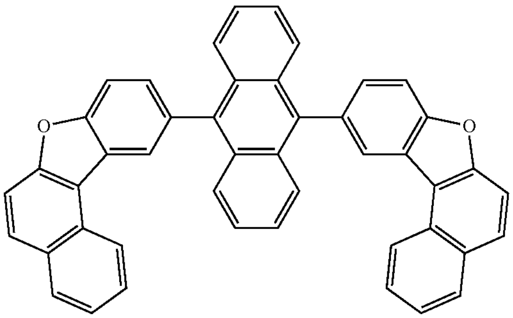

-continued
H111
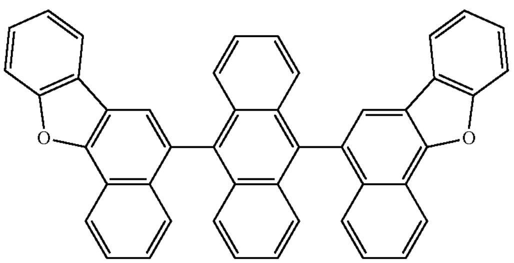
H112
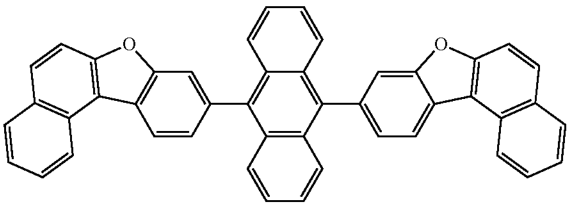
H113
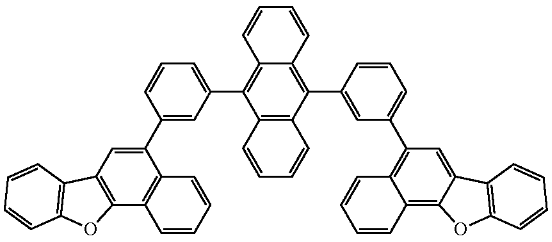
H114
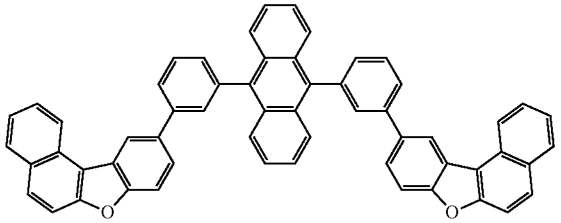
H115
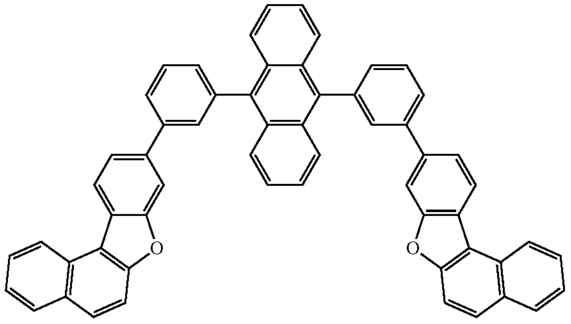
-continued
H116
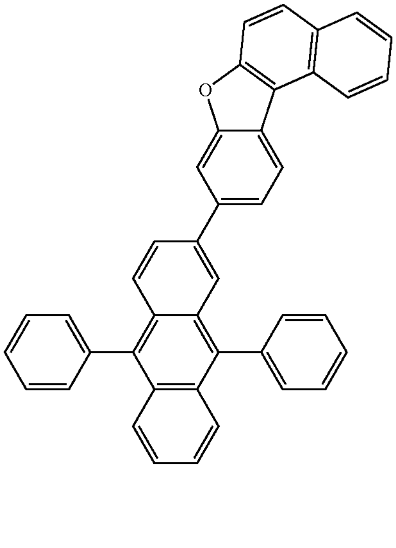
H117
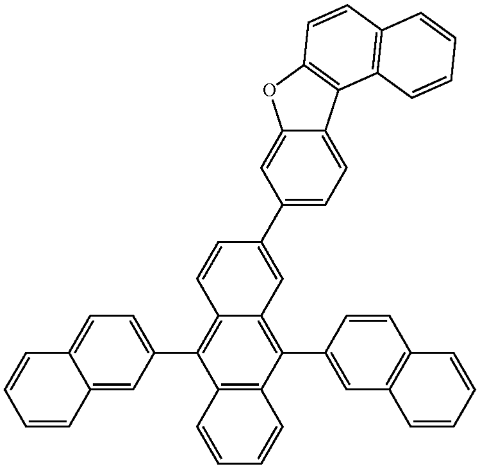
H118
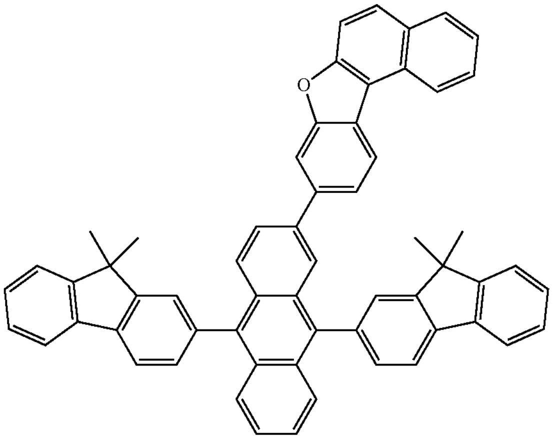

-continued

H119

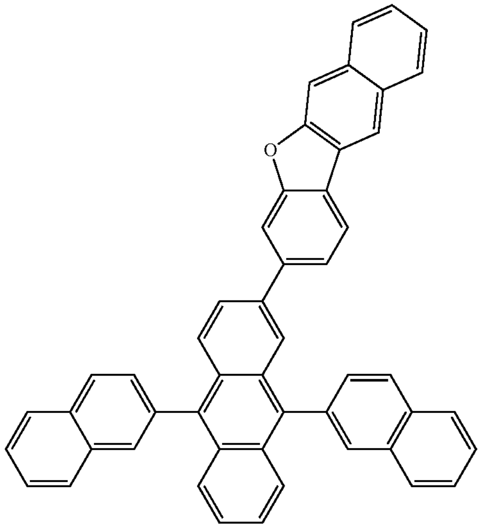

H120

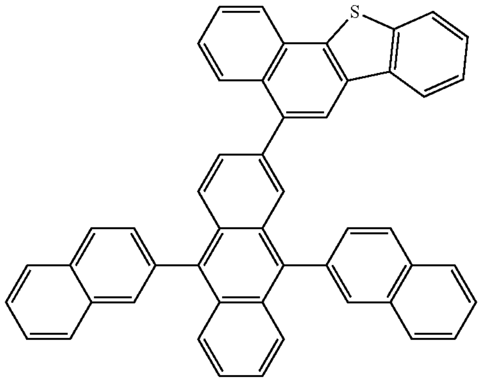

H121

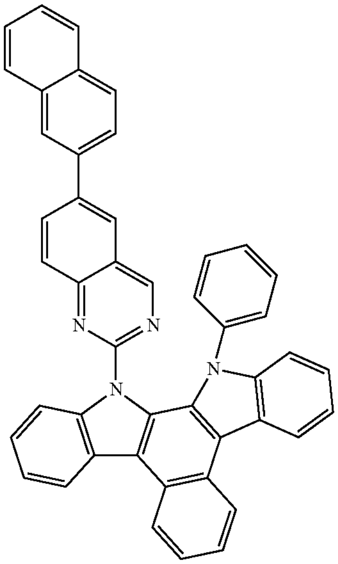

-continued

H122

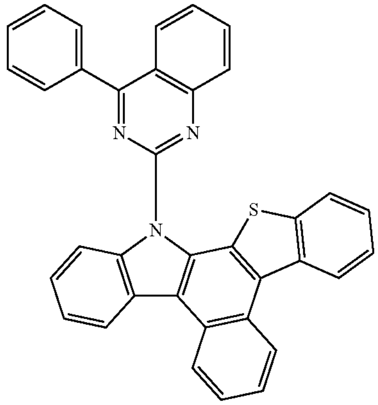

H123

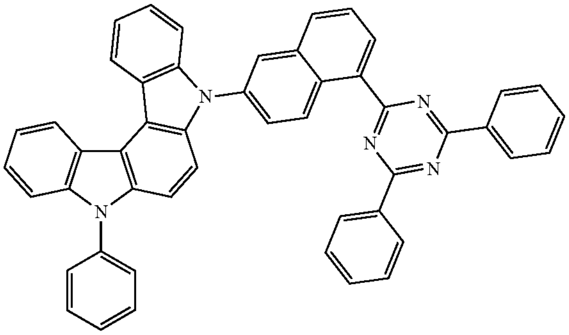

H124

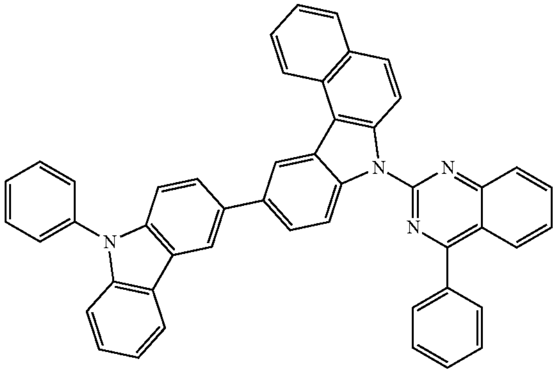

[Delayed Fluorescent Material]

The emission layer may include a delayed fluorescent material.

The delayed fluorescent material used herein may be any compound that is capable of emitting delayed fluorescent light based on a delayed fluorescence emission mechanism.

The delayed fluorescent material included in the emission layer may act as a host or a dopant depending on the type of other materials included in the emission layer.

In an embodiment, the difference between the triplet energy level (eV) of the delayed fluorescent material and the singlet energy level (eV) of the delayed fluorescent material may be in a range of about 0 to about 0.5 eV. When the difference between the triplet energy level (eV) of the delayed fluorescent material and the singlet energy level (eV) of the delayed fluorescent material satisfies the above-described range, up-conversion in which the delayed fluorescence materials transfer from the triplet state to the singlet state may effectively occur, and thus, the light emission efficiency of the light-emitting device 10 may be improved.

In an embodiment, the delayed fluorescent material may include i) a material that includes at least one electron donor (for example, a Tr electron-rich $C_3$-$C_{60}$ cyclic group, such as a carbazole group) and at least one electron acceptor (for example, a sulfoxide group, a cyano group, or a Tr electron-deficient nitrogen-containing $C_1$-$C_{60}$ cyclic group), or ii) a material including a $C_8$-$C_{60}$ polycyclic group in which two or more cyclic groups share boron (B) and are condensed with each other.

The delayed fluorescent material may include at least one of compounds DF1 to DF9:

DF1

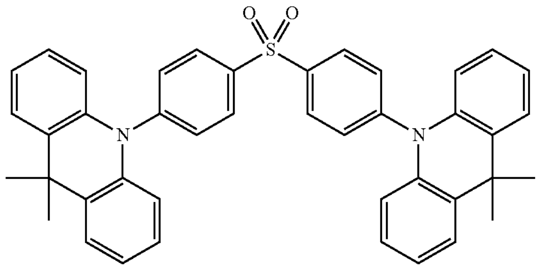

(DMAC-DPS)

DF2

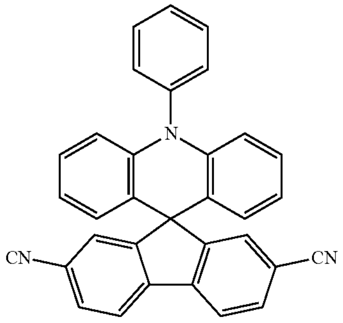

(ACRFLCN)

DF3

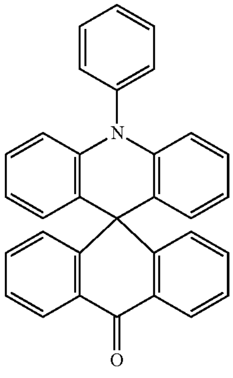

(ACRSA)

-continued

DF4

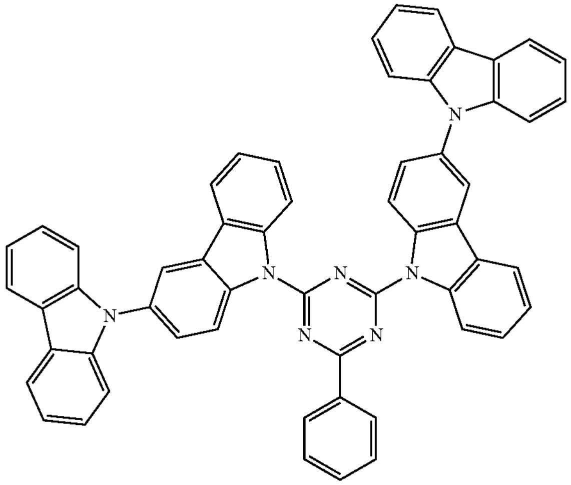

(CC2TA)

DF5

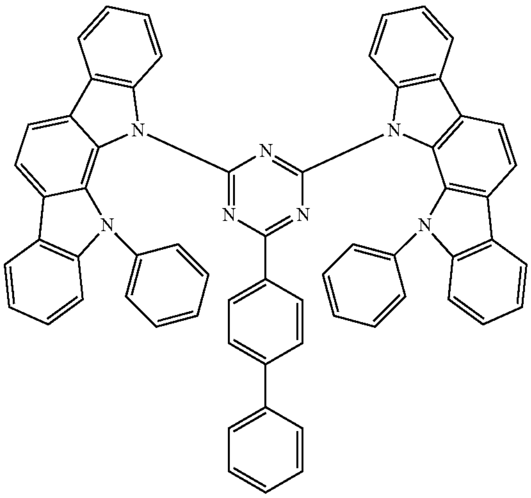

(PIC-TRZ)

DF6

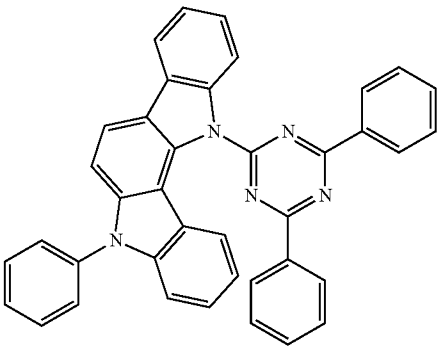

(PIC-TRZ2)

-continued

DF7

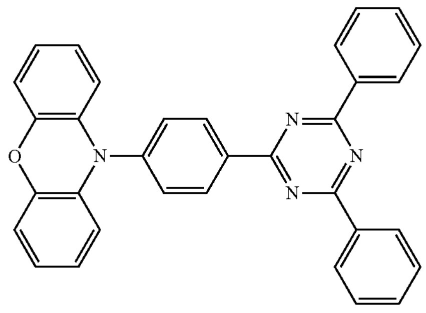

(PXZ-TRZ)

DF8

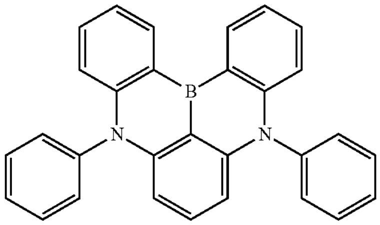

(DABNA-1)

DF9

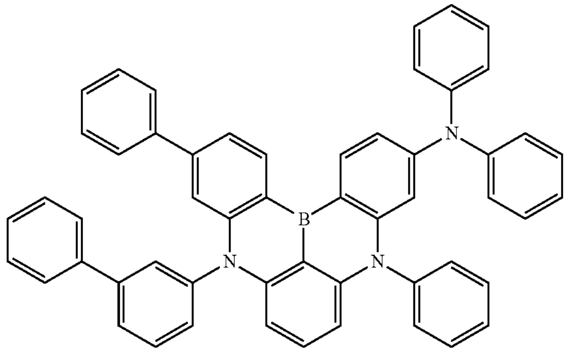

(DABNA-2)

[Quantum Dot]

The emission layer may include a quantum dot.

The quantum dot used herein refers to the crystal of a semiconductor compound, and may include any material that is capable of emitting light of various emission wavelengths depending on the size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, or a similar process.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Groups III-VI semiconductor compound, Groups II-VI semiconductor compound, Groups III-V semiconductor compound, Groups III-VI semiconductor compound, Group I-III-VI semiconductor compound, Groups IV-VI semiconductor compound, Group IV element or compound, or any combination thereof.

Examples of the Groups III-VI semiconductor compound are a binary compound, such as $In_2S_3$; a ternary compound, such as AgInS, $AgInS_2$, CuInS, or $CuInS_2$; or any combination thereof.

Examples of the Groups II-VI semiconductor compound are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; and any combination thereof.

Examples of the Groups III-V semiconductor compounds are a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; and any combination thereof. The Groups III-V semiconductor compounds may further include a Group II element. Examples of the Groups III-V semiconductor compounds further including a Group II element are InZnP, InGaZnP, and InAlZnP.

Examples of the Groups III-VI semiconductor compound are a binary compound, such as GaS, GaSe, $Ga_2Se_3$, GaTe, InS, InSe, $In_2Se_3$, or InTe; a ternary compound, such as $InGaS_3$, or $InGaSe_3$; and any combination thereof.

Examples of the Groups I-III-VI semiconductor compounds are a ternary compound, such as AgInS, $AgInS_2$, CuInS, $CuInS_2$, $CuGaO_2$, $AgGaO_2$, or $AgAlO_2$; and any combination thereof.

Examples of the Group IV-VI semiconductor compounds are a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; and any combination thereof.

In an embodiment, the Group IV element or compound may include a single element compound, such as Si or Ge; a binary compound, such as SiC or SiGe; or any combination thereof.

Each element included in the multi-element compound such as the binary compound, a ternary compound, and a quaternary compound may be present, in a particle, at a uniform concentration or a non-uniform concentration.

The quantum dot may have a single structure having a uniform concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are a metal or non-metal oxide, a semiconductor compound, or any combination thereof. Examples of the oxide of metal or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, Groups III-VI semiconductor compounds, Groups II-VI semiconductor compounds, Groups III-V semiconductor compounds, Groups III-VI semiconductor compounds, Groups I-III-VI semiconductor compounds, Groups IV-VI semiconductor compounds, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be less than or equal to about 45 nm. For example, the FHWM of an emission wavelength spectrum of the quantum dot may be equal to or less than about 40 nm or less. For example, the FHWM of an emission wavelength spectrum of the quantum dot may be equal to or less than about 30 nm. When the FWHM of the emission wavelength spectrum of the quantum dot is within this range, color purity or color reproduction may be improved. Light emitted through such quantum dots may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or nanoplate particle.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. In an embodiment, the size of the quantum dot may be selected to emit red, green and/or blue light. The size of the quantum dot may be adjusted such that light of various colors are combined to emit white light.

[Electron Transport Region in Interlayer 130]

The electron transport region may have: i) a single-layered structure consisting of a single layer consisting of a single material, ii) a single-layered structure consisting of a single layer consisting of different materials, or iii) a multi-layered structure including multiple layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \quad \text{[Formula 601]}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one R10a, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a Tr electron-deficient nitrogen-containing $C_1$-$C_{60}$ cyclic group unsubstituted or substituted with at least one $R_{10a}$.

In embodiments, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

[Formula 601-1]

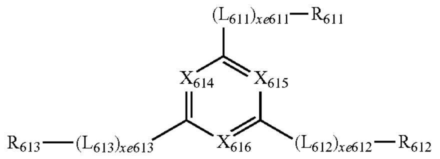

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1
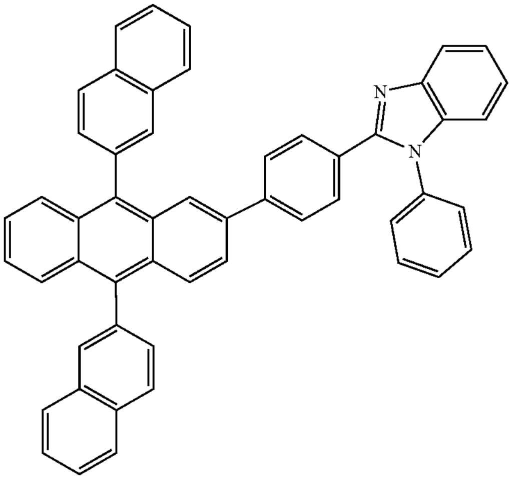
ET2
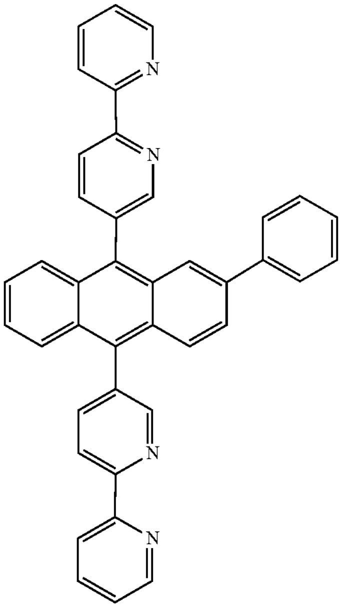
ET3
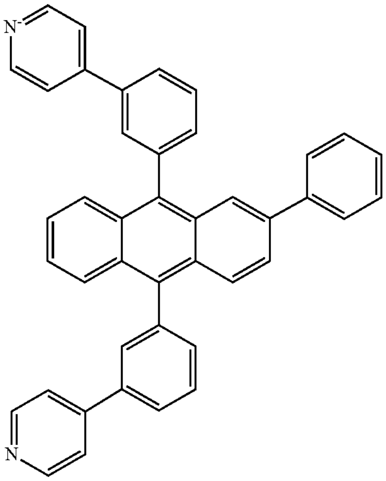
-continued
ET4
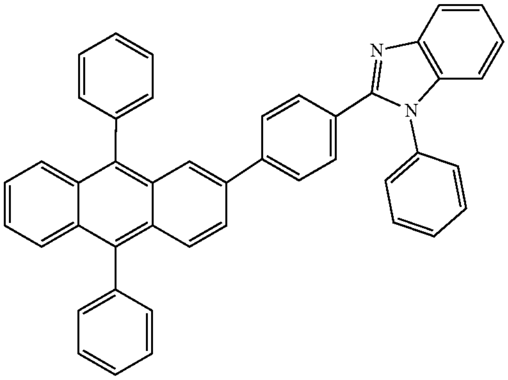
ET5
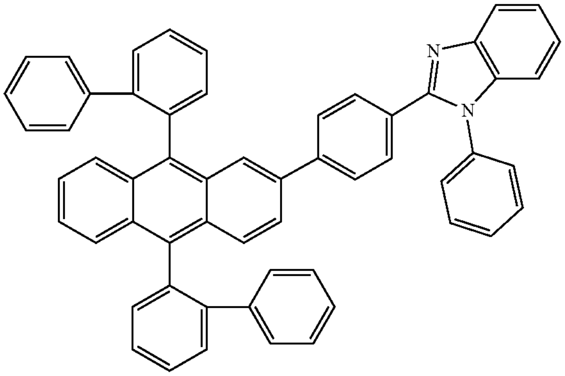
ET6
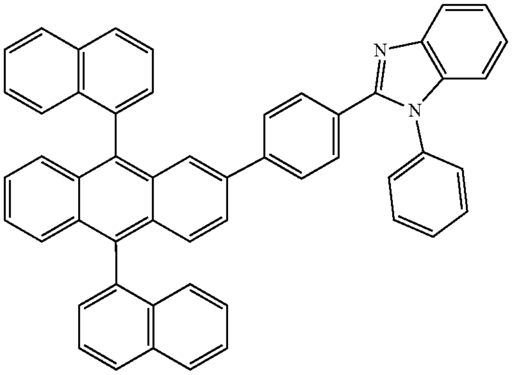

-continued
ET7
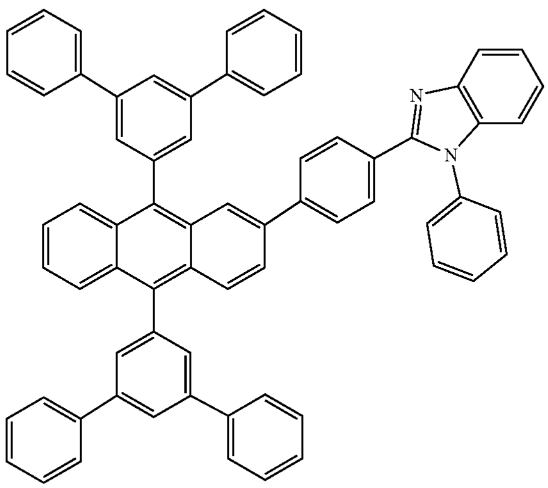
ET8
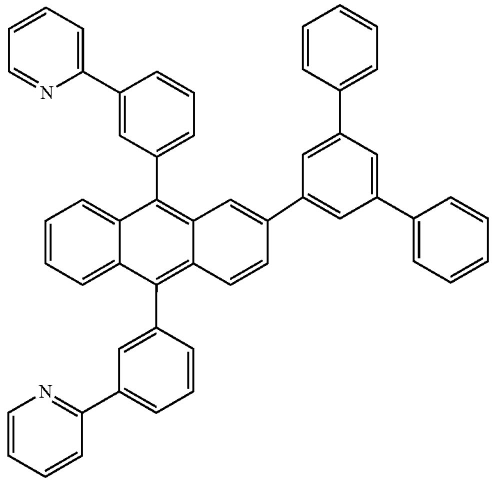
ET9
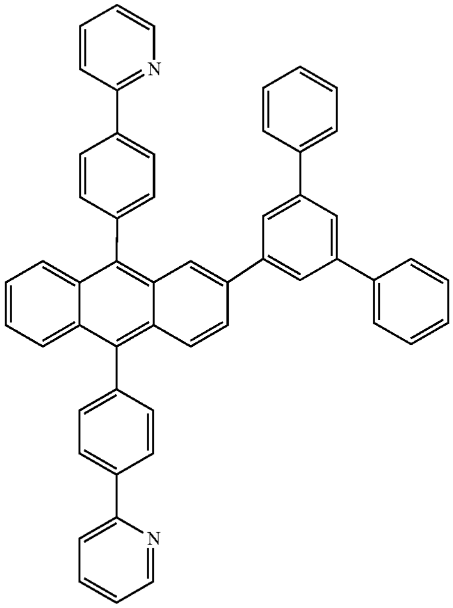
-continued
ET10
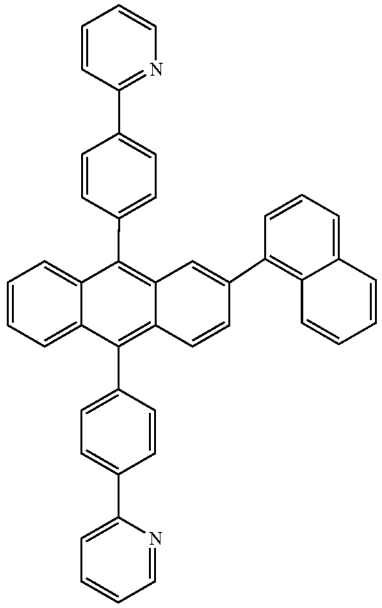
ET11
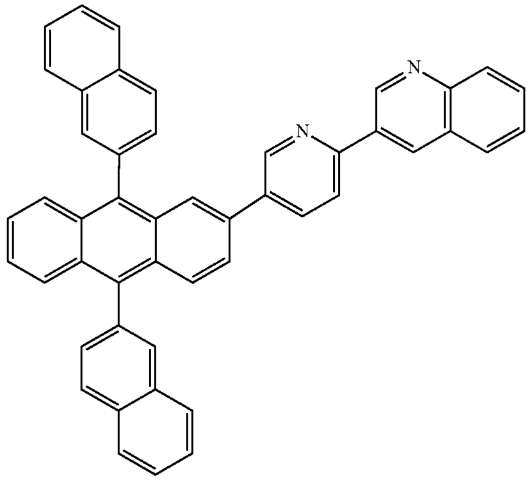
ET12
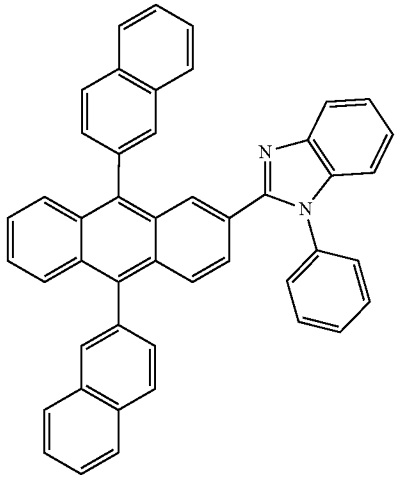

-continued
ET13
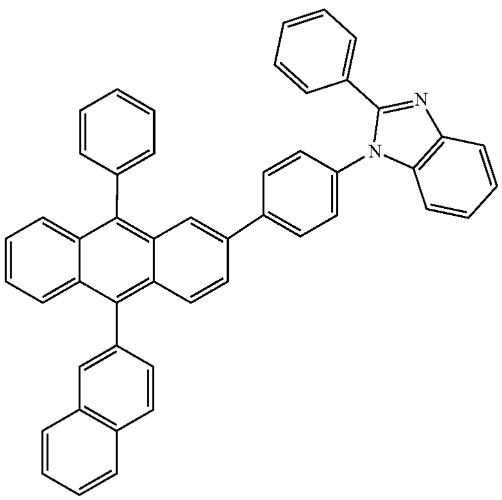
ET14
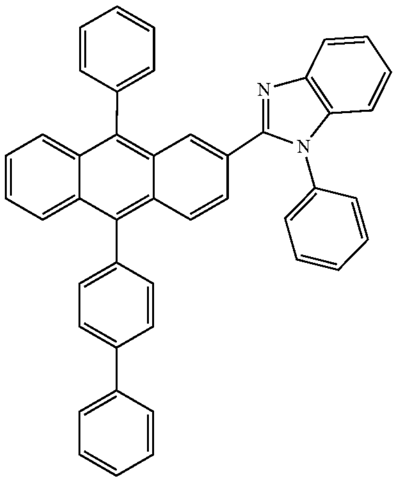
ET15
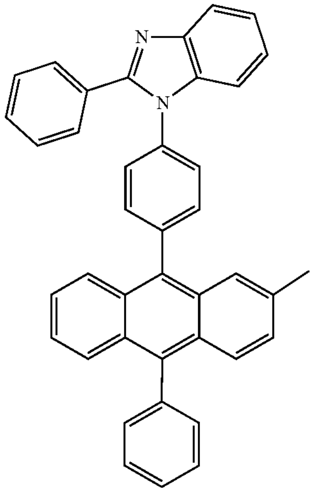
-continued
ET16
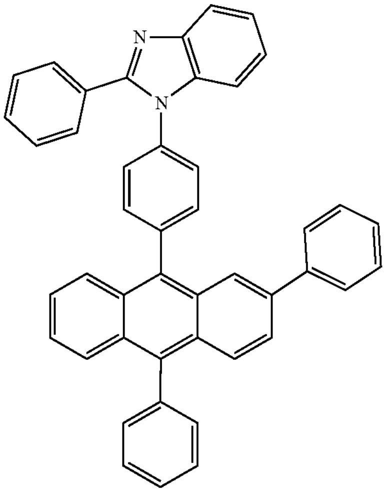
ET17
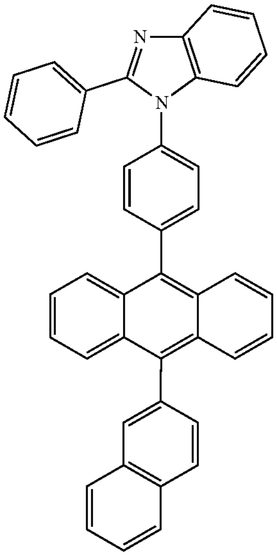
ET18
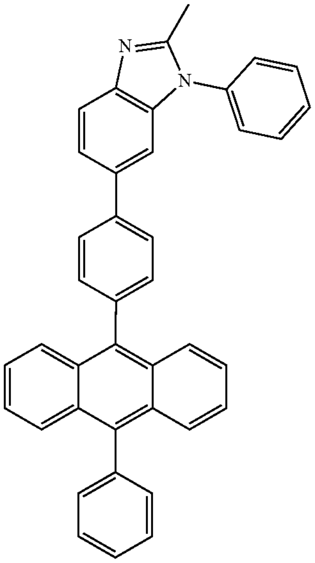

-continued
ET19
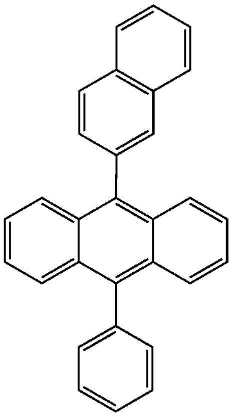
ET20
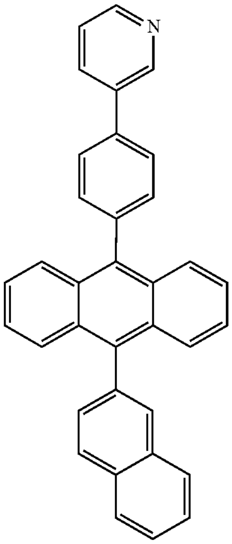
ET21
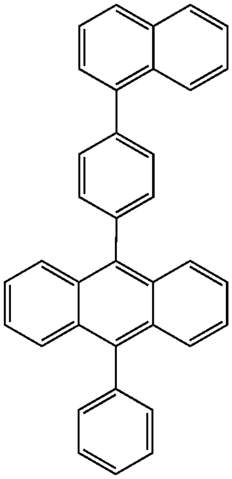
-continued
ET22
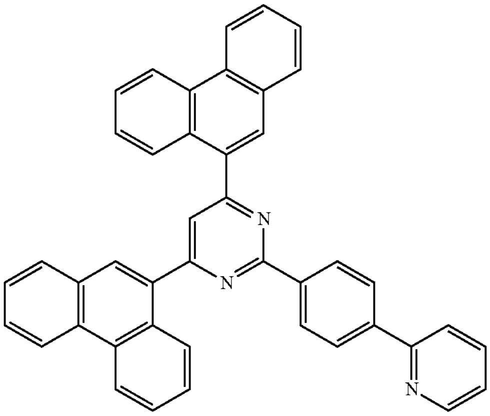
ET23
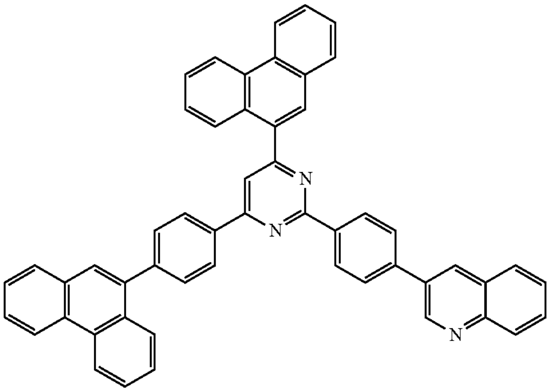
ET24
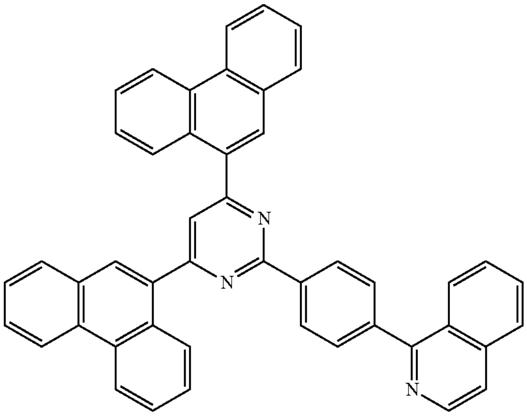

-continued
ET25
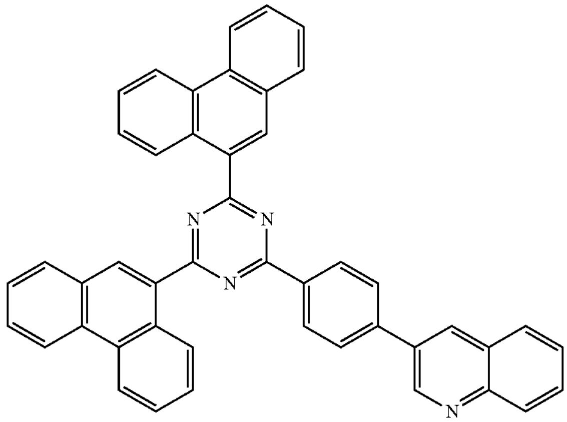
ET26
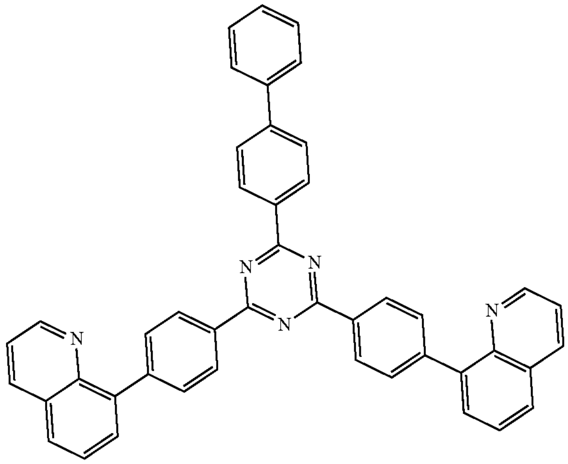
ET27
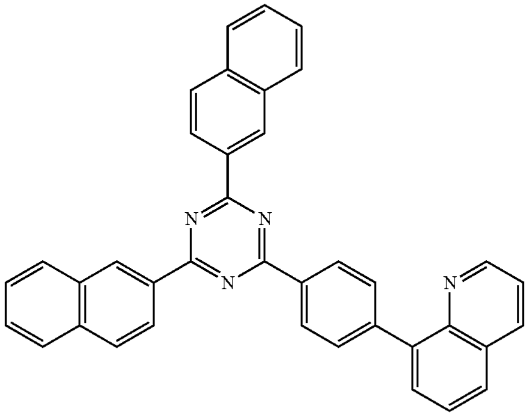
-continued
ET28
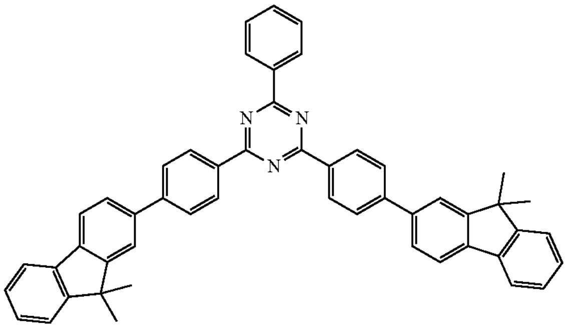
ET29
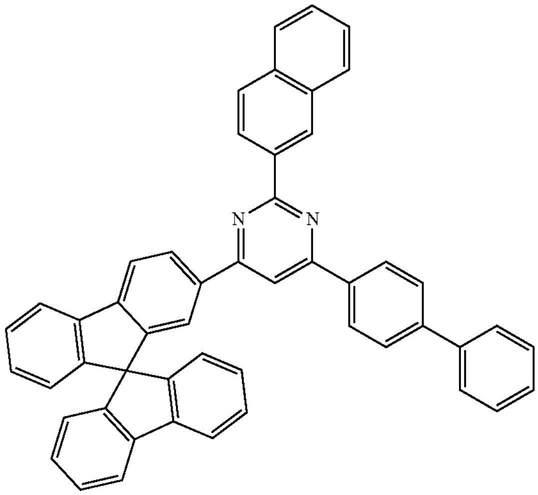
ET30
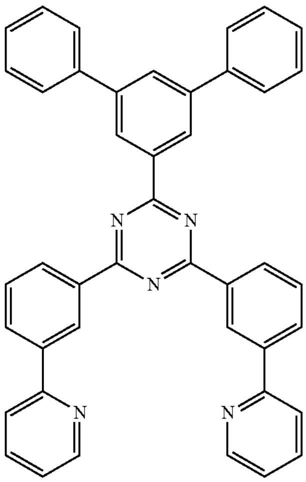

-continued
ET31
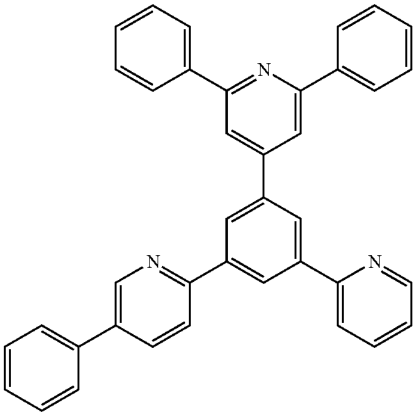
ET32
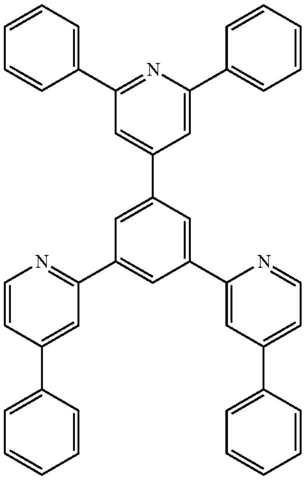
ET33
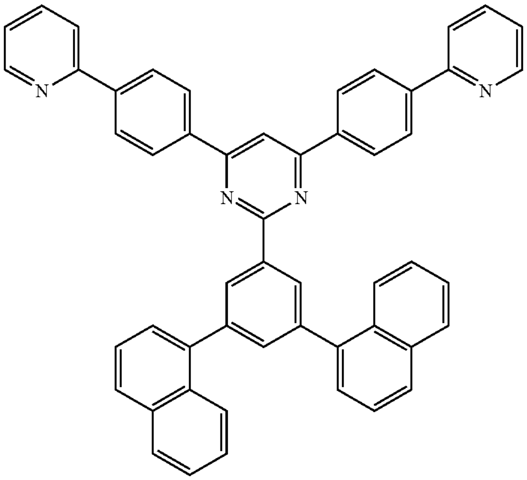
-continued
ET34
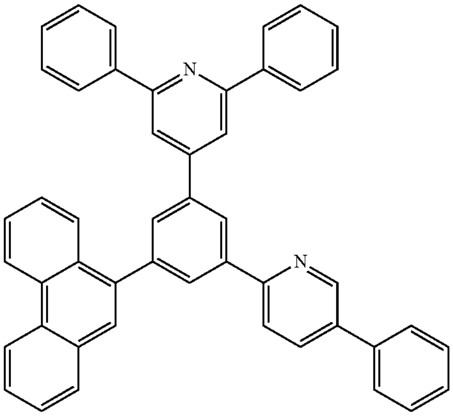
ET35
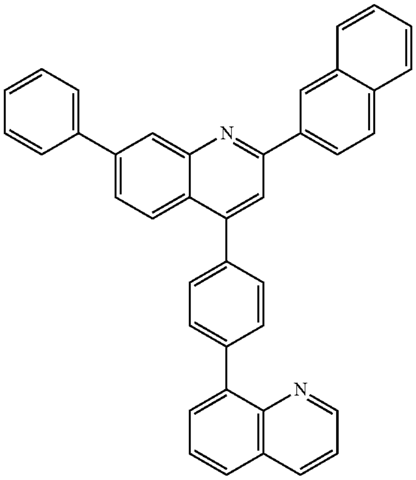
ET36
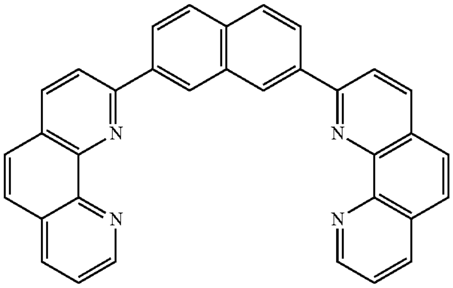
ET37
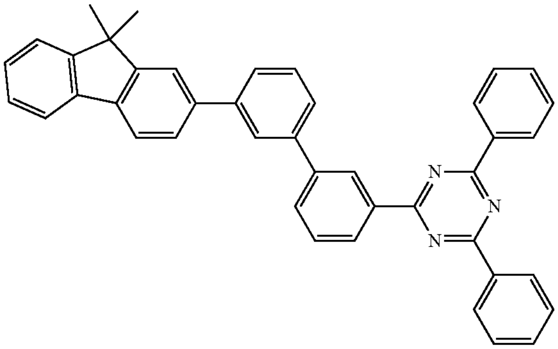

-continued
ET38
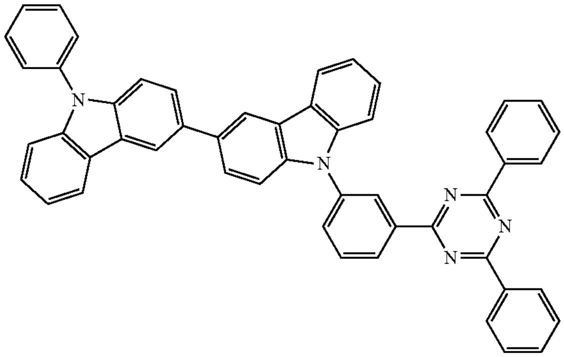
ET39
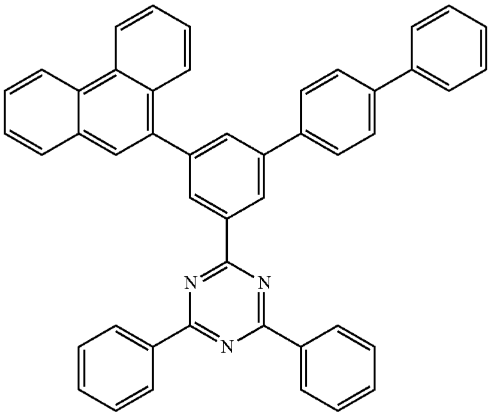
ET40
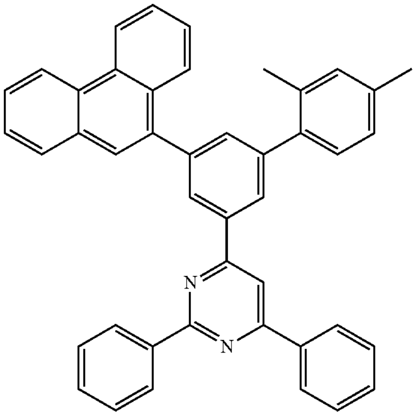
-continued
ET41
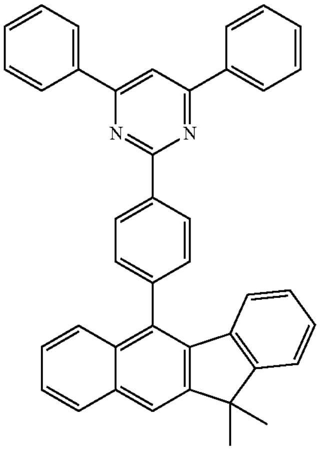
ET42
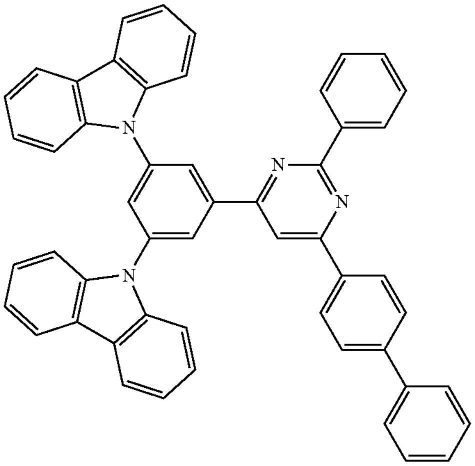
ET43
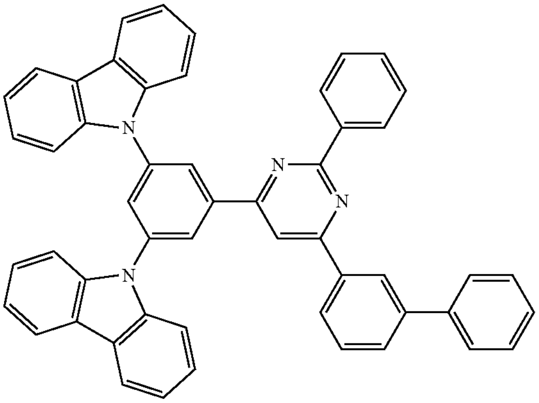

-continued

ET44

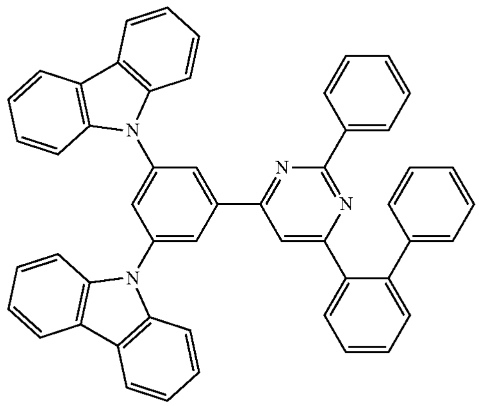

ET45

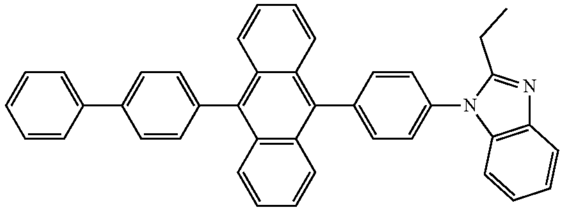

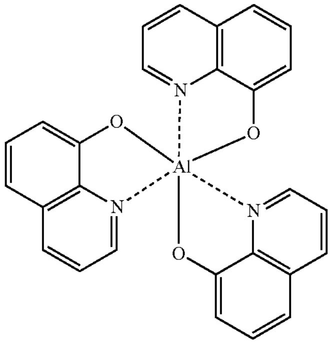

Alq3

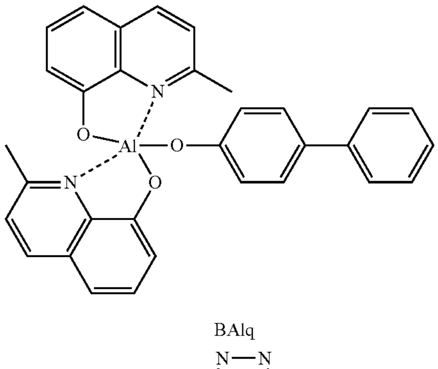

BAlq

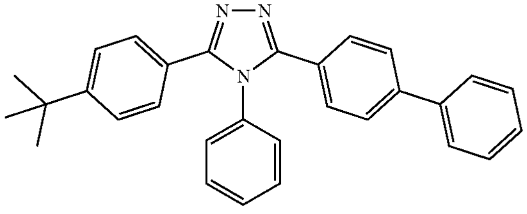

TAZ

-continued

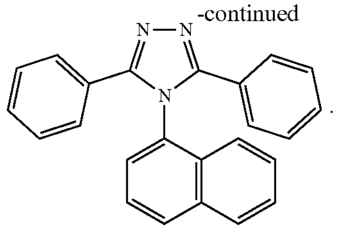

NTAZ

A thickness of the electron transport region may be in a range of about 160 Å to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be in a range of about 20 Å to about 1000 Å, and the thickness of the electron transport layer may be in a range of about 100 Å to about 1000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport layer are within these ranges, satisfactory hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

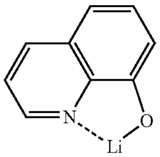

-continued

ET-D2

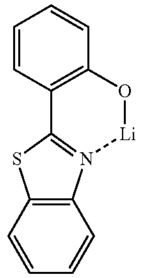

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of different materials, or iii) a multi-layered structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and halides (for example, fluorides, chlorides, bromides, or iodides) of the alkali metal, the alkaline earth metal, and the rare earth metal, telluride, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number that satisfies the condition of $0<x<1$), or $Ba_xCa_{1-x}O$ (x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. The light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be emitted toward the outside through the first electrode 110, which is a semi-transmissive electrode or a transmissive electrode, and the first capping layer, and light generated in an emission layer of the interlayer 130 of the light-emitting device 10 may be emitted toward the outside through the second electrode 150, which is a semi-transmissive electrode or a transmissive electrode, and the second capping layer.

The first capping layer and the second capping layer may increase external light emission efficiency according to the principle of constructive interference. Accordingly, the light emission efficiency of the light-emitting device 10 is increased, so that the light emission efficiency of the light-emitting device 10 may be improved.

The first capping layer and the second capping layer may each include a material having a refractive index of greater than or equal to about 1.6 (at 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

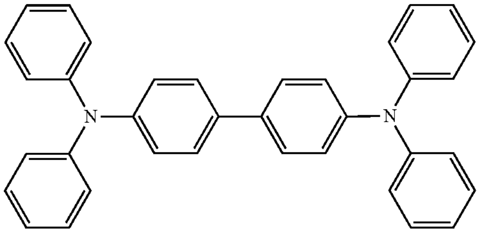

CP2

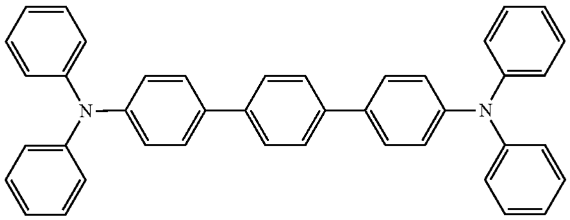

-continued

CP3

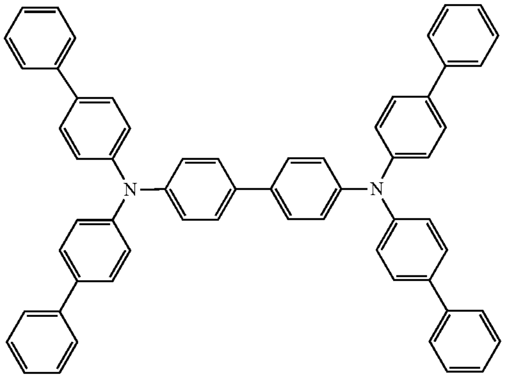

CP4

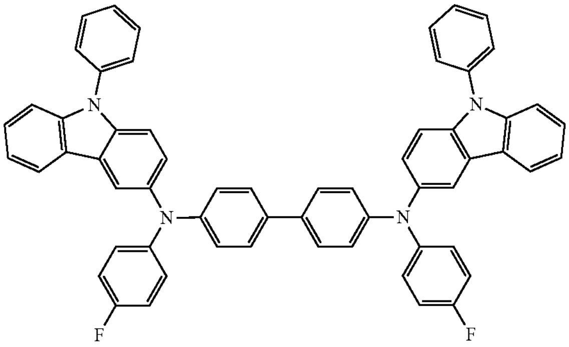

CP5

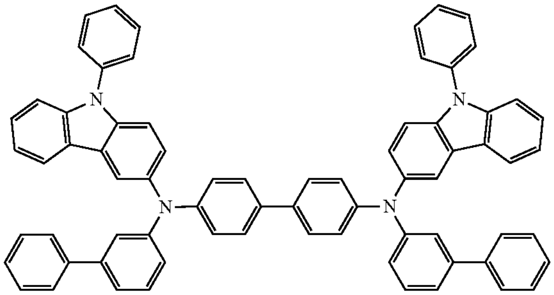

CP6

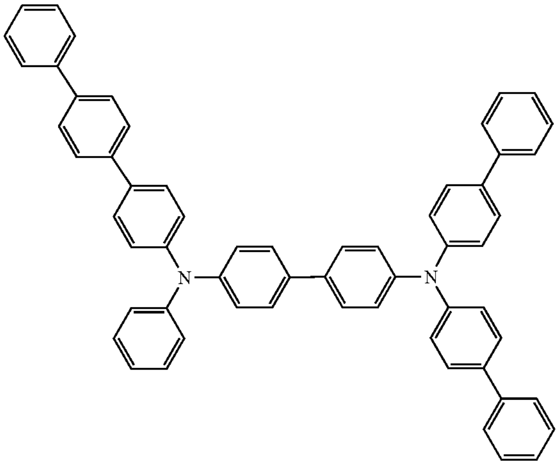

-continued

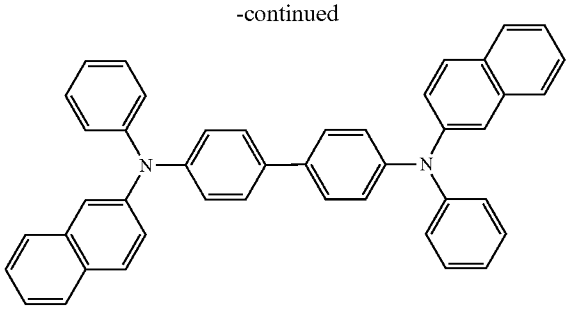

β-NPB

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate includes subpixels, the color filter includes color filter areas respectively corresponding to the subpixels, and the color conversion layer may include color conversion areas respectively corresponding to the subpixels.

A pixel-defining film may be located between subpixels to define each of the subpixels.

The color filter may further include the color filter areas and a light-blocking pattern located between adjacent color filter areas of the color filter areas, and the color conversion layer may further include the color conversion areas and a light-blocking pattern located between adjacent color conversion areas of the color conversion areas.

The color filter areas (or the color conversion areas) may include a first area emitting first-color light; a second area emitting second-color light; and/or a third area emitting third-color light, and the first-color light, the second-color light and/or the third-color light may have different maximum luminescence wavelengths. In an embodiment, the first color light may be red light, the second color light may be green light, and the third color light may be blue light. In an embodiment, the color filter areas (or the color conversion areas) may include quantum dots. The first area may include a red quantum dot, the second area may include a green quantum dot, and the third area may not include a quantum dot. The quantum dot is the same as described in the specification. Each of the first area, the second area, and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. The first light may be blue light, the first first-color light may be red light, the second first-color light may be green light, and the third first-color light may be blue light.

The electronic apparatus may further include a thin-film transistor in addition to the light-emitting device 1 as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing portion for sealing the light-emitting device. The sealing portion may be located between the color filter and/or the color conversion layer and the light-emitting device. The sealing portion allows light from the light-emitting device 10 to be emitted to the outside, while simultaneously preventing ambient air and moisture from penetrating into the light-emitting device 10. The sealing portion may be a sealing substrate including a transparent glass substrate or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or color conversion layer, various functional layers may be further located according to the use of the electronic device. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement apparatuses, pulse wave measurement apparatuses, electrocardiogram displays, ultrasonic diagnostic apparatuses, or endoscope displays), fish finders, various measuring instruments, meters (for example, meters for a vehicle, an aircraft, and a vessel), projectors, and the like.

Figure 2:
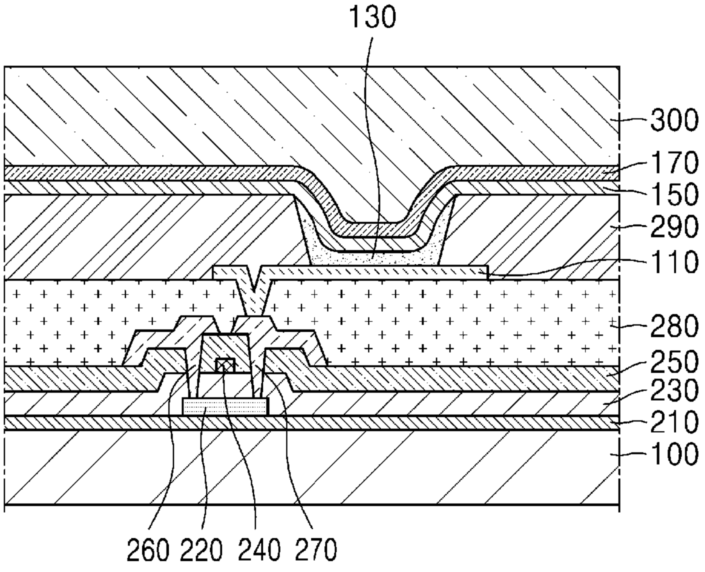
FIG. 2 is a schematic cross-sectional view of an embodiment of a light-emitting device.
Figure 3:
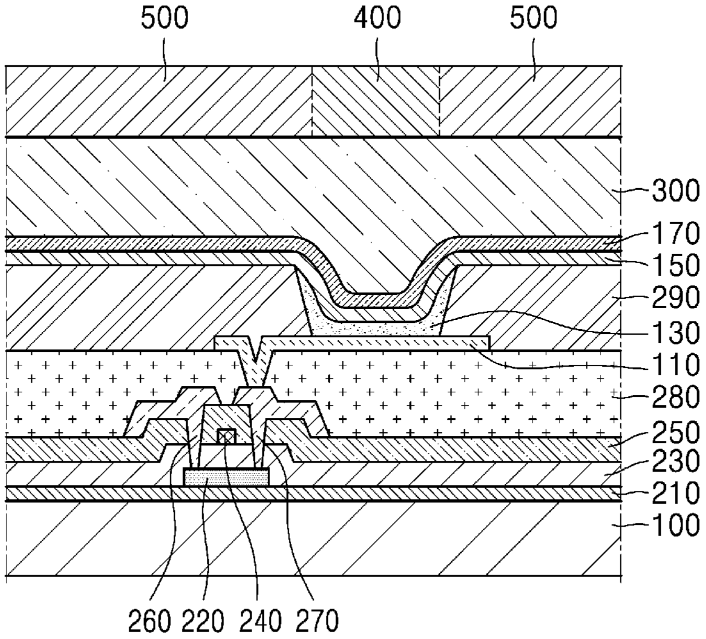
FIG. 3 is a schematic cross-sectional view of an embodiment of a light-emitting device.

[Description of FIGS. 2 and 3]

FIG. 2 is a schematic cross-sectional view showing a light-emitting apparatus according to an embodiment of the disclosure; and The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 prevents the penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be located to be in contact with the exposed portions of the source region and the drain region of the active layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. Although not shown in FIG. 2, at least some layers of the interlayer 130 may extend beyond the upper portion of the pixel defining layer 290 and may thus be in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

FIG. 3 is a schematic cross-sectional view showing a light-emitting apparatus according to an embodiment of the disclosure.

The light-emitting apparatus of FIG. 3 is the same as the light-emitting apparatus of FIG. 2, except that a light-blocking pattern 500 and a functional region 400 are additionally located on the encapsulation portion 300. The functional region 400 may be a color filter area, a color conversion area, or a combination of the color filter area and the color conversion area. In an embodiment, the light-emitting device included in the light-emitting apparatus of FIG. 3 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

[Definition of Terms]

The term "$C_3$-$C_{60}$ carbocyclic group" as used herein refers to a cyclic group that consists of carbon only and has three to sixty carbon atoms, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understand by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cycloctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom are O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device according to embodiments will be described with reference to Synthesis Examples and Examples. The wording "B was used instead of A" used in describing Synthesis Examples refers to that an identical molar equivalent of B was used in place of A.

EXAMPLES

1. First Embodiment

Example 1-1

As an anode, a Corning 15 Ω/cm$^2$ (1,200 Å) ITO glass substrate was cut to a size of 50 mm×50 mm×0.7 mm, sonicated with isopropyl alcohol and pure water each for 5 minutes, and cleaned by exposure to ultraviolet rays and ozone for 30 minutes. The ITO glass substrate was provided to a vacuum deposition apparatus.

HATCN was vacuum-deposited on the ITO anode formed on the glass substrate to form a hole injection layer having a thickness of 50 Å, and 4,4'-bis[N-(1-naphthyl)-N-phenylamino]biphenyl (NPB) was vacuum deposited on the hole injection layer to form a hole transport layer having a thickness of 600 Å.

TCTA was vacuum deposited on the hole transport layer to form an emission auxiliary layer having a thickness of 50 Å.

Host 1 and Dopant 1 were co-deposited at the weight ratio of 97:3 on the emission auxiliary layer to form a first emission layer having a thickness of 50 Å, and Host 2-1 and Dopant 2 were co-deposited at the weight ratio of 99:1 on the first emission layer to form a second emission layer having a thickness of 150 Å.

Then, T2T was deposited on the second emission layer to form a hole blocking layer having a thickness of 50 Å, and TPM-TAZ and Liq were co-deposited at the weight ratio of 5:5 on the hole blocking layer to form an electron transport layer having a thickness of 300 Å, and Yb was deposited on the electron transport layer to form an electron injection layer having a thickness of 10 Å thickness.

Ag and Mg were co-deposited at the weight ratio of 1:9 on the electron injection layer to form an electron having a thickness of 100 Å, and CPL was deposited on the electrode to form a capping layer having a thickness of 700 Å, thereby completing the manufacture of the light-emitting device.

Examples 1-2 to 1-4

Light-emitting devices were manufactured in the same manner as in the Example 1-1, except that the compounds listed in Table 1 below were deposited at the doping concentrations and layer thicknesses listed in Table 1, in forming the first emission layer and the second emission layer.

Comparative Example 1

A light-emitting device was manufactured in the same manner as in Example 1-1, except that Host 1 and Dopant 1 were co-deposited at a weight ratio of 97:3 to form an emission layer having a thickness of 200 Å, instead of forming the first emission layer and the second emission layer.

Comparative Example 2

A light-emitting device was manufactured in the same manner as in Comparative Example 1, except that, in forming an emission layer, Host 1 and Dopant 2 were co-deposited at the weight ratio of 99:1 to form an emission layer having a thickness of 200 Å.

2. Second Embodiment

Example 2-1

Formation of First Light-Emitting Unit

As an anode, a Corning 15 $\Omega/cm^2$ (1,200 Å) ITO glass substrate was cut to a size of 50 mm×50 mm×0.7 mm, sonicated with isopropyl alcohol and pure water each for 5 minutes, and cleaned by exposure to ultraviolet rays and ozone for 30 minutes. The ITO glass substrate was provided to a vacuum deposition apparatus.

HATCN was vacuum-deposited on the ITO anode formed on the ITO glass substrate to form a hole injection layer having a thickness of 50 Å, and NPB was vacuum-deposited on the hole injection layer to form a hole transport layer having a thickness of 600 Å.

TCTA was vacuum deposited on the hole transport layer to form an emission auxiliary layer having a thickness of 50 Å.

Host 1 and Dopant 1 were co-deposited at the weight ratio of 97:3 on the emission auxiliary layer to form a first emission layer having a thickness of 50 Å, and Host 2-1 and Dopant 2 were co-deposited at the weight ratio of 98:2 on the first emission layer to form a second emission layer having a thickness of 150 Å.

Then, T2T was deposited on the second emission layer to form a hole blocking layer having a thickness of 50 Å, and TPM-TAZ and Liq were co-deposited at the weight ratio of 5:5 on the hole blocking layer to form an electron transport layer having a thickness of 300 Å.

CBP and Li were co-deposited at the weight ratio of 5:5 on the electron transport layer to form a charge generation layer having a thickness of 350 Å, thereby completing the manufacture of a first light-emitting unit.

Formation of Second Light-Emitting Unit

HATCN was vacuum-deposited on the first light-emitting unit to form a hole injection layer having a thickness of 50 Å, and NPB was vacuum-deposited on the hole injection layer to form a hole transport layer having a thickness of 600 Å.

TCTA was vacuum deposited on the hole transport layer to form an emission auxiliary layer having a thickness of 50 Å.

Host 1 and Dopant 1 were co-deposited at the weight ratio of 97:3 on the emission auxiliary layer to form a first emission layer having a thickness of 50 Å, and Host 2-1 and Dopant 2 were co-deposited at the weight ratio of 98:2 on the first emission layer to form a second emission layer having a thickness of 150 Å.

Then, T2T was deposited on the second emission layer to form a hole blocking layer having a thickness of 50 Å, and TPM-TAZ and Liq were co-deposited at the weight ratio of 5:5 on the hole blocking layer to form an electron transport layer having a thickness of 300 Å.

CBP and Li were co-deposited at the weight ratio of 5:5 on the electron transport layer to form a charge generation layer having a thickness of 350 Å, thereby completing the manufacture of a second light-emitting unit.

Formation of Third Light-Emitting Unit

HATCN was vacuum-deposited on the second light-emitting unit to form a hole injection layer having a thickness of 50 Å, and NPB was vacuum-deposited on the hole injection layer to form a hole transport layer having a thickness of 600 Å.

TCTA was vacuum deposited on the hole transport layer to form an emission auxiliary layer having a thickness of 50 Å.

Host 1 and Dopant 1 were co-deposited at the weight ratio of 97:3 on the emission auxiliary layer to form a first emission layer having a thickness of 50 Å, and Host 2-1 and Dopant 2 were co-deposited at the weight ratio of 98:2 on the first emission layer to form a second emission layer having a thickness of 150 Å.

Then, T2T was deposited on the second emission layer to form a hole blocking layer having a thickness of 50 Å, and TPM-TAZ and Liq were co-deposited at the weight ratio of 5:5 on the hole blocking layer to form an electron transport layer having a thickness of 300 Å.

Then, Yb was deposited on the electron transport layer to form an electron injection layer having a thickness of 10 Å.

Ag and Mg were co-deposited at the weight ratio of 1:9 on the electron injection layer to form an electron having a thickness of 100 Å, and CPL was deposited on the electrode to form a capping layer having a thickness of 700 Å, thereby completing the manufacture of a third light-emitting unit.

Example 2-2

A light-emitting device was manufactured in the same manner as used to prepare Example 2-1, except that, in forming an emission layer in each of the first through third light-emitting units, Host 1 and Dopant 2 were used at the weight ratio of 98:2 to form a first emission layer having a thickness of 70 Å, and Host 2-1 and Dopant 1 were used at the weight ratio of 97:3 to form a second emission layer having a thickness of 150 Å.

3. Third Embodiment

Example 3-1

Formation of First Light-Emitting Unit

A first light-emitting unit was manufactured in the same manner as in Example 2-1.

Formation of Second Light-Emitting Unit

A second light-emitting unit was manufactured in the same manner as used in Example 2-1.

Formation of Third Light-Emitting Unit

HATCN was vacuum-deposited on the second light-emitting unit to form a hole injection layer having a thickness of 50 Å, and NPB was vacuum-deposited on the hole injection layer to form a hole transport layer having a thickness of 600 Å.

TCTA was vacuum deposited on the hole transport layer to form an emission auxiliary layer having a thickness of 50 Å.

Host 1 and Dopant 1 were co-deposited at the weight ratio of 97:3 on the emission auxiliary layer to form a first emission layer having a thickness of 100 Å, and Host 2-1 and Dopant 2 were co-deposited at the weight ratio of 99:1 on the first emission layer to form a second emission layer having a thickness of 100 Å.

Then, T2T was deposited on the second emission layer to form a hole blocking layer having a thickness of 50 Å, and TPM-TAZ and Liq were co-deposited at the weight ratio of 5:5 on the hole blocking layer to form an electron transport layer having a thickness of 300 Å.

CBP and Li were co-deposited at the weight ratio of 1:1 on the electron transport layer to form a charge generation layer having a thickness of 350 Å, thereby completing the manufacture of a third light-emitting unit.

Formation of Fourth Light-Emitting Unit

HATCN was vacuum-deposited on the third light-emitting unit to form a hole injection layer having a thickness of 50 Å, and NPB was vacuum-deposited on the hole injection layer to form a hole transport layer having a thickness of 600 Å.

TCTA was vacuum deposited on the hole transport layer to form an emission auxiliary layer having a thickness of 50 Å.

TPBI and $Irppy_3$ were co-deposited at the weight ratio of 95:5 on the emission auxiliary layer to form an emission layer having a thickness of 250 Å.

Then, TPM-TAZ and Liq were co-deposited at the weight ratio of 5:5 on the emission layer to form an electron transport layer having a thickness of 300 Å.

Then, Yb was deposited on the electron transport layer to form an electron injection layer having a thickness of 10 Å.

Ag and Mg were co-deposited at the weight ratio of 1:9 on the electron injection layer to form an electron having a thickness of 100 Å, and CPL was deposited on the electrode to form a capping layer having a thickness of 700 Å, thereby completing the manufacture of a fourth light-emitting unit.

Example 3-2

A light-emitting device was manufactured in the same manner as used to prepare Example 3-1, except that, in forming an emission layer in each of the first emission unit through the third emission unit, Host 1 and Dopant 2 were used at the weight ratio of 98:2 to form a first emission layer having a thickness of 50 Å, and Host 2-1 and Dopant were used at the weight ratio of 98:2 to form a second emission layer having a thickness of 130 Å.

TABLE 1

| | Emission layer | | | | | | | |
|---|---|---|---|---|---|---|---|---|
| | First emission layer | | | | Second emission layer | | | |
| | Host | Dopant | Doping concentration (weight ratio) | layer thickness (Å) | Host | Dopant | Doping concentration (weight ratio) | layer thickness (Å) |
| Example 1-1 | Host 1 | Dopant 1 | 97:3 | 50 | Host 2-1 | Dopant 2 | 99:1 | 150 |
| Example 1-2 | Host 1 | Dopant 2 | 99:1 | 70 | Host 2-1 | Dopant 1 | 97:3 | 130 |
| Example 1-3 | Host 1 | Dopant 1 | 97:3 | 100 | Host 2-2 | Dopant 2 | 99:1 | 100 |
| Example 1-4 | Host 1 | Dopant 2 | 98:2 | 50 | Host 2-2 | Dopant 1 | 97:3 | 150 |
| Example 2-1 | Host 1 | Dopant 1 | 97:3 | 50 | Host 2-1 | Dopant 2 | 98:2 | 150 |
| Example 2-2 | Host 1 | Dopant 2 | 98:2 | 70 | Host 2-1 | Dopant 1 | 97:3 | 150 |
| Example 3-1 | Host 1 | Dopant 1 | 97:3 | 100 | Host 2-1 | Dopant 2 | 99:1 | 100 |
| Example 3-2 | Host 1 | Dopant 2 | 98:2 | 50 | Host 2-1 | Dopant 1 | 98:2 | 130 |
| Comparative Example 1 | Host 1 | Dopant 1 | 97:3 | 200 | — | — | — | — |
| Comparative Example 2 | Host 1 | Dopant 2 | 99:1 | 200 | — | — | — | — |

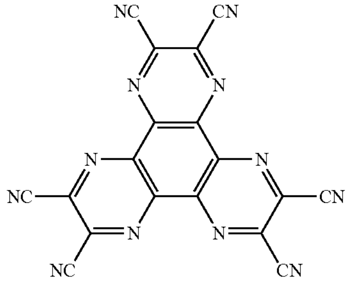

HATCN

-continued
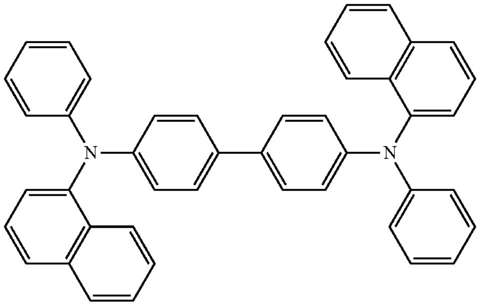
NPB
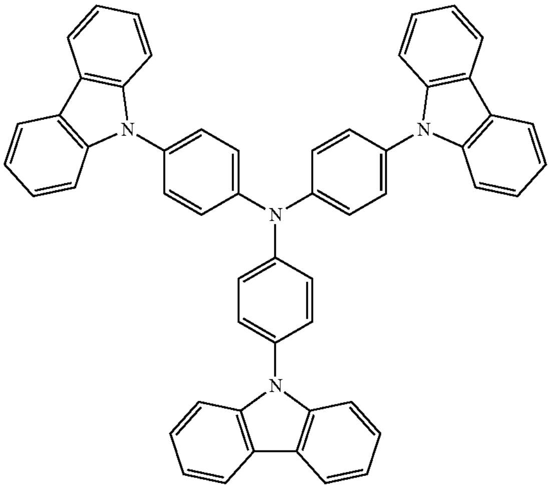
TCTA
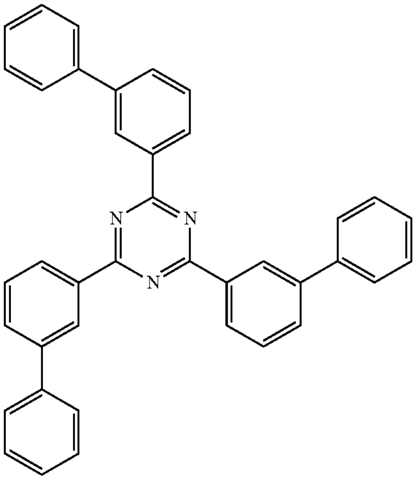
T2T
-continued
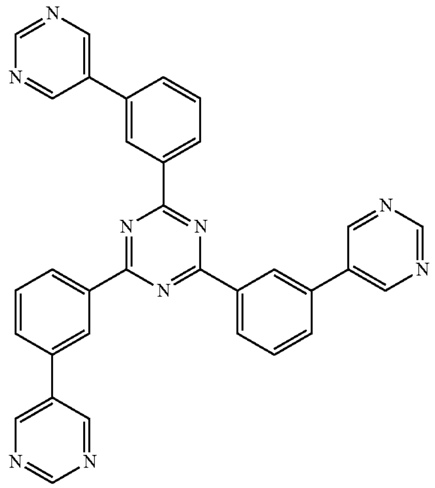
TPM-TAZ
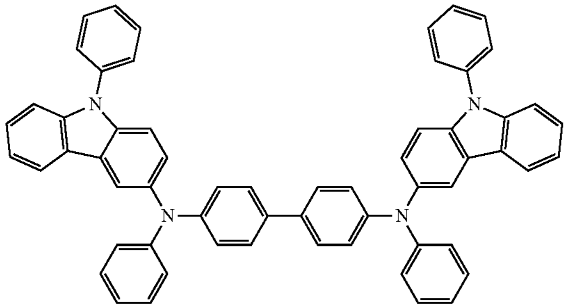
CPL
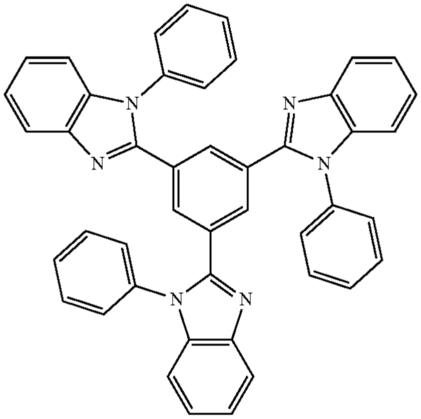
TPBI
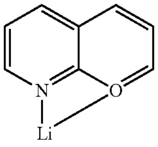
Liq
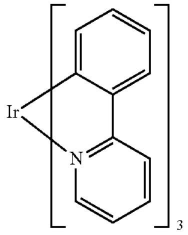
Irppy3

-continued

Host 1

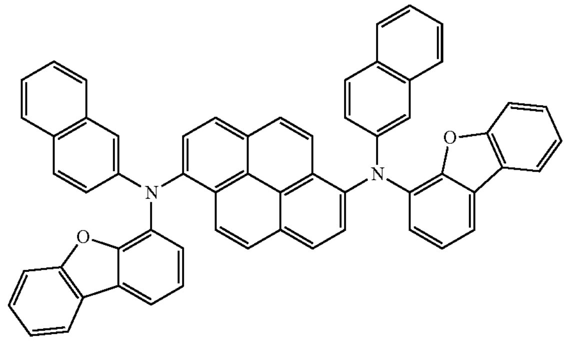

Host 2-1

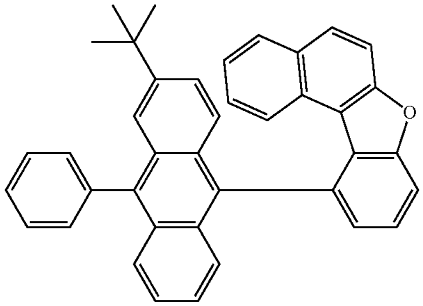

Host 2-2

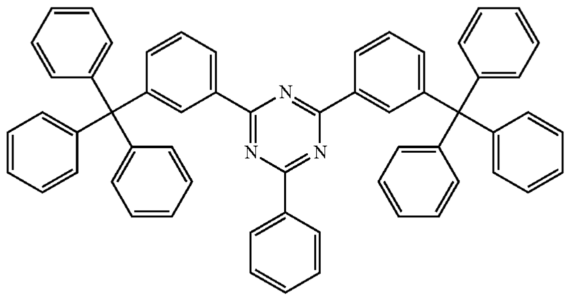

Dopant 1

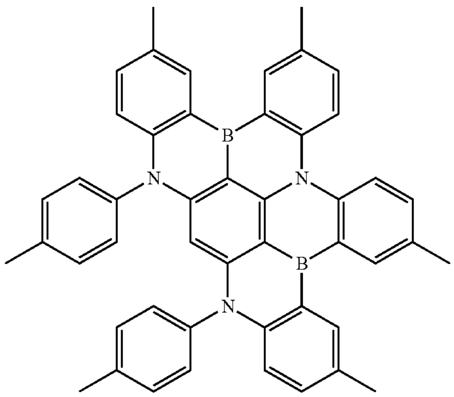

-continued

Dopant 2

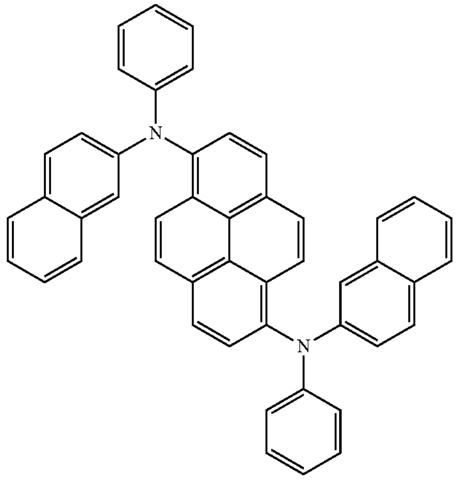

In this regard, Dopant 1 has LUMO, S1, T1 and $\Delta E_{ST}$ values as listed on Table 2 below:

TABLE 2

| | S1(onset) | LUMO(DPV) | T1(onset) | $\Delta E_{ST}$(eV) |
|---|---|---|---|---|
| Dopant 1 | 2.8 | −2.8 | 2.65 | 0.15 |

4. Evaluation Example

Characteristics of the light-emitting devices manufactured according to Examples 1-1 to 1-4, 2-1, 2-2, 3-1 and 3-2 and Comparative Examples 1 and 2 were evaluated with reference to the driving voltage at the current density of 10 mA/cm$^2$ and the light emission efficiency. The driving voltage of a light-emitting device were measured using a source meter (Keithley Instrument Inc., 2400 series), and the lifetime ($T_{97}$) is based on 100% of the initial luminance, and is an evaluation of the time it takes to achieve a luminance of 97%. The evaluation results of the characteristics of the light-emitting devices are shown in Table 3 below.

TABLE 3

| | Emission layer | | | | | |
|---|---|---|---|---|---|---|
| | First emission layer | Second emission layer | Driving voltage (V) | Efficiency (Cd/A/y) | Life-span ($T_{97}$) | Luminance (nit) |
| Example 1-1 | Host 1 + Dopant 1 | Host 2-1 + Dopant 2 | 115% | 130% | 130% | 1500 |
| Example 1-2 | Host1 + Dopant 2 | Host 2-1 + Dopant 1 | 115% | 155% | 100% | 1500 |
| Example 1-3 | Host 1 + Dopant 1 | Host 2-2 + Dopant 2 | 100% | 125% | 120% | 1500 |
| Example 1-4 | Host 1 + Dopant 2 | Host 2-2 + Dopant 1 | 100% | 145% | 95% | 1500 |
| Example 2-1 | Host 1 + Dopant 1 | Host 2-1 + Dopant 2 | 112% | 140% | 140% | 1500 |
| Example 2-2 | Host 1+ Dopant 2 | Host 2-1 + Dopant 1 | 115% | 170% | 110% | 1500 |

TABLE 3-continued

| | Emission layer | | | | | |
|---|---|---|---|---|---|---|
| | First emission layer | Second emission layer | Driving voltage (V) | Efficiency (Cd/A/y) | Life-span ($T_{97}$) | Luminance (nit) |
| Example 3-1 | Host 1 + Dopant 1 | Host 2-1 + Dopant 2 | 115% | 145% | 135% | 1500 |
| Example 3-2 | Host 1 + Dopant 2 | Host 2-1 + Dopant 1 | 110% | 165% | 105% | 1500 |
| Comparative Example 1 | Host 1 + Dopant 1 | | 110% | 140% | 80% | 1500 |
| Comparative Example 2 | Host 1 + Dopant 2 | | 100% | 100% | 100% | 1500 |

Referring to Table 3, it was confirmed that the light-emitting devices of Examples 1-1 to 1-4, 2-1, 2-2, 3-1, and 3-2 had better light emission efficiency and/or longer lifespan than the light-emitting devices of Comparative Examples 1 and 2.

It should be understood that embodiments described herein should be considered in a descriptive sense only and not for purposes of limitation. Descriptions of features or aspects within each embodiment should be typically considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode facing the first electrode; and an interlayer disposed between the first electrode and the second electrode, wherein the interlayer includes a first emission layer, and a second emission layer disposed between the first emission layer and the second electrode, the first emission layer directly contacts the second emission layer, the first emission layer includes a first compound and a second compound, the second emission layer includes a third compound and a fourth compound, the first compound and the second compound are different from each other, the third compound and the fourth compound are different from each other, each of the first compound and the third compound emits light having a maximum luminescence wavelength in a range of about 400 nm to about 600 nm, the fourth compound includes at least one selected from an electron transport compound and a bipolar compound, wherein the electron transport compound contains at least one electron withdrawing group, the bipolar compound includes:

(i) at least one electron withdrawing group and at least one electron donating group, (ii) an anthracene group and a furan group, or (iii) at least one electron withdrawing group, at least one electron donating group, an anthracene group, and a furan group, and the first compound includes a first fluorescent compound, and the third compound includes a second fluorescent compound satisfying Equation 1, or the first compound includes the second fluorescent compound satisfying Equation 1, and the third compound includes the first fluorescent compound:

$$\Delta E_{ST}=S1-T1\leq 0.5\text{ eV} \quad \text{[Equation 1]}$$

wherein in Equation 1,

S1 is the lowest excitation singlet energy level (eV) of the second fluorescent compound, and T1 is the lowest excitation triplet energy level (eV) of the second fluorescent compound.

2. The light-emitting device of claim 1, wherein the first electrode is an anode, the second electrode is a cathode, and the interlayer further includes:

a hole transport region disposed between the first electrode and the first emission layer; and an electron transport region disposed between the second emission layer and the second electrode.

3. The light-emitting device of claim 2, wherein the hole transport region includes a hole injection layer, a hole transport layer, an emission auxiliary layer, an electron blocking layer, or a combination thereof, and the electron transport region includes a hole blocking layer, an electron transport layer, an electron injection layer, or a combination thereof.

4. The light-emitting device of claim 1, wherein the second compound includes a hole transport compound.

5. The light-emitting device of claim 1, wherein the second compound and the third compound are different from each other, or the first compound and the fourth compound are different from each other.

6. The light-emitting device of claim 4, wherein the hole transport compound includes at least one electron donating group.

7. The light-emitting device of claim 6, wherein the electron withdrawing group is selected from:

—F, —$CFH_2$, —$CF_2H$, —$CF_3$, —CN, and —$NO_2$;

a $C_1$-$C_{60}$ alkyl group substituted with at least one selected from —F, —$CFH_2$, —$CF_2H$, —$CF_3$, —CN, and —$NO_2$; and a π electron deficient nitrogen-containing $C_1$-$C_{60}$ cyclic group, unsubstituted or substituted with at least one $R_{10a}$, and the electron donating group is selected from a π electron-rich $C_3$-$C_{60}$ cyclic group unsubstituted or substituted with at least one $R_{10a}$, and —$N(Q_1)(Q_2)$, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$) ($Q_{22}$) ($Q_{23}$), —N($Q_{21}$) ($Q_{22}$), —B($Q_{21}$) ($Q_{22}$), —C(═O)($Q_{21}$), —S(═O)$_2$($Q_{21}$), —P(═O) ($Q_{21}$) ($Q_{22}$), or a combination thereof; or —Si($Q_{31}$) ($Q_{32}$) ($Q_{33}$), —N($Q_{31}$) ($Q_{32}$), —B($Q_{31}$) ($Q_{32}$), —C(═O)($Q_{31}$), —S(═O)$_2$($Q_{31}$), or —P(═O)($Q_{31}$) ($Q_{32}$), wherein $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

8. The light-emitting device of claim 1, wherein the second compound comprises at least one compound represented by Formula 1:

[Formula 1]

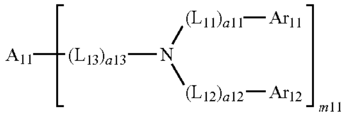

wherein in Formula 1, $A_{11}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{11}$ to $L_{13}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a11 to a13 are each independently an integer from 1 to 3, $Ar_{11}$ and $Ar_{12}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$) ($Q_2$) ($Q_3$), —N($Q_1$) ($Q_2$), —B($Q_1$) ($Q_2$), —C(═O)($Q_1$), —S(═O)$_2$($Q_1$), or —P(═O)($Q_1$) ($Q_2$), m11 is an integer from 1 to 8, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si ($Q_{11}$) ($Q_{12}$) ($Q_{13}$), —N($Q_{11}$) ($Q_{12}$), —B($Q_{11}$) ($Q_{12}$), —C(═O)($Q_{11}$), —S(═O)$_2$($Q_{11}$), —P(═O)($Q_{11}$) ($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$) ($Q_{22}$) ($Q_{23}$), —N($Q_{21}$) ($Q_{22}$), —B($Q_{21}$) ($Q_{22}$), —C(═O)($Q_{21}$), —S(═O)$_2$($Q_{21}$), —P(═O) ($Q_{21}$) ($Q_{22}$), or a combination thereof; or —Si($Q_{31}$) ($Q_{32}$) ($Q_{33}$), —N($Q_{31}$) ($Q_{32}$), —B($Q_{31}$) ($Q_{32}$), —C(═O)($Q_{31}$), —S(═O)$_2$($Q_{31}$), or —P(═O)($Q_{31}$) ($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

9. The light-emitting device of claim 1, wherein the fourth compound comprises a compound represented by Formula 2:

[Formula 2]

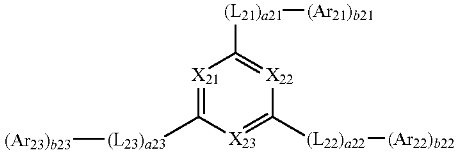

wherein in Formula 2, $X_{21}$ is N or C($R_{21}$), $X_{22}$ is N or C($R_{22}$), $X_{23}$ is N or C($R_{23}$), at least one of $X_{21}$ to $X_{23}$ is N, $L_{21}$ to $L_{23}$ are each independently selected from a single bond, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, a21 to a23 are each independently an integer from 1 to 3, $Ar_{21}$ to $Ar_{23}$ and $R_{21}$ to $R_{23}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$) ($Q_2$) ($Q_3$), —N($Q_1$) ($Q_2$), —B($Q_1$) ($Q_2$), —C(═O)($Q_1$), —S(═O)$_2$($Q_1$), or —P(═O)($Q_1$) ($Q_2$), b21 to b23 are each independently an integer from 1 to 10, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si ($Q_{11}$) ($Q_{12}$) ($Q_{13}$), —N($Q_{11}$) ($Q_{12}$), —B($Q_{11}$) ($Q_{12}$), —C(═O)($Q_{11}$), —S(═O)$_2$($Q_{11}$), —P(═O)($Q_{11}$) ($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$) ($Q_{22}$) ($Q_{23}$), —N($Q_{21}$) ($Q_{22}$), —B($Q_{21}$) ($Q_{22}$), —C(═O)($Q_{21}$), —S(═O)$_2$($Q_{21}$), —P(═O) ($Q_{21}$) ($Q_{22}$), or a combination thereof; or —Si($Q_{31}$) ($Q_{32}$) ($Q_{33}$), —N($Q_{31}$) ($Q_{32}$), —B($Q_{31}$) ($Q_{32}$), —C(═O)($Q_{31}$), —S(═O)$_2$($Q_{31}$), or —P(═O)($Q_{31}$) ($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

10. The light-emitting device of claim 1, wherein the fourth compound comprises a compound represented by Formula 3:

[Formula 3]

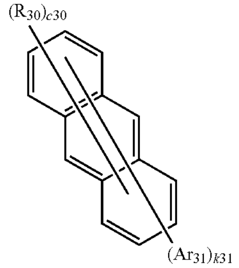

A

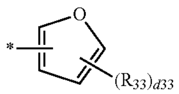

B

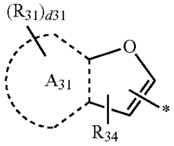

-continued

C

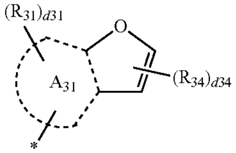

D

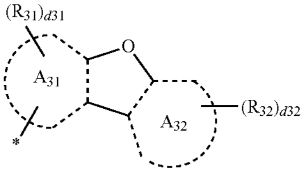

wherein in Formula 3, $Ar_{31}$ is represented by one of Formulae A to D, and k31 is an integer from 0 to 10, wherein in Formulae 3 and A to D, $A_{31}$ and $A_{32}$ are each independently selected from a $C_3$-$C_{30}$ carbocyclic group and a $C_1$-$C_{30}$ heterocyclic group, $R_{30}$ to $R_{34}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$) ($Q_2$) ($Q_3$), —N($Q_1$) ($Q_2$), —B($Q_1$) ($Q_2$), —C(═O)($Q_1$), —S(═O)$_2$($Q_1$), or —P(═O)($Q_1$) ($Q_2$), c30 is an integer from 1 to 10, d31 is an integer from 1 to 10, d32 is an integer from 1 to 10, d33 is an integer from 1 to 3, d34 is 1 or 2, the sum of k31 and c30 is 10, indicates a binding site to a neighboring atom, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si ($Q_{11}$) ($Q_{12}$) ($Q_{13}$), —N($Q_{11}$) ($Q_{12}$), —B($Q_{11}$) ($Q_{12}$), —C(═O)($Q_{11}$), —S(═O)$_2$($Q_{11}$), —P(═O)($Q_{11}$) ($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$) ($Q_{22}$) ($Q_{23}$), —N($Q_{21}$) ($Q_{22}$), —B($Q_{21}$) ($Q_{22}$), —C(═O)($Q_{21}$), —S(═O)$_2$($Q_{21}$), —P(═O) ($Q_{21}$) ($Q_{22}$), or a combination thereof; or —Si($Q_{31}$) ($Q_{32}$) ($Q_{33}$), —N($Q_{31}$) ($Q_{32}$), —B($Q_{31}$) ($Q_{32}$), —C(═O)($Q_{31}$), —S(═O)$_2$($Q_{31}$), or —P(═O)($Q_{31}$) ($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

11. The light-emitting device of claim 1, wherein the second fluorescent compound does not contain a carbazole group.

12. The light-emitting device of claim 1, wherein the second fluorescent compound is selected from Compounds 4-1 to 4-12:

4-1

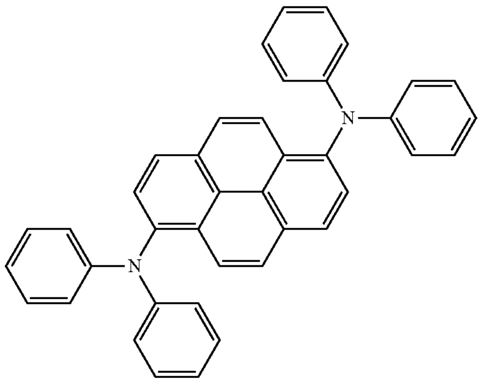

4-2

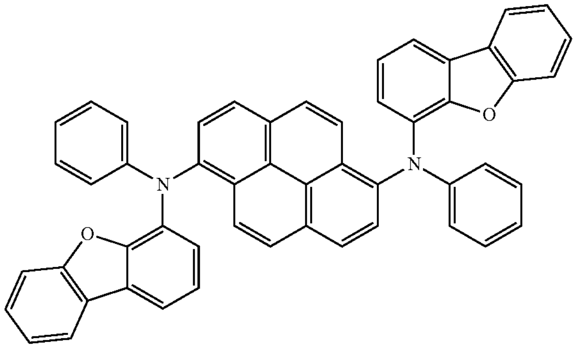

4-3

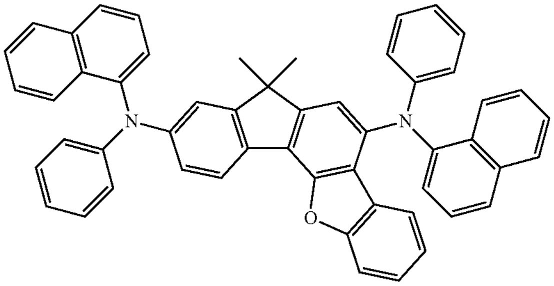

-continued 4-4

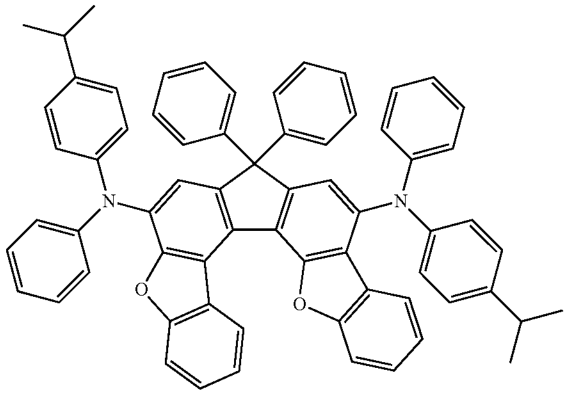

4-5

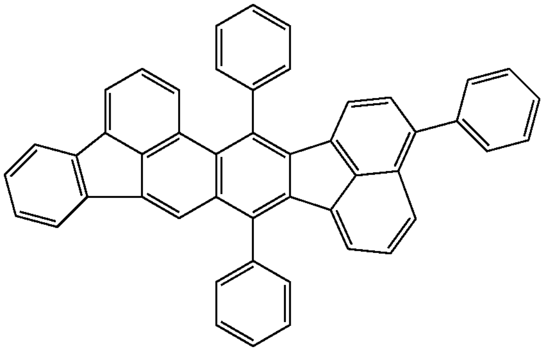

4-6

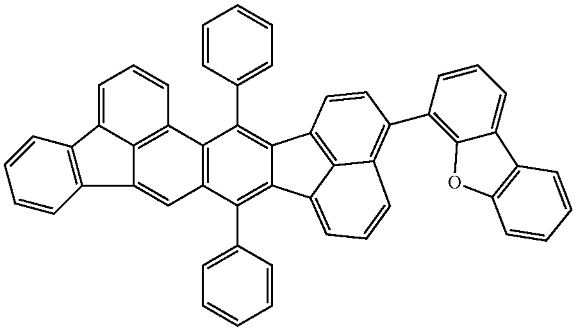

4-7

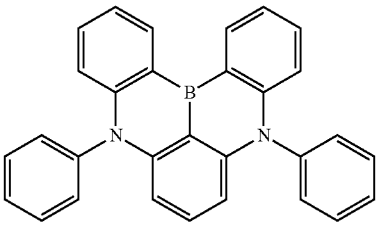

-continued 4-8

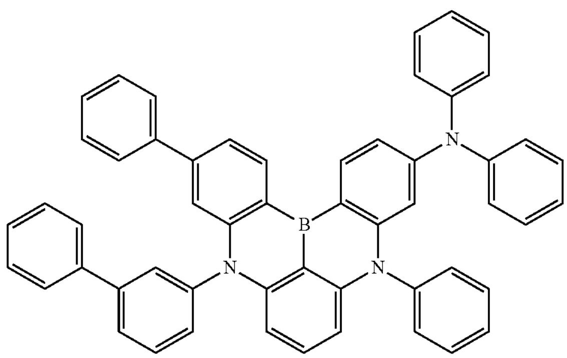

4-9

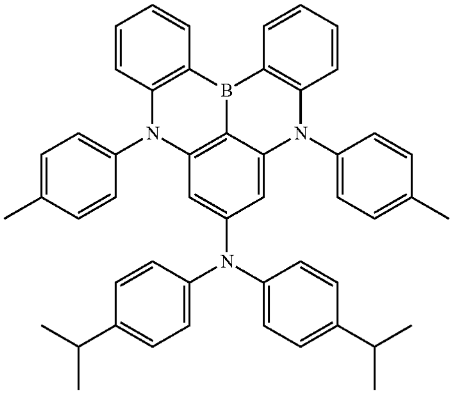

4-10

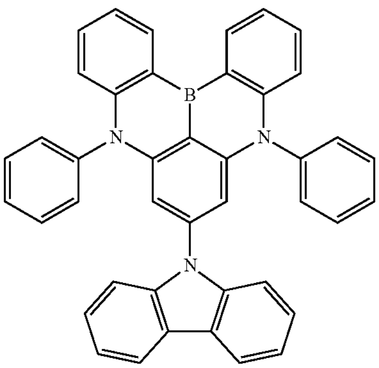

4-11

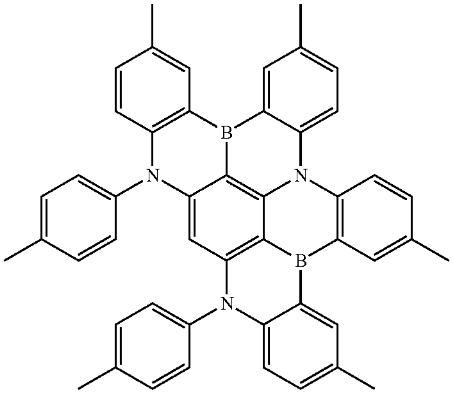

-continued 4-12

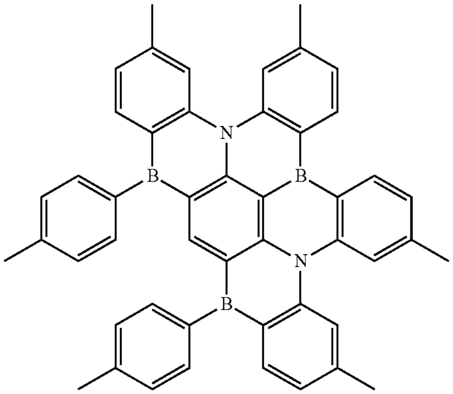

.

13. A light-emitting device comprising:

a first electrode;

a second electrode facing the first electrode;

m light-emitting units stacked between the first electrode and the second electrode and including emission layers; and m−1 charge generation layers disposed between two neighboring light-emitting units from among the m light-emitting units, wherein m is an integer of 2 or more, the emission layers include a first emission layer, and a second emission layer disposed between the first emission layer and the second electrode, the first emission layer directly contacts the second emission layer, the first emission layer includes a first compound and a second compound, the second emission layer includes a third compound and a fourth compound, the first compound and the second compound are different from each other, the third compound and the fourth compound are different from each other, each of the first compound and the third compound emits light having a maximum luminescence wavelength in a range of about 400 nm to about 600 nm, the fourth compound includes at least one selected from an electron transport compound and a bipolar compound, wherein the electron transport compound contains at least one electron withdrawing group, the bipolar compound includes:

(i) at least one electron withdrawing group and at least one electron donating group, (ii) an anthracene group and a furan group, or (iii) at least one electron withdrawing group, at least one electron donating group, an anthracene group, and a furan group, and the first compound includes a first fluorescent compound, and the third compound includes a second fluorescent compound satisfying Equation 1, or the first compound includes the second fluorescent compound satisfying Equation 1, and the third compound includes the first fluorescent compound:

$$\Delta E_{ST} = S1 - T1 \leq 0.5 \text{ eV} \quad \text{[Equation 1]}$$

wherein in Equation 1,

S1 is the lowest excitation singlet energy level (eV) of the second fluorescent compound, and T1 is the lowest excitation triplet energy level (eV) of the second fluorescent compound.

14. The light-emitting device of claim 13, wherein the maximum luminescence wavelength of light emitted from at least one light-emitting unit is different from the maximum luminescence wavelength of light emitted from at least one light-emitting unit of the remaining light-emitting units.

15. The light-emitting device of claim 13, wherein light emitted from each of the m light-emitting units has the same maximum luminescence wavelength.

16. An electronic apparatus comprising:

the light-emitting device of claim 1; and a thin-film transistor, wherein the thin-film transistor includes a source electrode and a drain electrode, and the first electrode of the light-emitting device is electrically connected to the source electrode or the drain electrode.

17. The electronic apparatus of claim 16, further comprising a color filter, a color conversion layer, a touch screen layer, a polarizing layer, or a combination thereof.

* * * * *